US010693013B2

(12) United States Patent
Toriumi et al.

(10) Patent No.: US 10,693,013 B2
(45) Date of Patent: Jun. 23, 2020

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventors: Satoshi Toriumi, Kanagawa (JP); Takashi Hamada, Kanagawa (JP); Tetsunori Maruyama, Kanagawa (JP); Yuki Imoto, Kanagawa (JP); Yuji Asano, Kanagawa (JP); Ryunosuke Honda, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/091,009

(22) Filed: Apr. 5, 2016

(65) Prior Publication Data

US 2016/0300952 A1    Oct. 13, 2016

(30) Foreign Application Priority Data

Apr. 13, 2015 (JP) .................................. 2015-081993
Apr. 13, 2015 (JP) .................................. 2015-082008

(51) Int. Cl.
*H01L 29/786* (2006.01)
*H01L 29/24* (2006.01)
(Continued)

(52) U.S. Cl.
CPC ...... *H01L 29/7869* (2013.01); *H01L 21/8221* (2013.01); *H01L 27/0688* (2013.01);
(Continued)

(58) Field of Classification Search
CPC ............ H01L 29/517; H01L 29/41733; H01L 27/1225; H01L 27/105; H01L 29/4908;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    001950949 A    4/2007
CN    102169896 A    8/2011
(Continued)

OTHER PUBLICATIONS

Xu, Haifeng, Thick-Gate Oxide Mos Structures with Sub-Design-Rule Channel Lengths for Digital and Radio Frequency Circuit Applicants, PhD. Dissertation, Univ. of Florida, 2007, pp. 1-137.*
(Continued)

*Primary Examiner* — Vincent Wall
(74) *Attorney, Agent, or Firm* — Fish & Richardson P.C.

(57) ABSTRACT

A minute transistor with low parasitic capacitance, high frequency characteristics, favorable electrical characteristics, stable electrical characteristics, and low off-state current is provided. A semiconductor device includes a semiconductor over a substrate, a source and a drain over the semiconductor, a first insulator over the source and the drain, a second insulator over the semiconductor, a third insulator in contact with a side surface of the first insulator and over the second insulator, and a gate over the third insulator. The semiconductor includes a first region overlapping with the source, a second region overlapping with the drain, and a third region overlapping with the gate. The length between a top surface of the third region of the semiconductor and a
(Continued)

bottom surface of the gate is longer than the length between the first region and the third region.

19 Claims, 56 Drawing Sheets

(51) Int. Cl.
| | |
|---|---|
| *H01L 29/51* | (2006.01) |
| *H01L 29/49* | (2006.01) |
| *H01L 29/417* | (2006.01) |
| *H01L 27/12* | (2006.01) |
| *H01L 27/146* | (2006.01) |
| *H01L 27/1156* | (2017.01) |
| *H01L 27/06* | (2006.01) |
| *H01L 29/423* | (2006.01) |
| *H01L 21/822* | (2006.01) |

(52) U.S. Cl.
 CPC ...... *H01L 27/1156* (2013.01); *H01L 27/1207* (2013.01); *H01L 27/1225* (2013.01); *H01L 27/14645* (2013.01); *H01L 27/14649* (2013.01); *H01L 29/24* (2013.01); *H01L 29/41733* (2013.01); *H01L 29/42384* (2013.01); *H01L 29/4908* (2013.01); *H01L 29/517* (2013.01); *H01L 29/78648* (2013.01); *H01L 29/78696* (2013.01)

(58) Field of Classification Search
 CPC ............... H01L 29/24; H01L 29/78666; H01L 29/78675; H01L 29/667757; H01L 29/78648; H01L 29/7869–78693; H01L 29/42376; H01L 29/4966; H01L 51/055–51/0554; H01L 51/0541; H01L 29/66545; H01L 29/42375; H01L 29/78693
 See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,833,845 B2 | 11/2010 | Yamazaki et al. |
| 8,263,421 B2 | 9/2012 | Yamazaki et al. |
| 8,547,771 B2 | 10/2013 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1* | 9/2005 | Chiang ............... H01L 29/7869 257/368 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187688 A1 | 8/2007 | Whight et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101895 A1* | 4/2009 | Kawamura ......... H01L 27/1225 257/43 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0270627 A1* | 10/2010 | Chang ............... H01L 21/28247 257/411 |
| 2010/0295047 A1* | 11/2010 | Moriguchi ........ H01L 29/66757 257/57 |
| 2012/0043198 A1* | 2/2012 | Yamazaki ............. C23C 14/086 204/192.1 |
| 2012/0050196 A1 | 3/2012 | Kurokawa |
| 2012/0061668 A1* | 3/2012 | Miyairi ............... H01L 27/1225 257/43 |

(56) References Cited

U.S. PATENT DOCUMENTS

| | | | |
|---|---|---|---|
| 2013/0181214 A1* | 7/2013 | Yamazaki | H01L 29/7869 257/43 |
| 2013/0285050 A1* | 10/2013 | Yamazaki | H01L 29/7869 257/43 |
| 2014/0103340 A1 | 4/2014 | Yamazaki et al. | |
| 2014/0319516 A1 | 10/2014 | Tanaka et al. | |
| 2015/0014679 A1 | 1/2015 | Sasagawa et al. | |
| 2015/0214381 A1 | 7/2015 | Sasagawa et al. | |
| 2015/0372009 A1 | 12/2015 | Yamazaki | |
| 2016/0163870 A1 | 6/2016 | Ito et al. | |
| 2016/0172500 A1 | 6/2016 | Yamazaki et al. | |
| 2016/0218219 A1 | 7/2016 | Asami et al. | |
| 2016/0218225 A1 | 7/2016 | Yamazaki | |
| 2016/0233339 A1 | 8/2016 | Okazaki | |
| 2016/0233340 A1 | 8/2016 | Shimomura et al. | |
| 2016/0233343 A1 | 8/2016 | Miyairi | |
| 2016/0240684 A1 | 8/2016 | Yamazaki et al. | |
| 2016/0247832 A1 | 8/2016 | Suzawa et al. | |
| 2016/0247929 A1 | 8/2016 | Noda | |
| 2016/0260822 A1 | 9/2016 | Okamoto et al. | |
| 2016/0260838 A1 | 9/2016 | Yamazaki | |
| 2016/0268436 A1 | 9/2016 | Asami | |
| 2016/0284862 A1 | 9/2016 | Yamazaki et al. | |

FOREIGN PATENT DOCUMENTS

| | | | |
|---|---|---|---|
| EP | 1737044 A | | 12/2006 |
| EP | 1743382 A | | 1/2007 |
| EP | 2226847 A | | 9/2010 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-039571 A | | 2/1993 |
| JP | 05-251705 A | | 9/1993 |
| JP | 08-264794 A | | 10/1996 |
| JP | 11-505377 | | 5/1999 |
| JP | 2000-044236 A | | 2/2000 |
| JP | 2000-150900 A | | 5/2000 |
| JP | 2001-140068 A | | 5/2001 |
| JP | 2002-060939 A | | 2/2002 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 2007073558 A | * | 3/2007 |
| JP | 2007-096126 A | | 4/2007 |
| JP | 2007-535164 | | 11/2007 |
| JP | 2008-016240 A | | 1/2008 |
| JP | 2008-240117 A | | 10/2008 |
| JP | 2012-256009 A | | 12/2012 |
| JP | 2012-257187 A | | 12/2012 |
| JP | 2013-254942 A | | 12/2013 |
| JP | 2014-072408 A | | 4/2014 |
| JP | 2014-099429 A | | 5/2014 |
| JP | 2014-225656 A | | 12/2014 |
| JP | 2015-035590 A | | 2/2015 |
| JP | 2015-201656 A | | 11/2015 |
| KR | 2007-0012425 A | | 1/2007 |
| KR | 2015-0007958 A | | 1/2015 |
| TW | 200539293 | | 12/2005 |
| TW | 200917493 | | 4/2009 |
| TW | 201511284 | | 3/2015 |
| WO | WO-2004/114391 | | 12/2004 |
| WO | WO-2005/106960 | | 11/2005 |

OTHER PUBLICATIONS

JP 2007-073558 A, machine translation of abstract.*

Lee et al., "The effect of oxygen remote plasma treatment on ZnO TFTs fabricated by atomic layer deposition", Phys. Status Solidi A 207, No. 8, 1845-1849 (2010).*

Raimondi et al., "High resistivity Transparent ZnO Thin Films" Journal of Vacuum Science and Technology, vol. 7, pp. 96-99, Date: 1970, ISSN: 0734-2101.*

International Search Report (Application No. PCT/IB2016/051779) dated Jun. 7, 2016.

Written Opinion (Application No. PCT/IB2016/051779) dated Jun. 7, 2016.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility Zno Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposium of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, Or, Al; B: Mg, Mn, Fe, Ni, Cu,Or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White TANDEM OLEDS", SID Digest '09 : SID International Symposium Digest of Technical Papers, May 31, 2009, vol. 40, pp. 399-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS with a Novel Passivation Layer", SID Digest '09 : SID International Symposium Digest Of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Park.J et al., "Electronic Transport Properties of Amorphous Indium-Gallium-Zinc Oxide SEmiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO), TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 410   416a   416b

410

406c

406c

406d

406d 412 404a 404b 404a 412 404b 412 404a 404b 412 404a 404b 420 408

420 408

521

523

522

527

FIG. 48A1
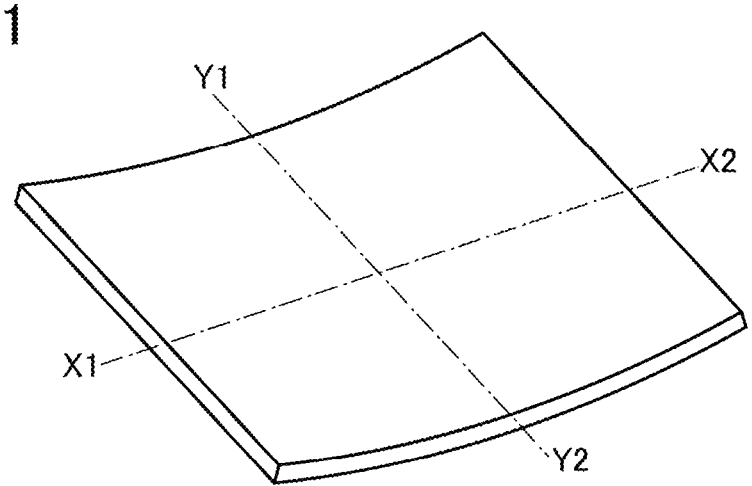
FIG. 48A2
FIG. 48A3
FIG. 48B1
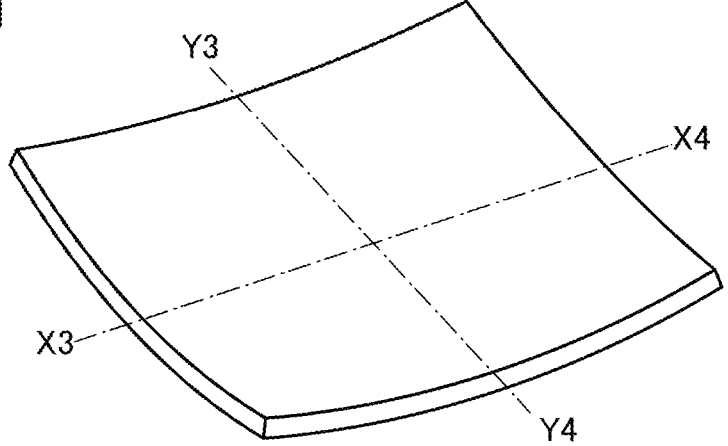
FIG. 48B2
FIG. 48B3
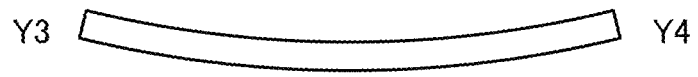

ered from the description of the specification, the drawings, the claims, and the like.
SEMICONDUCTOR DEVICE AND MANUFACTURING METHOD OF THE SAME

TECHNICAL FIELD

The present invention relates to a transistor and a semiconductor device, and a manufacturing method thereof, for example. The present invention relates to a display device, a light-emitting device, a lighting device, a power storage device, a memory device, an imaging device, a processor, or an electronic device, for example. The present invention relates to a method for manufacturing a display device, a liquid crystal display device, a light-emitting device, a memory device, an imaging device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

In recent years, a transistor including an oxide semiconductor has attracted attention. It is known that a transistor including an oxide semiconductor has an extremely low leakage current in an off state. For example, a low-power CPU and the like utilizing the characteristics that a leakage current of the transistor including an oxide semiconductor is low is disclosed (see Patent Document 1).

REFERENCE

Patent Document

[Patent Document 1] Japanese Published Patent Application No. 2012-257187

DISCLOSURE OF INVENTION

An object is to provide a minute transistor. Another object is to provide a transistor with low parasitic capacitance. Another object is to provide a transistor with high frequency characteristics. Another object is to provide a transistor with favorable electrical characteristics. Another object is to provide a transistor with stable electrical characteristics. Another object is to provide a transistor with low off-state current. Another object is to provide a novel transistor. Another object is to provide a semiconductor device including the transistor. Another object is to provide a semiconductor device which can operate at high speed. Another object is to provide a novel semiconductor device. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a semiconductor over a substrate, a first conductor and a second conductor over the semiconductor, a first insulator over the first conductor and the second conductor, a second insulator over the semiconductor, a third insulator over the second insulator, and a third conductor over the third insulator. The third insulator is in contact with a side surface of the first insulator. The semiconductor includes a first region where the semiconductor overlaps with a bottom surface of the first conductor, a second region where the semiconductor overlaps with a bottom surface of the second conductor, and a third region where the semiconductor overlaps with a bottom surface of the third conductor. The length between a top surface of the semiconductor and the bottom surface of the third conductor is longer than the length between the first region and the third region.

One embodiment of the present invention is a semiconductor device including a semiconductor over a substrate, a first conductor and a second conductor over the semiconductor, a first insulator over the first conductor and the second conductor, a second insulator over the semiconductor, a third insulator over the second insulator, a third conductor over the third insulator, and a fourth conductor over the first insulator and the third conductor. The third insulator is in contact with a side surface of the first insulator. The semiconductor includes a first region where the semiconductor overlaps with a bottom surface of the first conductor, a second region where the semiconductor overlaps with a bottom surface of the second conductor, and a third region where the semiconductor overlaps with a bottom surface of the third conductor. The length between a top surface of the semiconductor and the bottom surface of the third conductor is longer than the length between the first region and the third region. The length between the fourth conductor and the first conductor or the second conductor is longer than the length between the first region and the second region.

One embodiment of the present invention is a semiconductor device including a semiconductor over a substrate, a first conductor and a second conductor over the semiconductor, a first insulator over the first conductor and the second conductor, a second insulator over the semiconductor, a third insulator over the second insulator, a fourth insulator over the third insulator, and a third conductor over the fourth insulator. The fourth insulator is in contact with a side surface of the first insulator. The semiconductor includes a first region where the semiconductor overlaps with a bottom surface of the first conductor, a second region where the semiconductor overlaps with a bottom surface of the second conductor, and a third region where the semiconductor overlaps with a bottom surface of the third conductor. The length between a top surface of the semiconductor and the bottom surface of the third conductor is longer than the length between the first region and the third region.

One embodiment of the present invention is a semiconductor device including a semiconductor over a substrate, a first conductor and a second conductor over the substrate, a first insulator over the first conductor and the second conductor, a second insulator over the semiconductor, a third insulator over the second insulator, a fourth insulator over the third insulator, a third conductor over the fourth insulator, and a fourth conductor over the first insulator and the third conductor. The fourth insulator is in contact with a side surface of the first insulator. The semiconductor includes a first region where the semiconductor overlaps with a bottom surface of the first conductor, a second region where the semiconductor overlaps with a bottom surface of the second conductor, and a third region where the semiconductor overlaps with a bottom surface of the third conductor. The length between a top surface of the semiconductor and the bottom surface of the third conductor is longer than the length between the first region and the third region. The length between the fourth conductor and the first conductor or the second conductor is longer than the length between first region and the second region.

In one embodiment of the present invention, the length between the fourth conductor and the first conductor or the second conductor is 1.5 times or more and 2 times or less the length between the first region and the second region.

A miniaturized transistor can be provided. A transistor with low parasitic capacitance can be provided. A transistor with high frequency characteristics can be provided. A transistor with favorable electrical characteristics can be provided. A transistor with stable electrical characteristics can be provided. A transistor with low off-state current can be provided. A novel transistor can be provided. A semiconductor device including the transistor can be provided. A semiconductor device which can operate at high speed can be provided. A novel semiconductor device can be provided. A module including the semiconductor device can be provided. Furthermore, an electronic device including the semiconductor device or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 48A1, 48A2, 48A3, 48B1, 48B2, and 48B3 are perspective views and cross-sectional views of a semiconductor device of one embodiment of the present invention.

BEST MODE FOR CARRYING OUT THE INVENTION

Figure 1A:
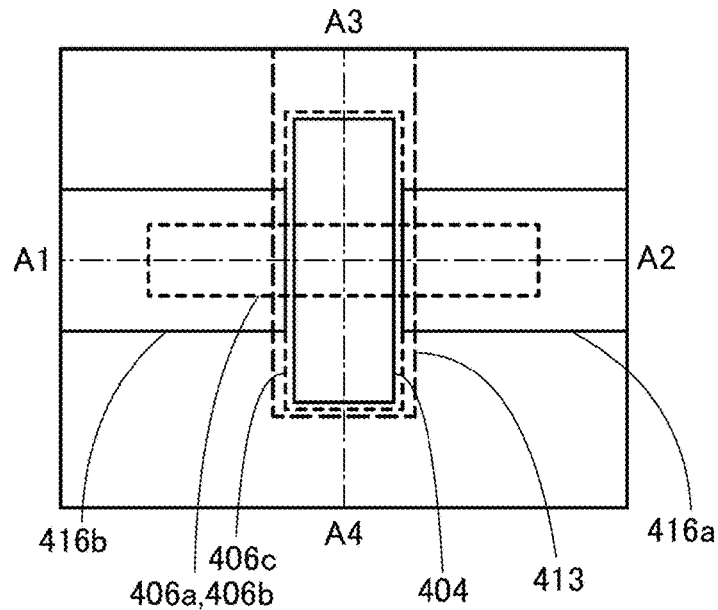
FIGS. 1A to 1C are a top view and cross-sectional views which illustrate a transistor of one embodiment of the present invention.

Hereinafter, embodiments of the present invention will be described in detail with the reference to the drawings. However, the present invention is not limited to the description below, and it is easily understood by those skilled in the art that embodiments and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or the region in drawings is sometimes exaggerated for simplicity.

In this specification, for example, for describing the shape of an object, the length of one side of a minimal cube where the object fits, or an equivalent circle diameter of a cross section of the object can be interpreted as the "diameter", "grain size (diameter)", "dimension", "size", or "width" of the object. The term "equivalent circle diameter of a cross section of the object" refers to the diameter of a perfect circle having the same area as the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is a silicon, examples of an impurity which changes characteristics of the semiconductor include oxygen, Group 1 elements except hydrogen, Group 2 elements, Group 13 elements, and Group 15 elements.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

In this specification, a term "semiconductor" can be referred to as an "oxide semiconductor". As the semiconductor, a Group 14 semiconductor such as silicon or germanium; a compound semiconductor such as silicon carbide, germanium silicide, gallium arsenide, indium phosphide, zinc selenide, or cadmium sulfide; a carbon nanotube; graphene; or an organic semiconductor can be used.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

In addition, contents that are not specified in any text or drawing in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

Embodiment 1

Transistor Structure 1

A structure of a transistor included in a semiconductor device of one embodiment of the present invention is described below.

Figure 1B:
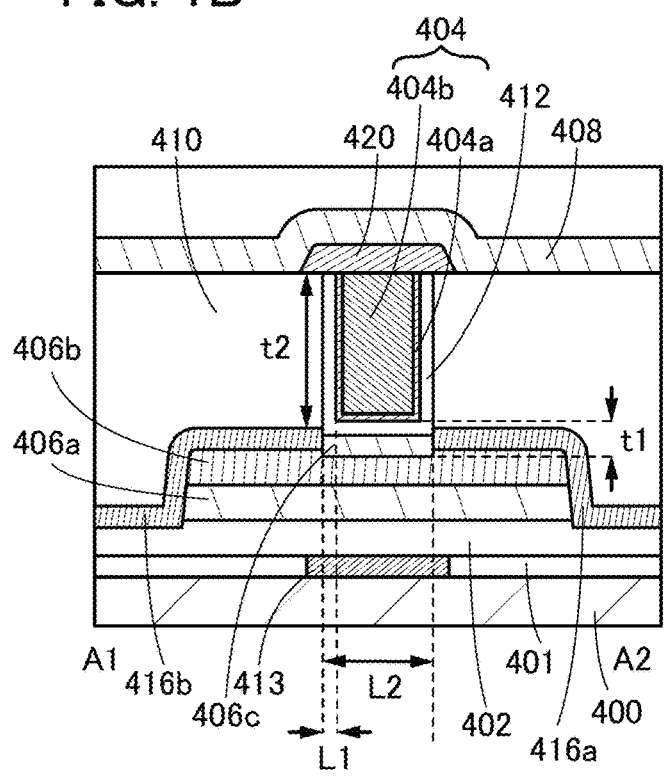
Figure 1C:
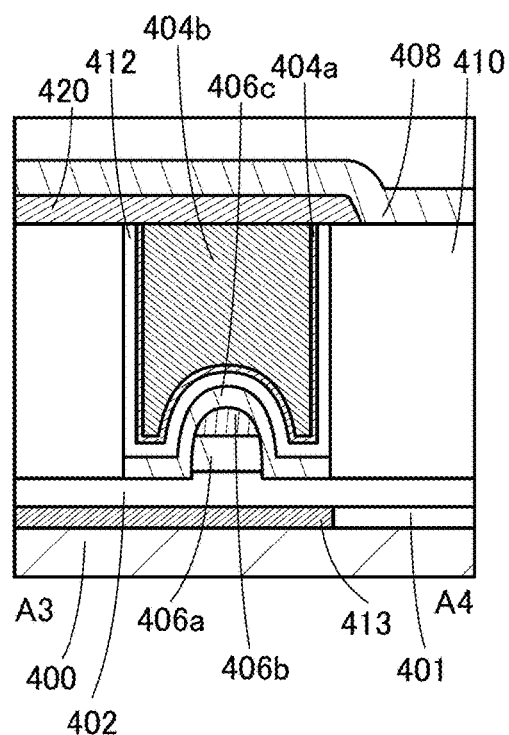

FIGS. 1A to 1C are a top view and cross-sectional views of the semiconductor device of one embodiment of the present invention. FIG. 1A is the top view. FIG. 1B is a cross-sectional view taken along dashed-dotted line A1-A2 in FIG. 1A, which illustrates a cross-sectional shape in the channel length direction. FIG. 1C is a cross-sectional view taken along dashed-dotted line A3-A4 in FIG. 1A, which illustrates a cross-sectional shape in the channel width direction. Note that for simplification of the drawing, some components in the top view in FIG. 1A are not illustrated.

Figure 56A:
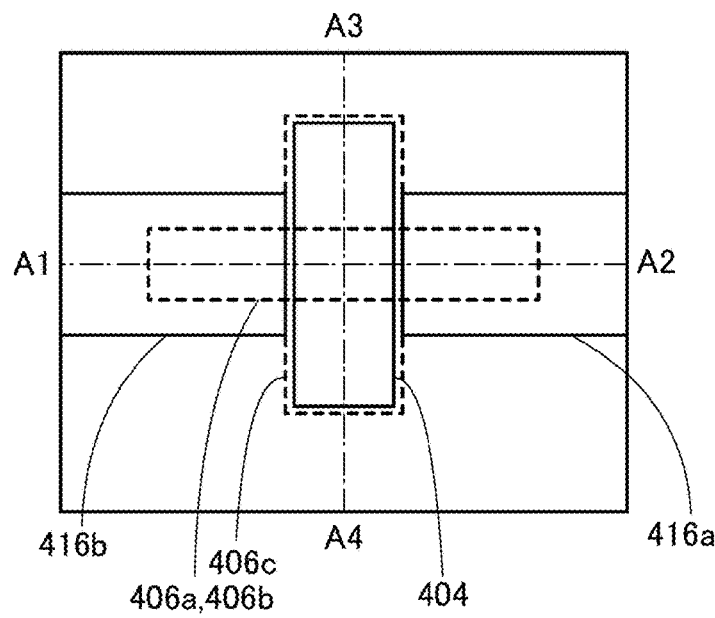
FIGS. 56A to 56C are a top view and cross-sectional views which illustrate a transistor of one embodiment of the present invention.
Figure 56B:
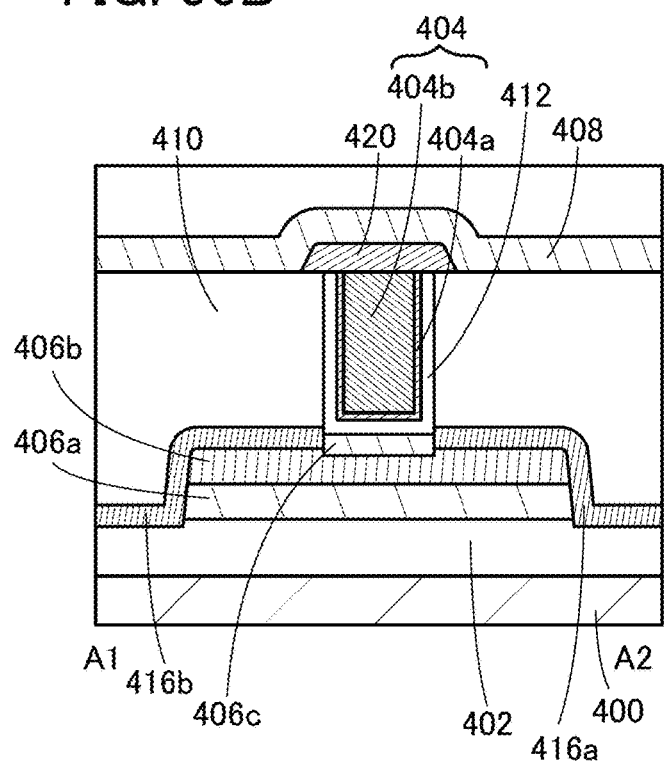
Figure 56C:
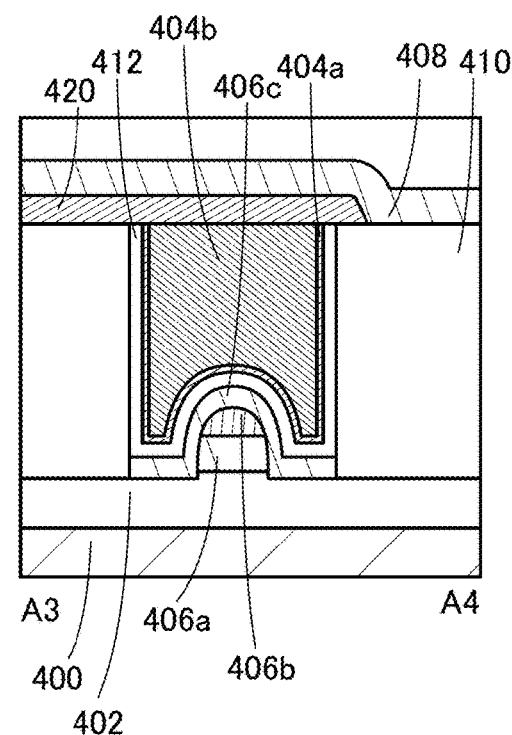

A transistor illustrated in FIGS. 1A to 1C includes a conductor 413 and an insulator 401 over a substrate 400, an insulator 402 over the conductor 413 and the insulator 401, an insulator 406a over the insulator 402, a semiconductor 406b over the insulator 406a, a conductor 416a and a conductor 416b each including a region in contact with a top surface of the semiconductor 406b, an insulator 410 in contact with top surfaces of the insulator 402, the conductor 416a and the conductor 416b and has an opening, an insulator 406c in contact with a side surface of the conductor 416a and top and side surfaces of the semiconductor 406b, an insulator 412 in contact with a top surface of the insulator 406c and a side surface of the opening in the insulator 410, and a conductor 404 including a conductor 404a and a conductor 404b, that is positioned over the semiconductor 406b with the insulator 412 and the insulator 406c positioned therebetween. Note that the conductor 404b faces the side surface of the opening in the insulator 410 with the conductor 404a and the insulator 412 positioned therebetween. A conductor 420 over the conductors 404a and 404b and an insulator 408 over the insulator 412 and the conductor 420 are provided over a transistor. Alternatively, the conductor 413 and the insulator 401 are not necessarily provided, and a structure without the conductor 413 and the insulator 401 as illustrated in FIGS. 56A to 56C may also be used.

The insulator 406c preferably contains at least one element contained in the semiconductor 406b other than oxygen. This can reduce generation of defects at the interface between the semiconductor 406b and the insulator 406c. Furthermore, the crystallinity of the insulator 406c can be improved.

It is preferable that the semiconductor 406b and the insulator 406c each include a CAAC-OS which will be described later. Furthermore, the insulator 406a preferably includes a CAAC-OS.

In the transistor, the conductors 404a and 404b serve as a first gate electrode. At least one of the conductors 404a and 404b is preferably a conductor that is less likely to transmit oxygen. For example, a conductor that is less likely to transmit oxygen is formed as the conductor 404a that is a lower layer, in which case a reduction in conductivity caused by oxidization of the conductor 404b can be prevented. In addition, the insulator 412 serves as a first gate insulator.

The conductor 413 serves as a second gate electrode. The conductor 413 can have a stacked-layer structure including a conductor that is less likely to transmit oxygen. The stacked-layer structure including a conductor that is less likely to transmit oxygen can prevent a reduction in conductivity due to oxidation of the conductor 413. The insulator 402 serves as a second gate insulator. The potential applied to the conductor 413 can control the threshold voltage of the transistor. When the first gate electrode is electrically connected to the second gate electrode, the current in a conducting state (on-state current) can be increased. Note that the function of the first gate electrode and that of the second gate electrode may be interchanged.

The conductor 416a and the conductor 416b serve as a source electrode and a drain electrode. Note that conductivity of the conductor can be measured by a two-terminal method or the like.

Therefore, the resistance of the semiconductor 406b can be controlled by a potential applied to the conductor 404. That is, conduction or non-conduction between the conductors 416a and 416b can be controlled by the potential applied to the conductor 404.

As illustrated in FIG. 1B, the top surface of the semiconductor 406b is in contact with the conductors 416a and 416b. In addition, the semiconductor 406b can be electrically surrounded by an electric field of the conductor 404 serving as the gate electrode. A structure in which a semiconductor is electrically surrounded by an electric field of a gate electrode is referred to as a surrounded channel (s-channel) structure. Thus, in some cases, a channel is formed in the entire semiconductor 406b. In the s-channel structure, a large amount of current can flow between a source and a drain of the transistor, so that an on-state current can be increased. In addition, since the semiconductor 406b is surrounded by the electric field of the conductor 404, an off-state current can be decreased.

The transistor in this embodiment can also be referred to as a trench-gate self-aligned s-channel FET (TGSA s-channel FET) because the region serving as a gate electrode is formed in a self-aligned manner to fill the opening formed in the insulator 410 and the like.

Here, in FIG. 1B, the length between a top surface of a region of the semiconductor 406b overlapping with the conductor 404 and a bottom surface of the conductor 404 is denoted as t1. In FIG. 1B, the length between a region of the semiconductor 406b overlapping with a bottom surface of the conductor 416a and a region of the semiconductor 406b overlapping with the bottom surface of the conductor 404 is denoted as L1. Alternatively, the length between a region of the semiconductor 406b overlapping with a bottom surface of the conductor 416b and the region of the semiconductor 406b overlapping with the bottom surface of the conductor 404 is denoted as L1.

In the transistor, a region having L1 is formed between a region where a channel is formed in the semiconductor 406b (a region where the conductor 404 and the semiconductor 406b overlap with each other) and a source region or a drain region (a region where the conductor 416a or the conductor 416b overlaps with the semiconductor 406b). The region having L1 can reduce the off-state current of the transistor; however, the region with a too large L1 can reduce the on-state current of the transistor.

The region where a channel is formed in the semiconductor 406b is covered with the insulator 406c, whereby the insulator 406c can block entry of elements other than oxygen (such as hydrogen and silicon) included in the adjacent insulator into the region where a channel is formed. Therefore, the insulator 406c may be formed at least over the semiconductor 406b.

L1 can be reduced by providing no insulator 406c on a side surface of the conductor 404 with the insulator 412 positioned therebetween or by forming the insulator 406c thinner in a region covering the side surface of the conductor 404 with the insulator 412 positioned therebetween than in a region overlapping with the bottom surface of the conductor 404 with the insulator 412 positioned therebetween. Accordingly, t1 is greater than L1, and L1/t1 is less than 1.

In FIG. 1B, the length between the conductor 416a or the conductor 416b and the conductor 420 is denoted as t2. In addition, in FIG. 1B, the length between the conductor 416a and the conductor 416b is denoted as L2.

As the transistor is miniaturized, the parasitic capacitance in the vicinity of the transistor is a non-negligible and significant problem. For example, parasitic capacitance is in some cases formed between the conductor 420 and the conductor 416a or the conductor 416b. When there is a large parasitic capacitance in the vicinity of the region where a channel is formed, for example, the transistor operation needs a time for charging the parasitic capacitance, resulting in decreasing not only the responsiveness of the transistor but the responsiveness of the semiconductor device. Furthermore, extra power consumption for charging the parasitic capacitance increases power consumption of a circuit including a plurality of transistors. Therefore, t2 is preferably sufficiently large such that the parasitic capacitance is negligibly small as compared to the gate capacitance.

L2 is reduced as the transistor is miniaturized, which leads to difficulty in applying a sufficiently large voltage to the conductor 404a and the conductor 404b. However, when t2 has a sufficient length, the resistance of the conductor 404a and that of the conductor 404b can be reduced. Therefore, t2 is at least greater than L2, and t2/L2 is preferably greater than or equal to 1.5 and less than or equal to 2.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Note that electrical characteristics of the transistor can be stabilized when the transistor is surrounded by an insulator with a function of blocking oxygen and impurities such as hydrogen. For example, an insulator with a function of blocking oxygen and impurities such as hydrogen may be used as the insulator 408.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

For example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed using plasma containing oxygen, oxygen can be added to the insulator 410 to be a base layer of the insulator 408 or a side surface of the insulator 412. The added oxygen becomes excess oxygen in the insulator 410 or the insulator 412. When the insulator 408 contains aluminum oxide, entry of impurities such as hydrogen into the semiconductor 406b can be inhibited. In addition, when the insulator 408 contains aluminum oxide, outward diffusion of excess oxygen that is added to the insulator 410 and the insulator 412 can be reduced, for example.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with low relative dielectric constant. For example, the insulator 410 preferably contains silicon oxide, silicon oxynitride, silicon nitride oxide, silicon nitride, silicon oxide to which fluorine is added, silicon oxide to which carbon is added, silicon oxide to which carbon and nitrogen are added, silicon oxide having pores, a resin, or the like. Alternatively, the insulator 410 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. When silicon oxide or silicon oxynitride, which is thermally stable, is combined with a resin, the stacked-layer structure can have thermal stability and low relative dielectric constant.

Examples of the resin include polyester, polyolefin, polyamide (e.g., nylon or aramid), polyimide, polycarbonate, and acrylic.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, for the insulator 412, a material containing silicon oxide or silicon oxynitride is preferably used.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. The insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when an aluminum oxide, a gallium oxide, or a hafnium oxide of the insulator 412 is on the insulator 406c side, entry of silicon included in the silicon oxide or the silicon oxynitride into the semiconductor 406b can be suppressed. When silicon oxide or silicon oxynitride is on the insulator 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

Each of the conductors 416a and 416a may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

Each of the conductors 404, 413, and 420 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more elements other than oxygen contained in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The semiconductor 406b is an oxide semiconductor, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The insulator 406a and the insulator 406c are oxides including one or more elements, or two or more elements other than oxygen included in the semiconductor 406b. Since the insulator 406a and the insulator 406c each include one or more elements, or two or more elements other than oxygen included in the semiconductor 406b, a defect state is less likely to be formed at the interface between the insulator 406a and the semiconductor 406b and the interface between the semiconductor 406b and the insulator 406c.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band.

When gate voltage is applied to such a transistor in which the insulator 406a is placed under the semiconductor 406b and the insulator 406c is placed over the semiconductor 406b, a channel is formed in the semiconductor 406b whose electron affinity is the highest among the insulator 406a, the semiconductor 406b, and the insulator 406c. In this manner, a buried channel structure is formed.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of defect states. For that reason, in a stack including the insulator 406a, the semiconductor 406b, and the insulator 406c, energy changes continuously at their interfaces and in the vicinity of the interface (continuous junction). Note that boundaries of the insulator 406a, the semiconductor 406b, and the insulator 406c are not clear in some cases.

At this time, electrons move mainly in the semiconductor 406b, not in the insulator 406a and the insulator 406c.

As factors of inhibiting electron movement are decreased, the on-state current of the transistor can be increased. Electron movement is inhibited, for example, in the case where physical unevenness in a channel formation region is large.

To increase the on-state current of the transistor, for example, root mean square (RMS) roughness with a measurement area of 1 μm×1 μm of the top surface or the bottom surface of the semiconductor 406b (a formation surface; here, the top surface of the insulator 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

The above three-layer structure is an example. For example, a stacked-layer structure in which any one of the insulators described as examples of the insulator 406a and the insulator 406c is provided below or over the insulator 406a or below or over the insulator 406c may be employed.

Note that an oxide semiconductor which can be used for the semiconductor will be described in detail in another embodiment.

<Method 1 for Manufacturing Transistor>

A method for manufacturing the transistor of the present invention in FIGS. 1A to 1C will be described below with reference to FIGS. 7A to 7H, FIGS. 8A to 8F, and FIGS. 9A to 9D.

First, the substrate 400 is prepared.

Figure 7A:
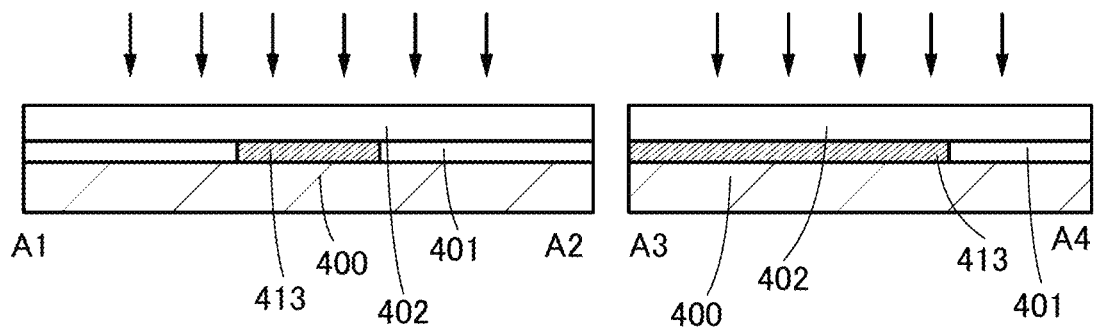
FIGS. 7A to 7H are cross-sectional views each illustrating part of a transistor of one embodiment of the present invention.
Figure 7B:
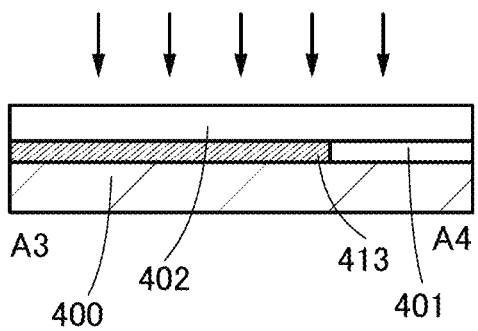

Next, as illustrated in FIGS. 7A and 7B, an insulator to be the insulator 401 is formed over the substrate 400. An opening is formed in the insulator 401, and a conductor to be the conductor 413 is formed over the insulator 401. The conductor to be the conductor 413 can be formed by a sputtering method, a CVD method, an MBE method, a PLD method, an ALD method, or the like. The conductor 413 may have a multilayer structure including a conductor that is less likely to transmit oxygen (also referred to as a conductor with high stability against oxidation). The conductor 413 may be embedded to the opening in the insulator 401 by chemical mechanical polishing (CMP) or the like. Alternatively, the conductor 413 may be formed in such a manner that a conductor is formed and processed by a photolithography method or the like.

In the photolithography method, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that dry etching treatment such as ashing or wet etching treatment can be used for removal of the resist mask. Alternatively, wet etching treatment is performed after dry etching treatment. Further alternatively, dry etching treatment is performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, as indicated by arrows in FIGS. 7A and 7B, high-density-plasma treatment may be performed. High-density-plasma treatment is preferably performed in an oxygen atmosphere or a nitrogen atmosphere. The oxygen atmosphere is a gas atmosphere containing oxygen atoms, which includes atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In the oxygen atmosphere, an inert gas such as nitrogen or a rare gas (e.g., helium or argon) may be included. When high-density plasma treatment is performed in an oxygen atmosphere in such a manner, carbon, hydrogen, or the like can be released. In addition, in the case where high-density-plasma treatment is performed in an oxygen atmosphere, organic compound such as hydrocarbon can be easily released from an object.

The high-density plasma treatment in a nitrogen atmosphere may be high-density plasma treatment in an atmosphere containing nitrogen and a rare gas, an atmosphere containing nitrogen, hydrogen, and a rare gas, or an atmosphere containing ammonia and a rare gas, for example. With this high-density plasma treatment in a nitrogen atmosphere, a surface of the treated object and its vicinity can be nitrided. The nitrided region can be formed to be extremely thin on the surface side of the treated object. This nitrided region can prevent diffusion of impurities.

After the high-density plasma treatment in an oxygen atmosphere is performed, the high-density plasma treatment in a nitrogen atmosphere may be performed. Alternatively, after the high-density plasma treatment in a nitrogen atmosphere is performed, the high-density plasma treatment in an oxygen atmosphere may be performed. Annealing treatment may be performed before or after each high-density plasma treatment. Note that it is in some cases preferable to let an enough amount of gas flow in order to increase the plasma density. When the gas amount is not enough, the deactivation rate of radicals becomes higher than the generation rate of radicals in some cases. For example, it is preferable in some cases to let a gas flow at 100 sccm or more, 300 sccm or more, or 800 sccm or more.

The high-density plasma treatment is performed using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically 400° C.). Furthermore, a mixed gas of oxygen and argon can be used.

For example, the high density plasma is generated using a 2.45 GHz microwave and preferably has an electron density of higher than or equal to $1\times10^{11}/cm^3$ and lower than or equal to $1\times10^{13}/cm^3$, an electron temperature of 2 eV or lower, or an ion energy of 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Therefore, it is preferable to perform the high-density plasma treatment while a bias is applied to the substrate.

Following the high-density plasma treatment, annealing treatment may be successively performed without an exposure to the air. Following annealing treatment, the high-density plasma treatment may be successively performed without an exposure to the air. By performing high-density plasma treatment and annealing treatment in succession, entry of impurities during the treatment can be suppressed. Moreover, by performing annealing treatment after the high-density plasma treatment in an oxygen atmosphere, unnecessary oxygen that is added into the treated object but is not used to fill oxygen vacancies can be eliminated. The annealing treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the annealing treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

Next, the insulator 402 is formed. The insulator 402 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such damage due to exposure to plasma is not caused and the yield of the semiconductor device can be increased. In a thermal CVD method, an object is not exposed to plasma during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

In addition, treatment to add oxygen to the insulator 402 may be performed. For the treatment to add oxygen, an ion implantation method, a plasma treatment method, or the like can be used. Note that oxygen added to the insulator 402 is excess oxygen.

Figure 7C:
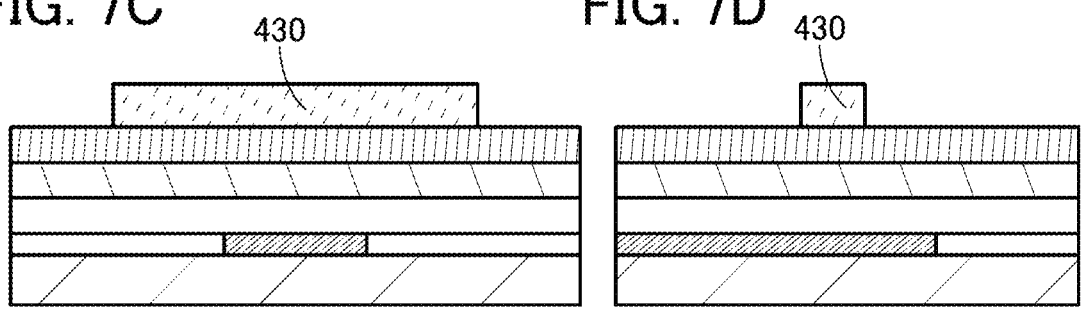
Figure 7D:
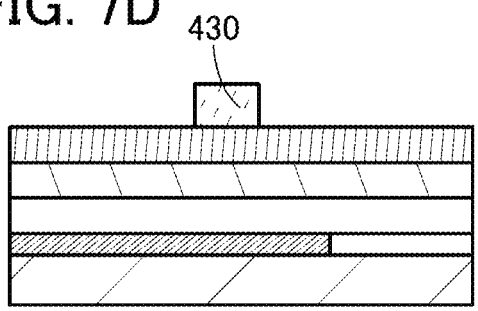

Next, as illustrated in FIGS. 7C and 7D, an insulator to be the insulator 406a, a semiconductor to be the semiconductor 406b, and a resist mask 430 are formed.

First, an insulator to be the insulator 406a is formed over the insulator 402. The insulator to be the insulator 406a can be formed by a sputtering method, a CVD method, an MBE method, a PLD method, an ALD method, or the like. It is particularly preferable to use a facing-target sputtering apparatus. Note that in this specification and the like, deposition using a facing-target sputtering apparatus can also be referred to as vapor deposition sputtering (VDSP).

The use of the facing-target sputtering apparatus can reduce plasma damage induced during deposition of the insulator. Thus, oxygen vacancies in the insulator can be reduced. In addition, the use of the facing-target sputtering apparatus allows deposition in high vacuum. In that case, impurity concentration (e.g., concentration of hydrogen, a rare gas (such as argon), or water) in the deposited insulator can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), ammonia ($NH_3$), or the like may be used, for example.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

In addition, treatment to add oxygen to the insulator to be the insulator 406a may be performed. For the treatment to add oxygen, an ion implantation method, a plasma treatment method, or the like can be used. Note that oxygen added to the insulator to be the insulator 406a is excess oxygen.

Next, the semiconductor to be the semiconductor 406b is formed over the insulator to be the insulator 406a. The semiconductor can be formed by a sputtering method, a CVD method, an MBE method, a PLD method, an ALD method, or the like. It is particularly preferable to use a facing-target sputtering apparatus.

The use of the facing-target sputtering apparatus can reduce plasma damage induced during deposition of the semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), or ammonia ($NH_3$) may be used, for example.

Next, first heat treatment is preferably performed. The first heat treatment can be performed at a temperature higher than or equal to 250° C. and lower than or equal to 650° C., preferably higher than or equal to 450° C. and lower than or equal to 600° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying a radio frequency (RF) voltage to a substrate side may be provided. The use of high-density plasma enables high-density oxygen radicals to be produced, and application of the RF voltage to the substrate side allows oxygen radicals generated by the high-density plasma to be efficiently introduced into the semiconductor 406b. Alternatively, after plasma treatment using an inert gas with the apparatus, plasma treatment using oxygen in order to compensate released oxygen may be performed.

Figure 7E:
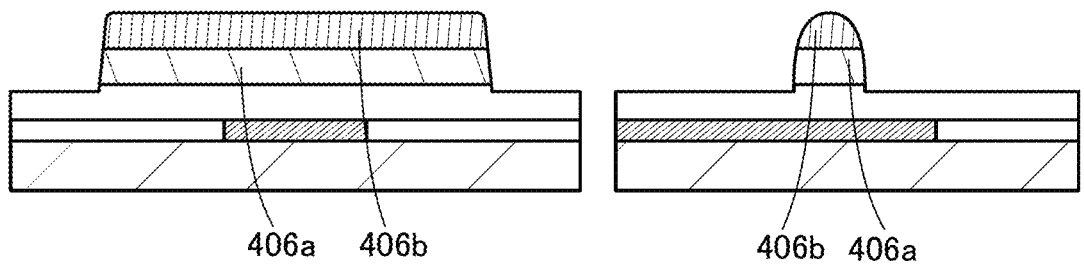
Figure 7F:
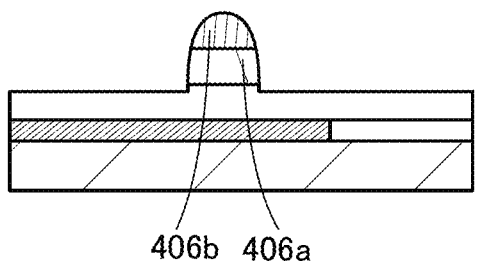

Next, the insulator to be the insulator 406a and the semiconductor to be the semiconductor 406b are processed by a photolithography method or the like using a resist mask 430 to form a multilayer film including the insulator 406a and the semiconductor 406b as illustrated in FIGS. 7E and 7F. Note that when the multilayer film is formed, the insulator 402 is also subjected etching to have a thinned region in some cases. That is, the insulator 402 may have a protruding portion in a region in contact with the multilayer film.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 7G:
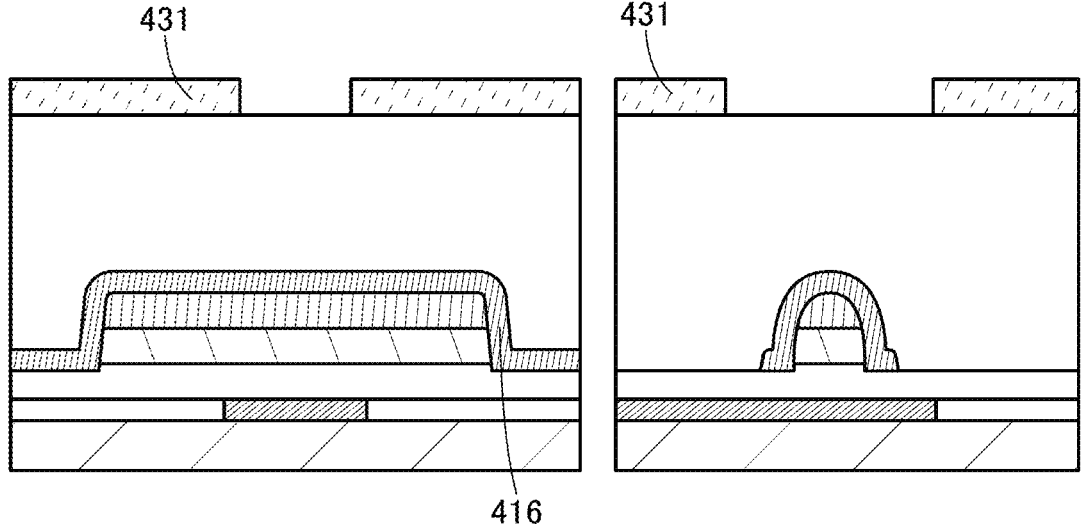
Figure 7H:
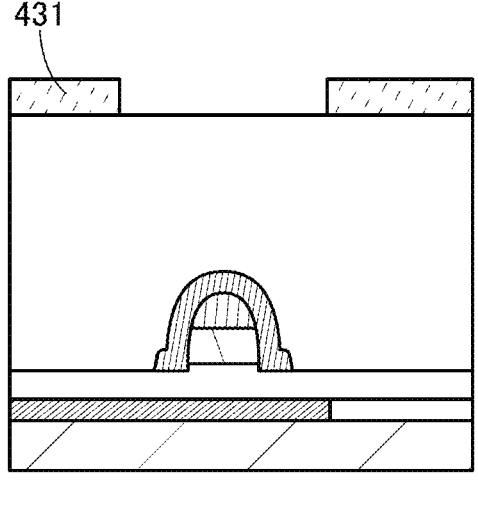

Next, as illustrated in FIGS. 7G and 7H, a conductor 416 and an insulator to be the insulator 410 are formed.

First, the conductor 416 is formed. The conductor 416 can be formed by a sputtering method, a CVD method, an MBE method, a PLD method, an ALD method, or the like.

Note that the conductor 416 covers the multilayer film. The side surface of the insulator 406a and the top and side surfaces of the semiconductor 406b are partly damaged in forming the conductor over the multilayer film, and then a region where resistance is reduced might be formed. Since each of the insulator 406a and the semiconductor 406b includes a region whose resistance is lowered, the contact resistance between the conductor 416 and the semiconductor 406b can be lowered.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, the conductor 416 is processed by a photolithography method or the like, so that the conductors 416a and 416b are formed.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, the insulator to be the insulator 410 is formed. The insulator to be the insulator 410 can be formed by a sputtering method, a CVD method, an MBE method, a PLD method, an ALD method, or the like. Alternatively, the insulator to be the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator to be the insulator 410 may be formed to have a flat top surface. For example, the top surface of the insulator to be the insulator 410 may have planarity immediately after the film formation. Alternatively, after the film formation, an upper portion of the insulator to be the insulator 410 may be removed so that the top surface of the insulator to be the insulator 410 becomes parallel to a reference surface such as a rear surface of the substrate. Such treatment is referred to as planarization treatment. As the planarization treatment, for example, chemical mechanical polishing treatment, dry etching treatment, or the like can be performed. However, the top surface of the insulator to be the insulator 410 is not necessarily flat.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, a resist mask 431 is formed over the insulator to be the insulator 410 by a photolithography method or the like. Here, an organic coating film may be formed between the top surface of the insulator to be the insulator 410 and the resist mask 431 in order to improve the adhesion between the top surface of the insulator to be the insulator 410 and the resist mask 431.

Figure 8A:
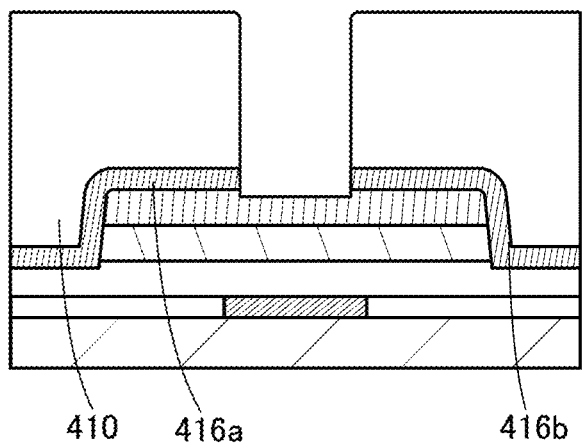
FIGS. 8A to 8F are cross-sectional views each illustrating part of a transistor of one embodiment of the present invention.
Figure 8B:
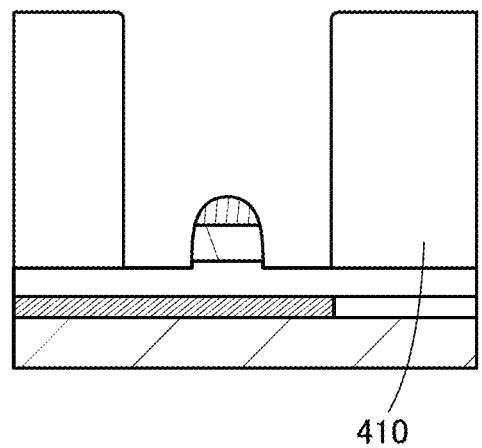

Next, as illustrated in FIGS. 8A and 8B, an opening is formed in the insulator 410 and the conductor 416. First, after the resist mask 431 is formed, the insulator to be the insulator 410 is subjected to a first processing by a dry etching method or the like to expose the top surface of the conductor 416. In a dry etching method, any of the above dry etching apparatuses can be used; however, a dry etching apparatus in which high-frequency power sources with different frequencies are connected to the parallel-plate electrodes is preferably used.

Next, the conductor 416 is subjected to a second processing by a dry etching method or the like so as to be separated into the conductor 416a and the conductor 416b. Note that the insulator 410 and the conductor 416 may be processed in the same photolithography process. Processing in the same photolithography process can reduce the number of manufacturing steps. Thus, a semiconductor device including the transistor can be manufactured with high productivity.

At this time, the semiconductor 406b has a region that is exposed. The exposed region of the semiconductor 406b is partly removed by the second processing in some cases. Furthermore, impurity elements such as residual components of the etching gas are attached to the exposed surface of the semiconductor 406b in some cases. For example, chlorine and the like may be attached when a chlorine-based gas is used as the etching gas. When a hydrocarbon-based gas is used as the etching gas, carbon, hydrogen, and the like may be attached. The impurity elements attached to the exposed surface of the semiconductor 406b are preferably reduced. The impurity elements can be reduced by cleaning treatment using dilute hydrofluoric acid, cleaning treatment using ozone, cleaning treatment using ultra violet rays, or the like. Note that some kinds of cleaning treatment may be used in combination. Accordingly, the exposed surface of the semiconductor 406b, that is, the region where channel is formed has a high resistance.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 8C:
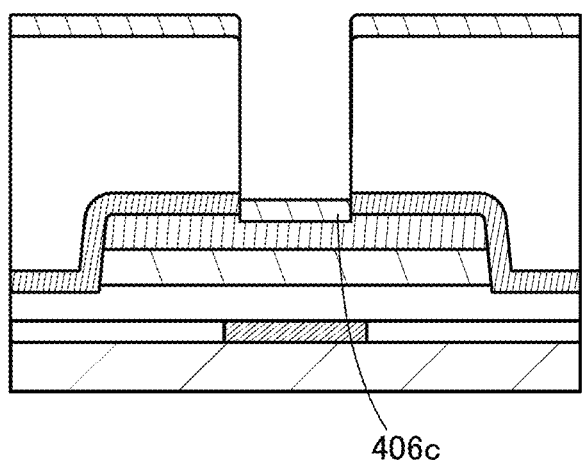
Figure 8D:
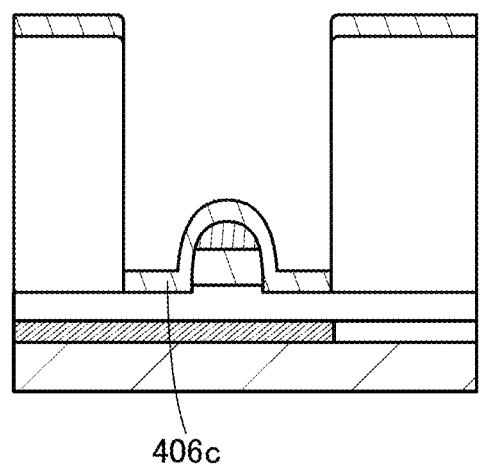

Next, as illustrated in FIGS. 8C and 8D, the insulator 406c is formed over top and side surfaces of the semiconductor 406b, a side surface of the insulator 406a, a top surface of the insulator 402, and a top surface of the insulator 410, which are surfaces except for at least a side surface of the insulator 410. The insulator 406c can be formed by a sputtering method.

Here, a sputtering apparatus which is used for formation of the insulator 406c is described with reference to FIG. 21 and FIG. 22.

Figure 21:
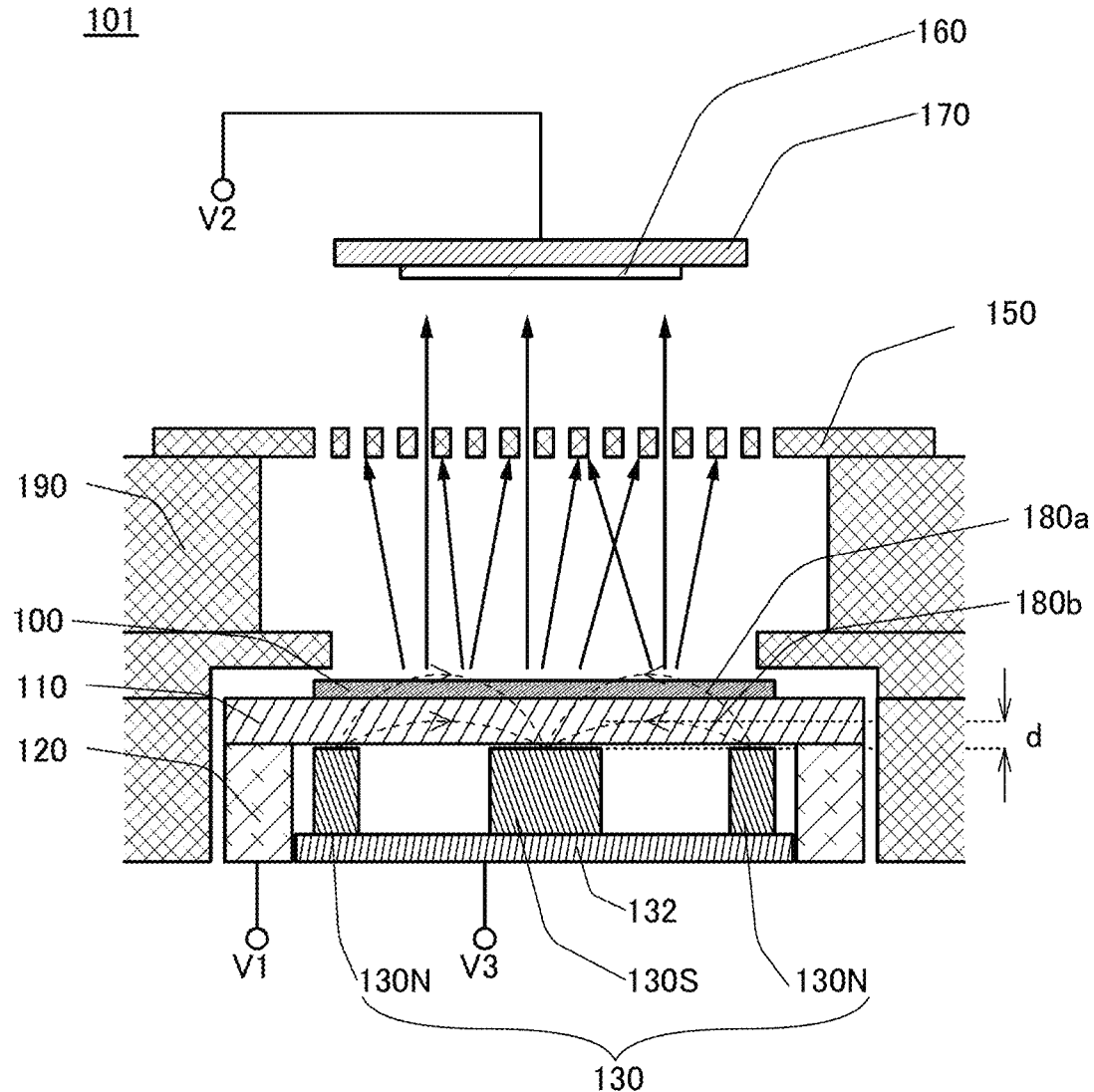
FIG. 21 is a cross-sectional view illustrating part of a sputtering apparatus.
Figure 22:
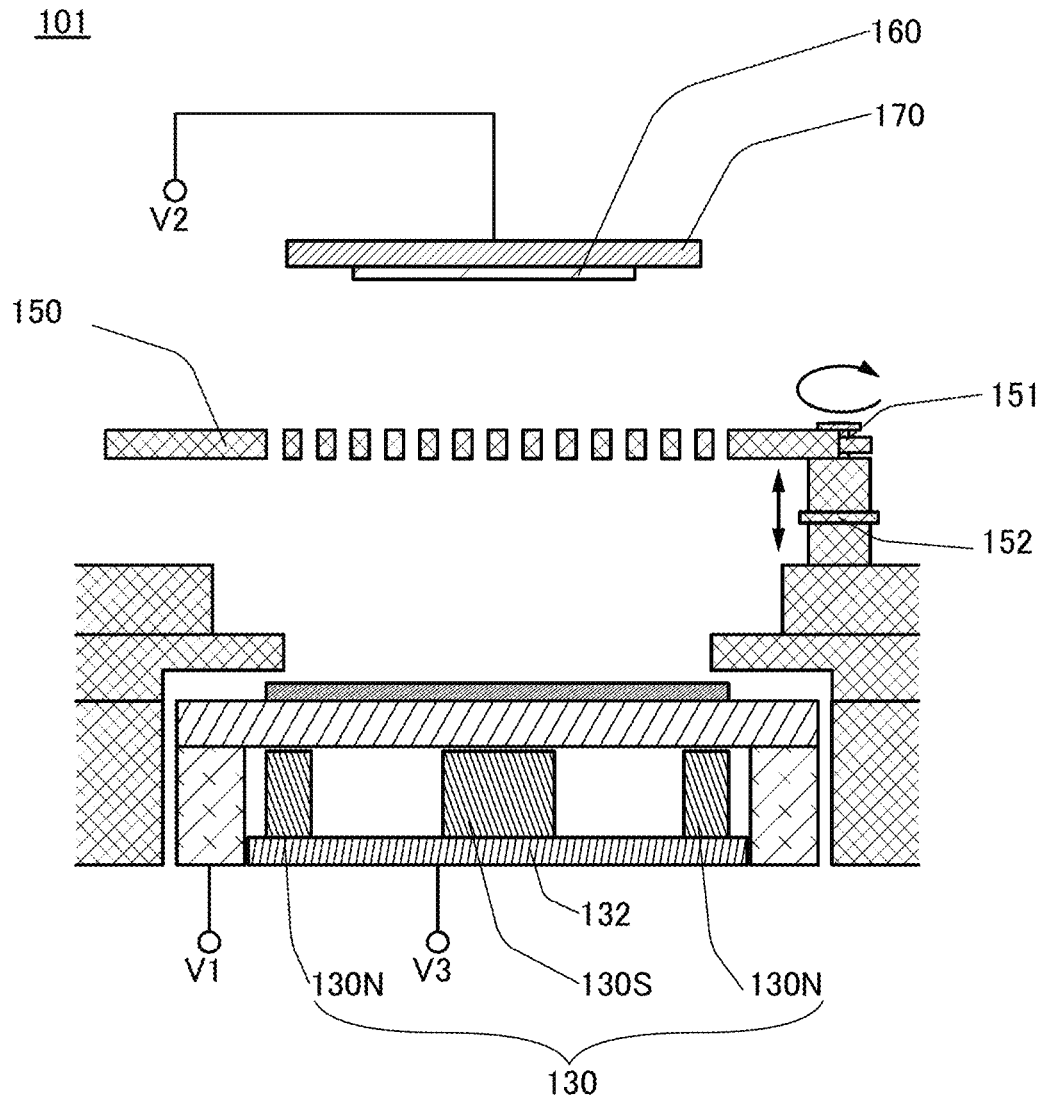
FIG. 22 is a cross-sectional view illustrating part of a sputtering apparatus.

FIG. 21 is a cross-sectional view illustrating part of a sputtering apparatus 101. The sputtering apparatus 101 illustrated in FIG. 21 includes a member 190, a collimator 150 placed over the member 190, a target holder 120, a backing plate 110 placed over the target holder 120, a target 100 placed over the backing plate 110, a magnet unit 130 including a magnet 130N and a magnet 130S placed under the target 100 with the backing plate 110 positioned therebetween, and a magnet holder 132 that supports the magnet unit 130. Note that in this specification, a magnet unit means a group of magnets. The magnet unit can be replaced with "cathode", "cathode magnet", "magnetic member", "magnetic part", or the like.

A substrate stage 170 placed to face the target 100 and a substrate 160 held by the substrate stage 170 are illustrated. FIG. 21 also illustrates a magnetic force line 180a and a magnetic force line 180b formed by the magnet unit 130.

The target holder 120 and the backing plate 110 are fixed to each other with a bolt and have the same potential. The target holder 120 has a function of supporting the target 100 with the backing plate 110 positioned therebetween.

The backing plate 110 has a function of fixing the target 100.

The sputtering apparatus 101 may have a water channel inside or under the backing plate 110. By making fluid (air, nitrogen, a rare gas, water, oil, or the like) flow through the water channel, discharge anomaly due to an increase in the temperature of the target 100 or damage to the sputtering apparatus 101 due to deformation of a component such as the target 100 can be prevented in the sputtering. In that case, the backing plate 110 and the target 100 are preferably adhered to each other with a bonding member because the cooling capability is increased.

A gasket is preferably provided between the target holder 120 and the backing plate 110, in which case an impurity is less likely to enter the sputtering apparatus 101 from the outside or a water channel.

In the magnet unit 130, the magnet 130N and the magnet 130S are placed such that their surfaces on the target 100 side have opposite polarities. Here, the case where the pole of the magnet 130N on the target 100 side is the north pole and the pole of the magnet 130S on the target 100 side is the south pole is described. Note that the layout of the magnets and the polarities in the magnet unit 130 is not limited to those illustrated in FIG. 21.

The magnetic force line 180a is one of magnetic force lines that form a horizontal magnetic field in the vicinity of a top surface of the target 100. The vicinity of the top surface of the target 100 corresponds to a region in which the perpendicular distance from the top surface of the target 100 is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130 by a perpendicular distance d. The perpendicular distance d is, for example, greater than or equal to 0 mm and less than or equal to 20 mm or greater than or equal to 5 mm and less than or equal to 15 mm.

In the deposition, a potential V1 applied to the target holder 120 is, for example, lower than a potential V2 applied to the substrate stage 170. The potential V2 applied to the substrate stage 170 is, for example, the ground potential. A potential V3 applied to the magnet holder 132 is, for example, the ground potential. Note that the potentials V1, V2, and V3 are not limited to the above description. Not all the target holder 120, the substrate stage 170, and the magnet holder 132 are necessarily supplied with potentials. For example, the substrate stage 170 may be electrically floating.

FIG. 21 illustrates an example where the backing plate 110 and the target holder 120 are not electrically connected to the magnet unit 130 and the magnet holder 132, but electrical connection is not limited thereto. For example, the backing plate 110 and the target holder 120 may be electrically connected to the magnet unit 130 and the magnet holder 132, and the backing plate 110, the target holder 120, the magnet unit 130, and the magnet holder 132 may have the same potential.

When the potential V1 is applied to the target holder 120 under the conditions that the deposition gas (e.g., oxygen, nitrogen, or a rare gas such as argon) flows in the sputtering apparatus 101 and the pressure in the sputtering apparatus 101 is constant (e.g., greater than or equal to 0.05 Pa and less than or equal to 10 Pa, preferably greater than or equal to 0.1 Pa and less than or equal to 0.8 Pa), a plasma is formed in a magnetic field formed by the magnet unit 130. The potential of the plasma is a potential Vp that is higher than the potential V1. At this time, a cation in the plasma is accelerated toward the target 100 by a potential difference between the potential Vp and the potential V1. Then, the cation collides with the target 100 to release sputtered particles. The released sputtered particles that reach the substrate 160 are deposited to form a film.

In a sputtering apparatus in general, a sputtered particle is less likely to reach a bottom portion of a small opening with a high aspect ratio. In addition, a sputtered particle, which flies in the oblique direction to the substrate, is deposited in the vicinity of upper part of an opening, which narrows the width of the upper part of the opening. In that case, the sputtered particle is not formed in the opening.

In contrast, with use of the sputtering apparatus with the above structure, released sputtered particles that fly in the oblique direction to the formation surface of the substrate 160 are attached to the collimator 150. That is, sputtered particles having a perpendicular component to the substrate 160, which have passed through the collimator 150 provided between the target 100 and the substrate 160, reach the substrate. Thus, sputtered particles are deposited on a plane parallel to the substrate. On the other hand, sputtered particles are not deposited on a plane perpendicular to the substrate, or the amount of deposition thereof on the plane perpendicular to the substrate is smaller than that on the plane parallel to the substrate. Therefore, with use of the sputtering apparatus with the above structure, the insulator 406c can be formed on planes without planes perpendicular to the substrate as illustrated in FIGS. 8C and 8D.

The perpendicular distance between the target 100 and the collimator 150 and that between the substrate 160 and the collimator 150 may be appropriately changed in accordance with quality of a film which is formed. Thus, the collimator 150 may include a movable portion 151 and a movable portion 152 as illustrated in FIG. 22. By including the movable portion 151, whether the collimator 150 is used or not can be easily selected. By including the movable portion 152, the perpendicular distance between the collimator 150 and the substrate 160 and that between the collimator 150 and the target 100 can be easily adjusted.

Alternatively, a long throw sputtering method can also be used. In the long throw sputtering method, the perpendicular distance between the target 100 and the substrate 160 is set large, whereby the incident direction of the sputtered particle can be approximately perpendicular to the substrate 160. Accordingly, the insulator 406c can be formed on planes without planes perpendicular to the substrate even when the collimator 150 is not used. Note that the perpendicular distance between the substrate 160 and the target 100 is greater than or equal to 150 mm and less than or equal to 500 mm. Note that a combination of the long throw sputtering method and the collimator 150 may be employed.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 8E:
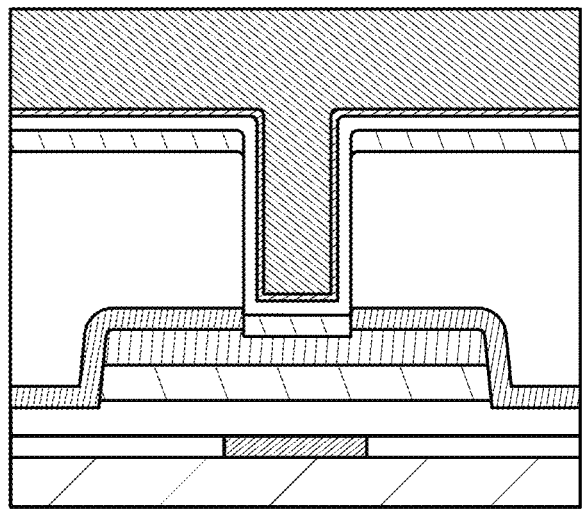
Figure 8F:
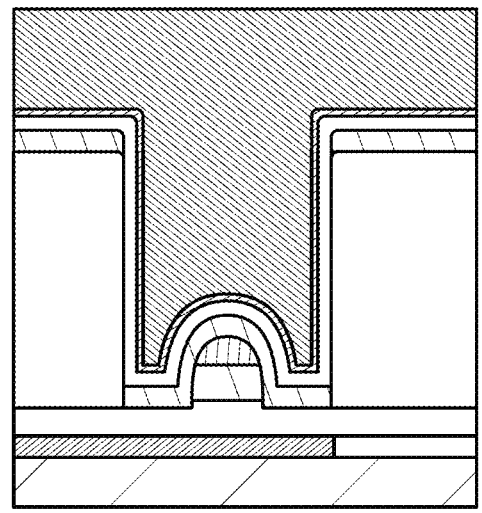

Next, as illustrated in FIGS. 8E and 8F, an insulator to be the insulator 412, a conductor to be the conductor 404a, and a conductor to be the conductor 404b are formed.

First, an insulator to be the insulator 412 is formed over the insulator 410 and the insulator 406c. The insulator to be the insulator 412 can be formed by a sputtering method, a CVD method, an MBE method, a PLD method, an ALD method, or the like.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, a conductor to be the conductor 404a and a conductor to be the conductor 404b are formed. The conductor to be the conductor 404a and the conductor to be the conductor 404b can be formed by a sputtering method, a CVD method, an MBE method, a PLD method, an ALD method, or the like. The conductor to be the conductor 404a and the conductor the conductor to be the conductor 404b are formed so as to fill the opening formed in the insulator 410 and the like. Therefore, the CVD method (the MCVD method, in particular) is preferred. A stacked-layer film of a conductor formed by an ALD method or the like and a conductor formed by a CVD method is preferred in some cases to increase adhesion of the conductor formed by an MCVD method. For example, a stacked-layer film where titanium nitride and tungsten are formed in this order may be used.

Figure 9A:
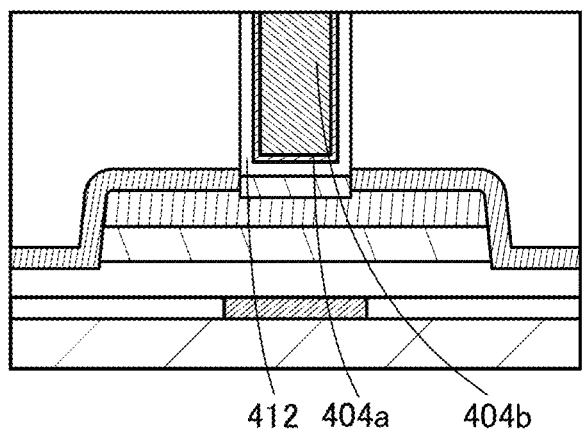
FIGS. 9A to 9D are cross-sectional views each illustrating part of a transistor of one embodiment of the present invention.
Figure 9B:
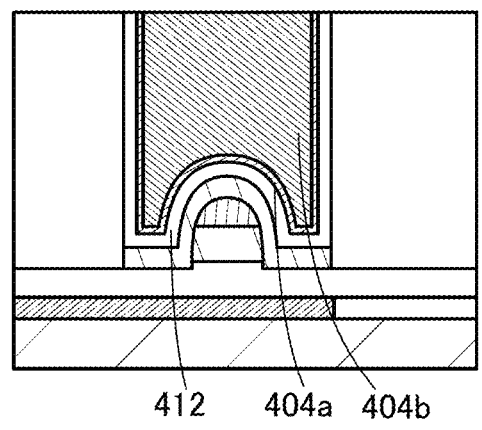

Next, as illustrated in FIGS. 9A and 9B, the conductor 404*a*, the conductor 404*b*, the insulator 412, and the insulator 406*c* are removed to expose the insulator 410 by CMP treatment or the like. Here, the insulator 410 can be used as a stopper layer and the thickness of the insulator 410 is reduced in some cases. Therefore, the insulator 410 is set to have a sufficient thickness so that the conductor 404*a* and the conductor 404*b* have sufficiently low resistance in a completed transistor, whereby a plurality of transistors with small variation in characteristics can be manufactured.

Note that the CMP treatment may be performed only once or plural times. When the CMP treatment is performed plural times, it is preferable that first polishing be performed at a high polishing rate and final polishing be performed at a low polishing rate. By performing polishing steps with different polishing rates in combination, the planarity of the polished surface can be further increased.

Next, a conductor to be the conductor 420 is formed. Note that the conductor 420 may have a stacked-layer structure. The conductor to be the conductor 420 can be formed by a sputtering method, a CVD method, an MBE method, a PLD method, an ALD method, or the like. Next, the conductor to be the conductor 420 is processed by a photolithography method or the like, so that the conductor 420 is formed.

Figure 9C:
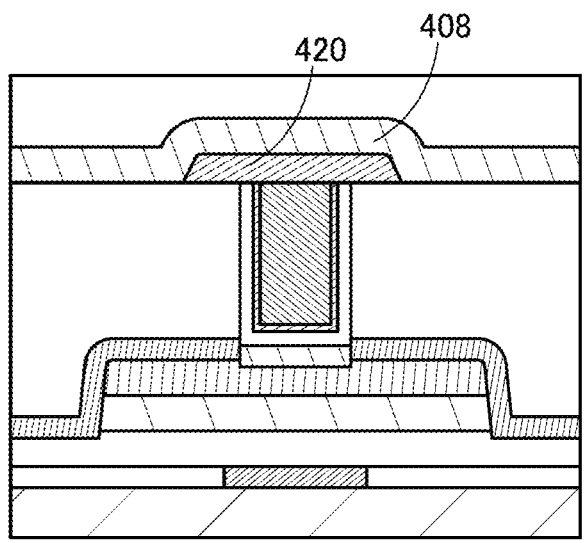
Figure 9D:
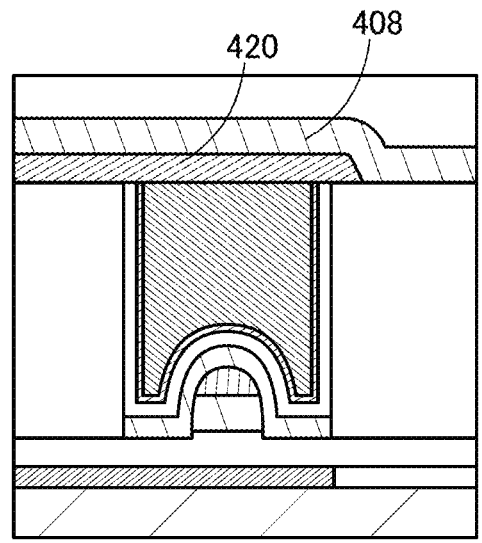

Next, as illustrated in FIGS. 9C and 9D, the insulator 408 is formed over the insulator 410 and the conductor 420. The insulator 408 can be formed by a sputtering method, a CVD method, an MBE method, a PLD method, an ALD method, or the like. Aluminum oxide is preferably formed as the insulator 408 using plasma containing oxygen, so that oxygen in the plasma can be added to the top surface of the insulator 410 as excess oxygen (exO). Excess oxygen can be added to the insulator 408 by supplying oxygen through the insulator 410. Here, the mixed region containing a large amount of excess oxygen might be formed in the interface between the insulator 408 and the insulator 410 and the vicinity of the interface.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Furthermore, second heat treatment may be performed at any time after the formation of the insulator 408. By the second heat treatment, the excess oxygen contained in the insulator 410 and the mixed region 414 is moved to the semiconductor 406*b* through the insulator 412, the insulator 402, the insulator 406*c*, and the insulator 406*a*. Since excess oxygen is moved to the semiconductor 406*b* as described above, defects (oxygen vacancies) in the semiconductor 406*b* can be reduced.

Note that the second heat treatment may be performed at a temperature such that excess oxygen in the insulator 410 and the mixed region 414 is diffused to the semiconductor 406*b*. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen from the insulator 402 or the like can be inhibited. Note that the second heat treatment is not necessarily performed when heating during formation of the films can work as heat treatment comparable to the second heat treatment.

Although not illustrated, an opening reaching the conductor 416*a* and an opening reaching the conductor 416*b* may be formed in the insulator 408 and the insulator 410, and conductors serving as wirings may be formed in the openings. Alternatively, an opening reaching the conductor 404 may be formed in the insulator 408, and a conductor serving as a wiring may be formed in the opening.

Through the above steps, the transistor illustrated in FIGS. 1A to 1C can be manufactured.

In Embodiment 1, one embodiment of the present invention has been described. Note that one embodiment of the present invention is not limited to the above examples. That is, since various embodiments of the present invention are disclosed in this embodiment and other embodiments, one embodiment of the present invention is not limited to a specific embodiment. The example in which an oxide semiconductor is used as a semiconductor has been described as one embodiment of the present invention; however, one embodiment of the present invention is not limited thereto. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

The structure and method described in this embodiment can be implemented by being combined as appropriate with any of the other structures and methods described in the other embodiments.

Embodiment 2

Transistor Structure 2

Figure 2A:
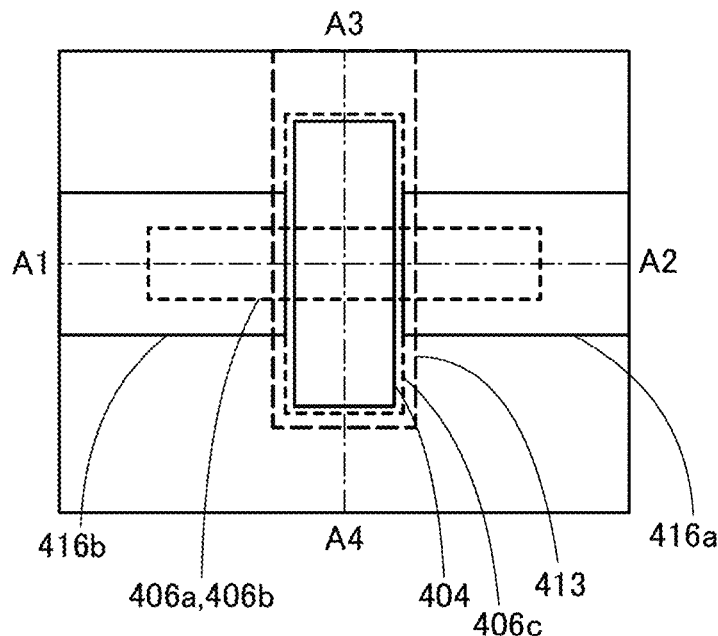
FIGS. 2A to 2C are a top view and cross-sectional views which illustrate a transistor of one embodiment of the present invention.
Figure 2B:
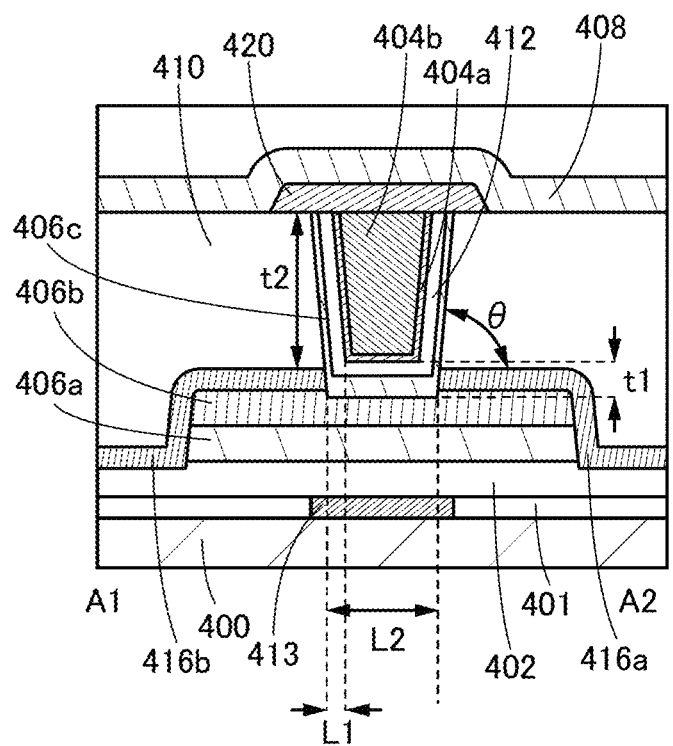
Figure 2C:
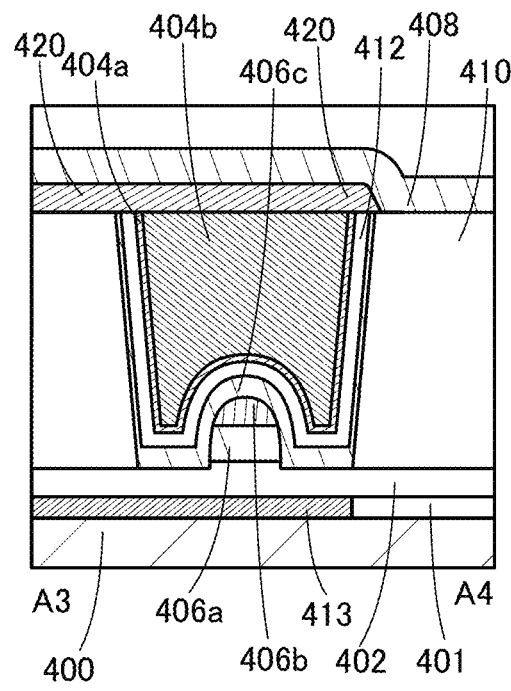

A transistor having a structure different from that in FIGS. 1A to 1C and a manufacturing method thereof will be described with reference to FIGS. 2A to 2C. FIGS. 2A to 2C are a top view and cross-sectional views of a semiconductor device of one embodiment of the present invention. FIG. 2A is the top view, and FIGS. 2B and 2C are the cross-sectional views taken along dashed-dotted lines A1-A2 and A3-A4 in FIG. 2A, respectively. Note that for simplification of the drawing, some components are not illustrated in the top view in FIG. 2A.

In the transistor in FIG. 2B, the angle θ between the side surface of the insulator 410 and a top surface of the conductor 416*a* is greater than 0° and less than 90°, and the insulator 406*c* is formed on the side surface of the insulator 410. The angle θ is preferably greater than or equal to 75° C. and less than 90° C., preferably greater than or equal to 80° C. and less than 90° C., further preferably greater than or equal to 85° C. and less than 90° C. The insulator 406*c* is formed thinner in a region overlapping with a side surface of the conductor 404 with the insulator 412 interposed therebetween than in a region overlapping with the bottom surface of the conductor 404. For the other components, the description of the transistor in FIGS. 1A to 1C is referred to.

<Method 2 for Manufacturing Transistor>

First, the steps up to the step illustrated in FIG. 7H described in Embodiment 1 are performed.

Next, the side surface of the insulator 410 is formed so that the angle θ between the side surface of the insulator 410 and the top surface of the conductor 416a is greater than 0° and less than 90°. Then, the insulator 406c is formed with use of the film formation apparatus described in Embodiment 1. Here, for example, the smaller the angle θ is, the higher the probability of deposition of sputtered particles becomes, in which case the insulator 406c is formed thick on the side surface of the insulator 410. The insulator 406c is formed thin on the side surface of the insulator 410 as the angle θ gets larger. In such a manner, the thickness of the insulator 406c formed on the side surface of the insulator 410 can be adjusted by the angle θ. That is, L1, which is the width of the offset region to be formed, can be reduced. Accordingly, t1 is greater than L1, and L1/t1 is less than 1.

The subsequent steps may be performed in a manner similar to that of the steps described in the method 1 for manufacturing the transistor described in Embodiment 1.

Through the above steps, the transistor illustrated in FIGS. 2A to 2C can be manufactured.

The structure and method described in this embodiment can be implemented by being combined as appropriate with any of the other structures and methods described in the other embodiments.

Embodiment 3

Transistor Structures 3 and 4

Transistors having structures different from that in FIGS. 1A to 1C and manufacturing methods thereof will be described with reference to FIGS. 3A to 3C and FIGS. 4A to 4C. FIGS. 3A to 3C and FIGS. 4A to 4C are top views and cross-sectional views of semiconductor devices of one embodiment of the present invention.

Figure 3A:
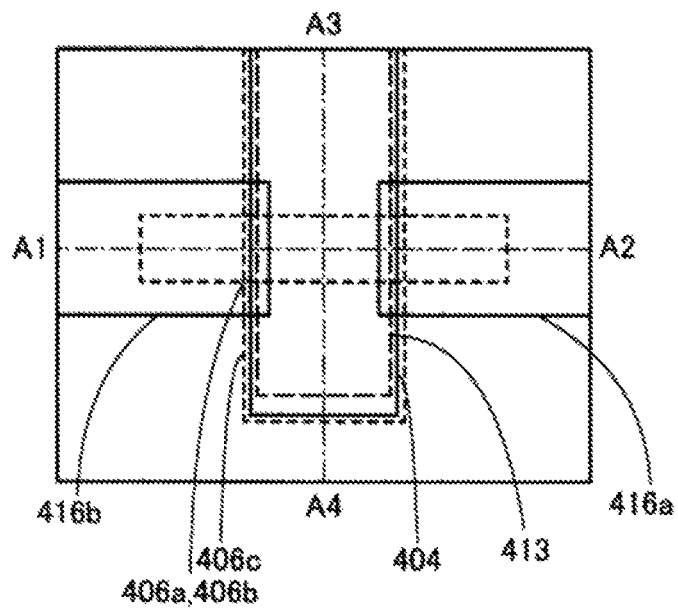
FIGS. 3A to 3C are a top view and cross-sectional views which illustrate a transistor of one embodiment of the present invention.
Figure 3B:
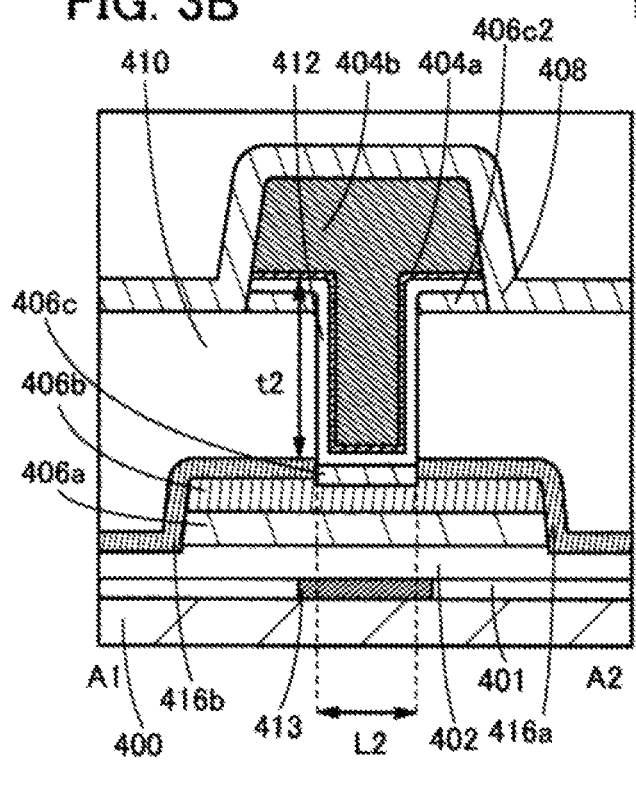
Figure 3C:
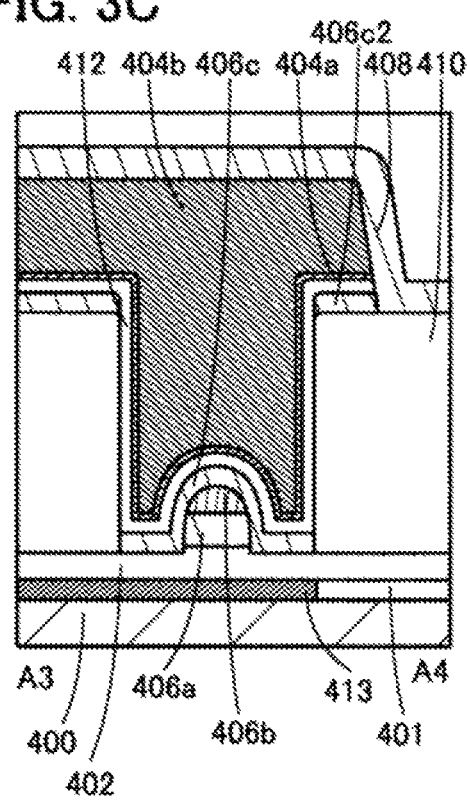
Figure 4A:
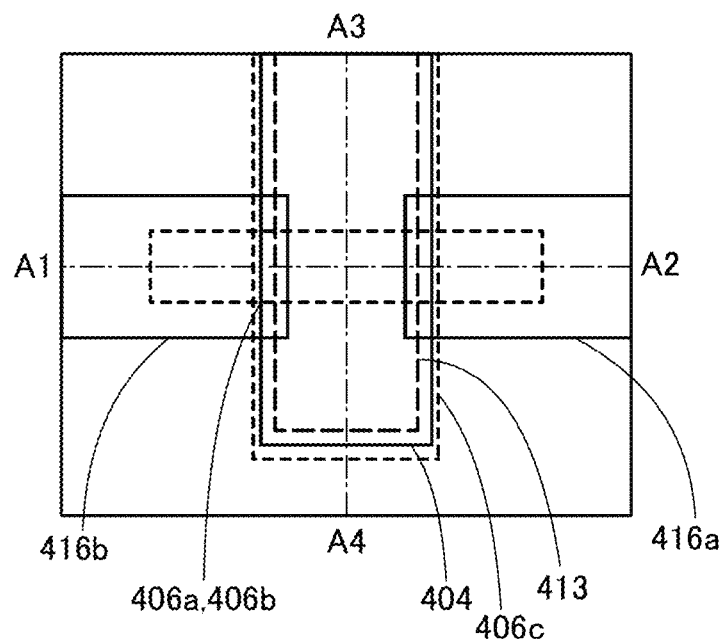
FIGS. 4A to 4C are a top view and cross-sectional views which illustrate a transistor of one embodiment of the present invention.

The transistors illustrated in FIGS. 3A to 3C and FIGS. 4A to 4C are described. FIG. 3A and FIG. 4A are top views. FIG. 3B is a cross-sectional view taken along dashed-dotted line A1-A2 in FIG. 3A. FIG. 3C is a cross-sectional view taken along dashed-dotted line A3-A4 illustrated in FIG. 3A. Note that for simplification of the drawing, some components in the top view in FIG. 3A are not illustrated.

Figure 4B:
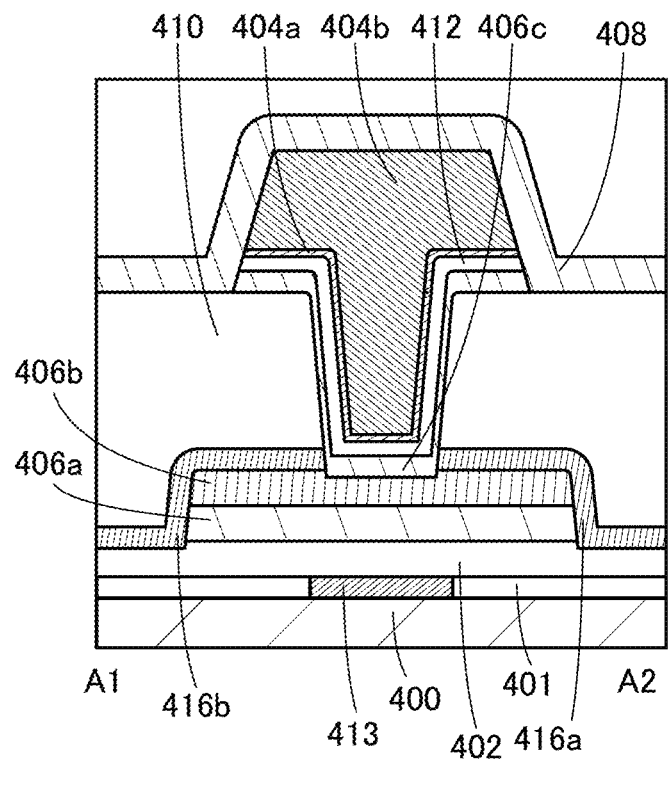
Figure 4C:
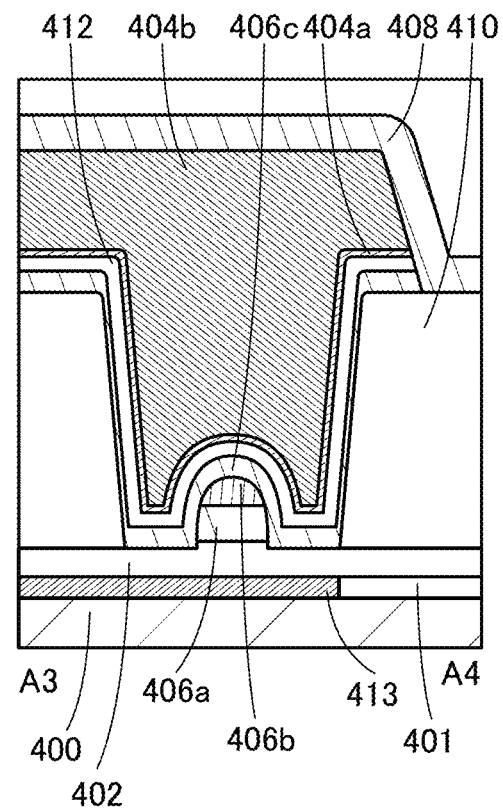

FIG. 4B is a cross-sectional view taken along dashed-dotted line A1-A2 illustrated in FIG. 4A. FIG. 4C is a cross-sectional view taken along dashed-dotted line A3-A4 illustrated in FIG. 4A. Note that for simplification of the drawing, some components in the top view in FIG. 4A are not illustrated.

In the transistors in FIGS. 3A to 3C and FIGS. 4A to 4C, the insulator 406c2 (the insulator 406c in FIGS. 4B and 4C), the insulator 412, the conductor 404a, and the conductor 404b are also formed in part of a region on the top surface of the insulator 410. For the other components, the description of the transistor in FIGS. 1A to 1C or the transistor in FIGS. 2A to 2C is referred to.

In the transistors in FIGS. 3A to 3C and FIGS. 4A to 4C, part of the conductor 404a and the conductor 404b serving as a gate electrode may function as a wiring. That is, part of the conductors 404a and 404b which is formed over the insulator 410 with the insulator 406c and the insulator 412 positioned therebetween correspond to the conductor 420 in the transistor structure 1. That is, in the structure, t2 is the perpendicular distance between part of the conductor 404a which is over the insulator 410 and the conductor 416a or the conductor 416b. Note that since the insulator 406c2, the insulator 412, the conductor 404a, and the conductor 404b are formed at the same time, the insulator 406c2 (an insulator 406c in FIGS. 4B and 4C) and the insulator 412 are positioned between the top surface of the insulator 410 and part of the conductor 404a which is formed over the insulator 410. Therefore, t2, the length of the summation of the thicknesses of the insulator 410, the insulator 406c2 (the insulator 406c in FIGS. 4B and 4C), and the insulator 412, can be sufficiently large, so that parasitic capacitance can be reduced.

<Methods 3 and 4 for Manufacturing Transistor>

A method for manufacturing the transistor illustrated in FIGS. 3A to 3C is described below.

First, the steps up to the step illustrated in FIG. 8F described in Embodiment 1 are performed.

Next, the insulator 406c, the insulator 412, the conductor 404a, and the conductor 404b are formed by a photolithography method or the like. With this structure, a conductor corresponding to the conductor 420 in the transistor structure 1 can be formed at the same time using the conductor 404a and the conductor 404b.

Next, the insulator 408 is formed.

Through the above steps, the transistor illustrated in FIGS. 3A to 3C can be manufactured.

In the transistor in FIGS. 4A to 4C, the insulator 406c, the insulator 412, the conductor 404a, and the conductor 404b are formed in steps similar to those of the transistor illustrated in FIGS. 2A to 2C. Then, the insulator 406c, the insulator 412, the conductor 404a, and the conductor 404b each having a desired shape are formed by a photolithography method. With this structure, a conductor corresponding to the conductor 420 in the transistor structure 1 can be formed using the conductor 404a and the conductor 404b.

Through the above steps, the transistor illustrated in FIGS. 4A to 4C can be manufactured.

The structure and method described in this embodiment can be implemented by being combined as appropriate with any of the other structures and methods described in the other embodiments.

Embodiment 4

Transistor Structures 5 and 6

Transistors having structures different from that in FIGS. 1A to 1C and manufacturing methods thereof will be described with reference to FIGS. 5A to 5C and FIGS. 6A to 6C. FIGS. 5A to 5C and FIGS. 6A to 6C are top views and cross-sectional views of semiconductor devices of one embodiment of the present invention.

Figure 5A:
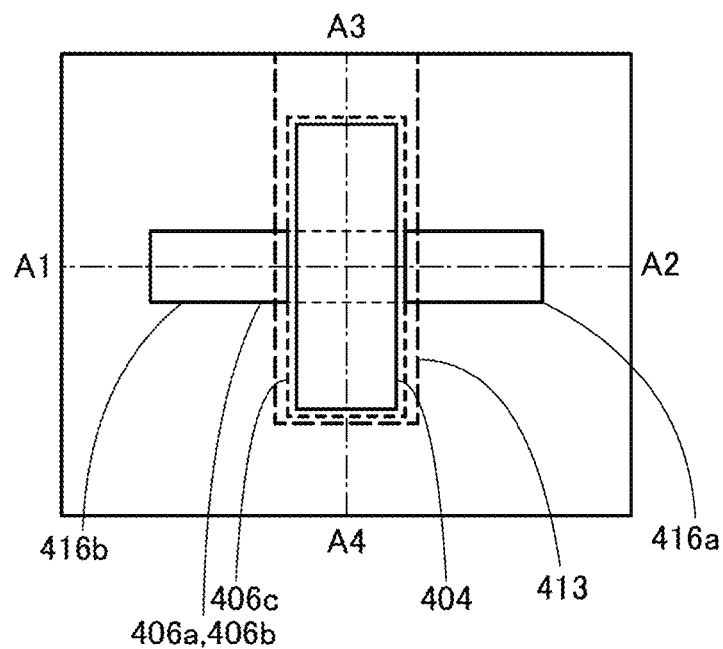
FIGS. 5A to 5C are a top view and cross-sectional views which illustrate a transistor of one embodiment of the present invention.
Figure 5B:
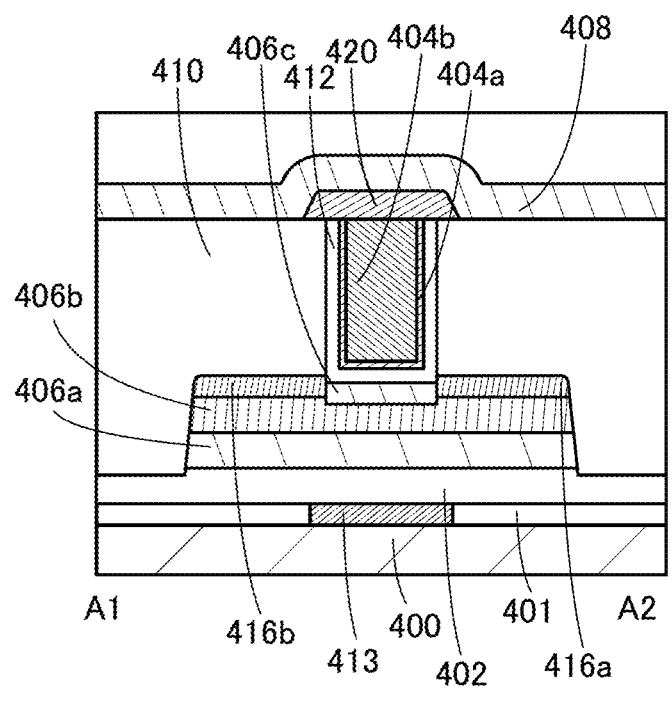
Figure 5C:
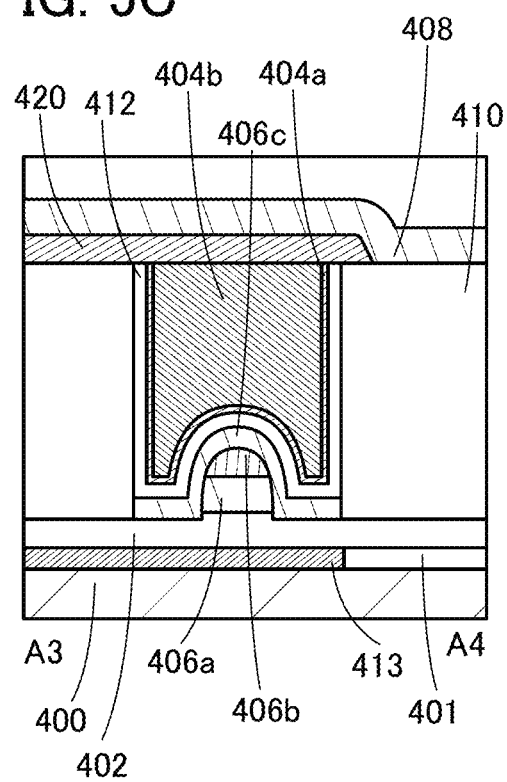
Figure 6A:
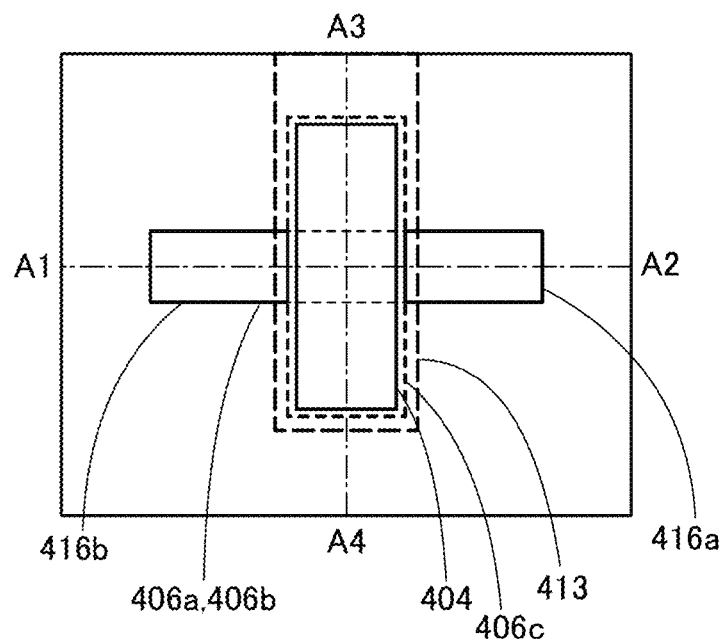
FIGS. 6A to 6C are a top view and cross-sectional views which illustrate a transistor of one embodiment of the present invention.

The transistors illustrated in FIGS. 5A to 5C and FIGS. 6A to 6C are described. FIG. 5A and FIG. 6A are top views. FIG. 5B is a cross-sectional view taken along dashed-dotted line A1-A2 in FIG. 5A. FIG. 5C is a cross-sectional view taken along dashed-dotted line A3-A4 illustrated in FIG. 5A. Note that for simplification of the drawing, some components in the top view in FIG. 5A are not illustrated.

Figure 6B:
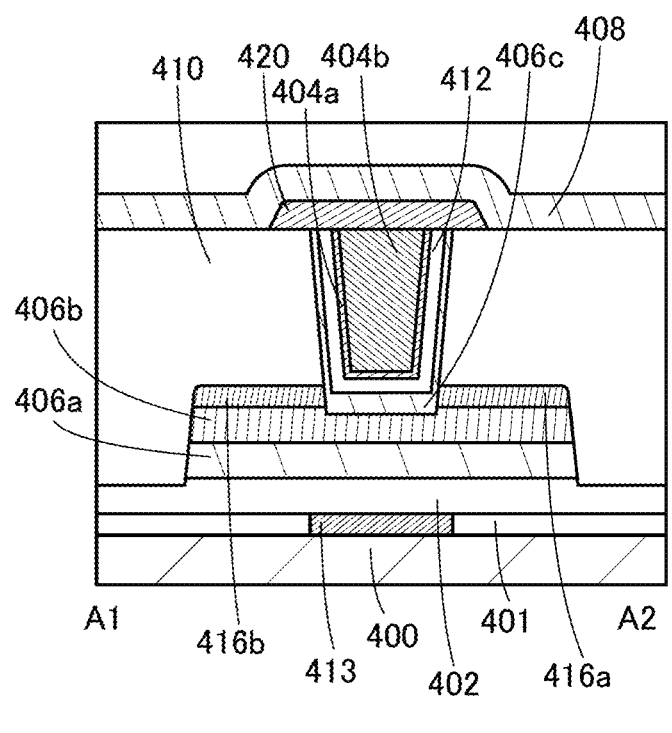
Figure 6C:
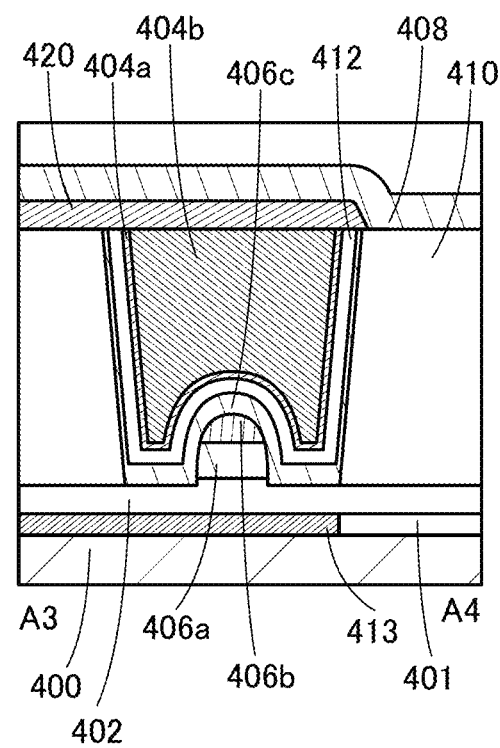

FIG. 6B is a cross-sectional view taken along dashed-dotted line A1-A2 illustrated in FIG. 6A. FIG. 6C is a cross-sectional view taken along dashed-dotted line A3-A4 illustrated in FIG. 6A. Note that for simplification of the drawing, some components are not illustrated in the top view in FIG. 6A.

In the transistors illustrated in FIGS. 5A to 5C and FIGS. 6A to 6C, the conductor 416a and the conductor 416b are formed only over the semiconductor 406b. For the other components, the description of the transistor in FIGS. 1A to 1C or the transistor in FIGS. 2A to 2C is referred to.

<Methods 5 and 6 for Manufacturing Transistor>

A method for manufacturing the transistor illustrated in FIGS. 5A to 5C is described below.

First, the steps up to the step illustrated in FIGS. 7A and 7B described in Embodiment 1 are performed.

Then, the conductor 416 is formed after the insulator 406a and the semiconductor 406b are formed. Then, a resist is formed over the conductor 416 by a photolithography method or the like, and first etching is performed on the conductor 416 using the resist as a mask. Then, after the resist is removed, a second etching is performed using the conductor 416 as a mask. The second etching is performed on the insulator 406a and the semiconductor 406b.

The following steps are similar to the steps after the step illustrated in FIGS. 7G and 7H in Embodiment 1. Through the above steps, the transistor illustrated in FIGS. 5A to 5C can be manufactured.

In the transistor illustrated in FIGS. 6A to 6C, the insulator 406a, the semiconductor 406b, and the conductor 416 are formed in a manner similar to that of the transistor illustrated in FIGS. 5A to 5C. Then, the transistor is preferably formed through the steps similar to those of the transistor illustrated in FIGS. 2A to 2C.

Through the above steps, the transistor illustrated in FIGS. 6A to 6C can be manufactured.

The structure and method described in this embodiment can be implemented by being combined as appropriate with any of the other structures and methods described in the other embodiments.

Embodiment 5

Transistor Structure 7

A structure of a transistor included in a semiconductor device of one embodiment of the present invention is described below.

Figure 10A:
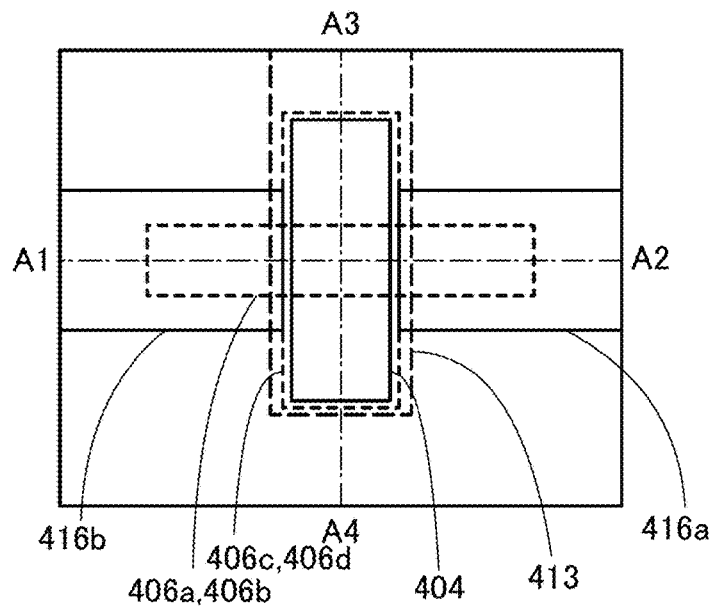
FIGS. 10A to 10C are a top view and cross-sectional views which illustrate a transistor of one embodiment of the present invention.
Figure 10B:
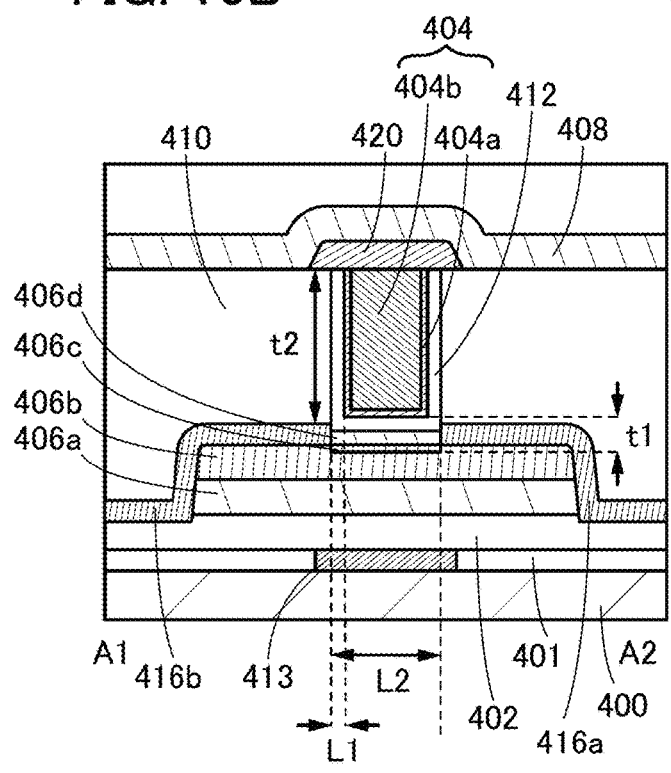
Figure 10C:
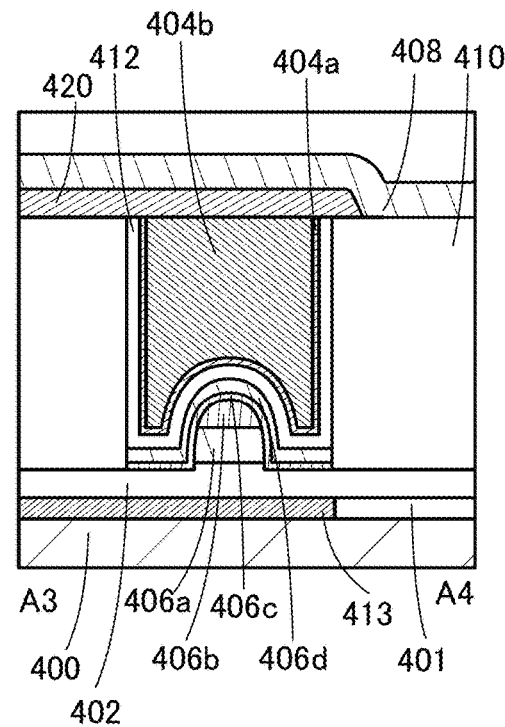

FIGS. 10A to 10C are a top view and cross-sectional views of the semiconductor device of one embodiment of the present invention. FIG. 10A is the top view. FIG. 10B is a cross-sectional view taken along dashed-dotted line A1-A2 in FIG. 10A, which illustrates a cross-sectional shape in the channel length direction. FIG. 10C is a cross-sectional view taken along dashed-dotted line A3-A4 in FIG. 10A, which illustrates a cross-sectional shape in the channel width direction. Note that for simplification of the drawing, some components in the top view in FIG. 10A are not illustrated.

A transistor illustrated in FIGS. 10A to 10C includes the conductor 413 and the insulator 401 over a substrate 400, the insulator 402 over the conductor 413 and the insulator 401, the insulator 406a over the insulator 402, the semiconductor 406b over the insulator 406a, the conductor 416a and the conductor 416b each including a region in contact with a top surface of the semiconductor 406b, the insulator 410 that is in contact with top surfaces of the insulator 402, the conductor 416a and the conductor 416b and has an opening, an insulator 406c in contact with a side surface of the conductor 416a and top and side surfaces of the semiconductor 406b, an insulator 406d over the insulator 406c, an insulator 412 in contact with a top surface of the insulator 406d and a side surface of the opening in the insulator 410, the conductor 404 including the conductor 404a and the conductor 404b, that is positioned over the semiconductor 406b with the insulator 412, the insulator 406c, and the insulator 406d positioned therebetween. Note that the conductor 404b faces the side surface of the opening in the insulator 410 with the conductor 404a and the insulator 412 positioned therebetween. A conductor 420 over the conductors 404a and 404b and an insulator 408 over the insulator 412 and the conductor 420 are provided over a transistor. Alternatively, the conductor 413 and the insulator 401 are not necessarily provided, and a structure without the conductor 413 and the insulator 401 as illustrated in FIGS. 56A to 56C may also be used.

Each of the insulator 406c and the insulator 406d preferably contains at least one element contained in the semiconductor 406b other than oxygen. This can reduce generation of defects at the interface between the semiconductor 406b and the insulator 406c and the interface between the insulator 406c and the insulator 406d. Furthermore, the crystallinity of the insulator 406c and the insulator 406d can be improved.

It is preferable that the semiconductor 406b and the insulator 406c each include a CAAC-OS which will be described later. Furthermore, the insulator 406d preferably includes a CAAC-OS. Furthermore, the insulator 406a preferably includes a CAAC-OS.

In the transistor, the conductors 404a and 404b serve as a first gate electrode. At least one of the conductors 404a and 404b is preferably a conductor that is less likely to transmit oxygen. For example, a conductor that is less likely to transmit oxygen is formed as the conductor 404a that is a lower layer, in which case a reduction in conductivity caused by oxidization of the conductor 404b can be prevented. The insulator 412 serves as a first gate insulator.

The conductor 413 serves as a second gate electrode. The conductor 413 can have a stacked-layer structure including a conductor that is less likely to transmit oxygen. The stacked-layer structure including a conductor that is less likely to transmit oxygen can prevent a reduction in conductivity due to oxidation of the conductor 413. The insulator 402 serves as a second gate insulator. The potential applied to the conductor 413 can control the threshold voltage of the transistor. When the first gate electrode is electrically connected to the second gate electrode, the current in a conducting state (on-state current) can be increased. Note that the function of the first gate electrode and that of the second gate electrode may be interchanged.

The conductor 416a and the conductor 416b serve as a source electrode and a drain electrode. Note that conductivity of the conductor can be measured by a two-terminal method or the like.

Therefore, the resistance of the semiconductor 406b can be controlled by a potential applied to the conductor 404. That is, conduction or non-conduction between the conductors 416a and 416b can be controlled by the potential applied to the conductor 404.

As illustrated in FIG. 10B, the top surface of the semiconductor 406b is in contact with the conductors 416a1 and 416a2. In addition, the semiconductor 406b can be electrically surrounded by an electric field of the conductor 404 serving as the gate electrode. A structure in which a semiconductor is electrically surrounded by an electric field of a gate electrode is referred to as a surrounded channel (s-channel) structure. Thus, in some cases, a channel is formed in the entire semiconductor 406b. In the s-channel structure, a large amount of current can flow between a source and a drain of the transistor, so that an on-state current can be increased. In addition, since the semiconductor 406b is surrounded by the electric field of the conductor 404, an off-state current can be decreased.

The transistor in this embodiment can also be referred to as a trench-gate self-aligned s-channel FET (TGSA s-channel FET) because the region serving as a gate electrode is formed in a self-aligned manner to fill the opening formed in the insulator 410 and the like.

Here, in FIG. 10B, the length between a top surface of a region of the semiconductor 406b overlapping with the conductor 404 and a bottom surface of the conductor 404 is denoted as t1. In FIG. 10B, the length between a region of the semiconductor 406b overlapping with a bottom surface of the conductor 416a and a region of the semiconductor 406b overlapping with the bottom surface of the conductor 404 is denoted as L1. Alternatively, the length between a region of the semiconductor 406b overlapping with a bottom surface of the conductor 416b and the region of the semiconductor 406b overlapping with the bottom surface of the conductor 404 is denoted as L1.

In the transistor, a region having L1 is formed between a region where a channel is formed in the semiconductor 406b (a region where the conductor 404 and the semiconductor 406b overlap with each other) and a source region or a drain region (a region where the conductor 416a or the conductor 416b overlaps with the semiconductor 406b). The region having L1 can reduce the off-state current of the transistor; however, the region with a too large L1 can reduce the on-state current of the transistor.

The region where a channel is formed in the semiconductor 406b is covered with the insulator 406c and the insulator 406d, whereby the insulator 406c and the insulator 406d can block entry of elements other than oxygen (such as hydrogen and silicon) included in the adjacent insulator into the region where channel is formed. Therefore, the insulator 406c and the insulator 406d may be formed at least over the semiconductor 406b.

L1 can be reduced by not providing the insulator 406c and the insulator 406d on a side surface of the conductor 404 with the insulator 412 positioned therebetween or by forming the insulator 406c and the insulator 406d thinner in a region covering the side surface of the conductor 404 with the insulator 412 positioned therebetween than in a region overlapping with the bottom surface of the conductor 404 with the insulator 412 positioned therebetween. Accordingly, t1 is greater than L1, and L1/t1 is less than 1.

Figure 11A:
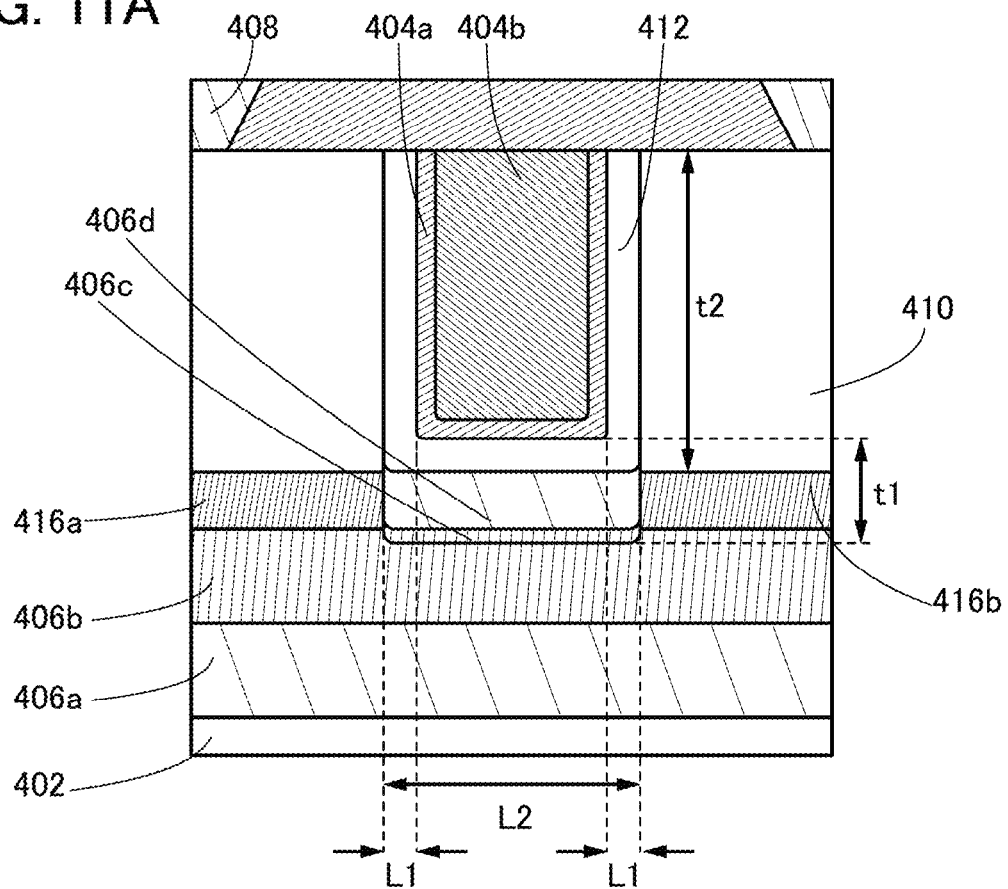
FIGS. 11A and 11B are cross-sectional views illustrating transistors of embodiments of the present invention.

In FIGS. 10B and 11A, the length between the conductor 416a or the conductor 416b and the conductor 420 is denoted as t2. In addition, in FIG. 10B, the length between the conductor 416a and the conductor 416b is denoted as L2.

As the transistor is miniaturized, the parasitic capacitance in the vicinity of the transistor is a non-negligible and significant problem. For example, parasitic capacitance is in some cases formed between the conductor 420 and the conductor 416a or the conductor 416b. When there is a large parasitic capacitance in the vicinity of the region where a channel is formed, for example, the transistor operation needs a time for charging the parasitic capacitance, resulting in decreasing not only the responsiveness of the transistor but the responsiveness of the semiconductor device. Furthermore, extra power consumption for charging the parasitic capacitance increases power consumption of a circuit including a plurality of transistors. Therefore, t2 is preferably sufficiently large such that the parasitic capacitance is negligibly small as compared to the gate capacitance.

L2 is reduced as the transistor is miniaturized, which leads to difficulty in applying a sufficiently large voltage to the conductor 404a and the conductor 404b. However, when t2 has a sufficient length, the resistance of the conductor 404a and that of the conductor 404b can be reduced. Therefore, t2 is at least greater than L2, and t2/L2 is preferably greater than or equal to 1.5 and less than or equal to 2.

Figure 11B:
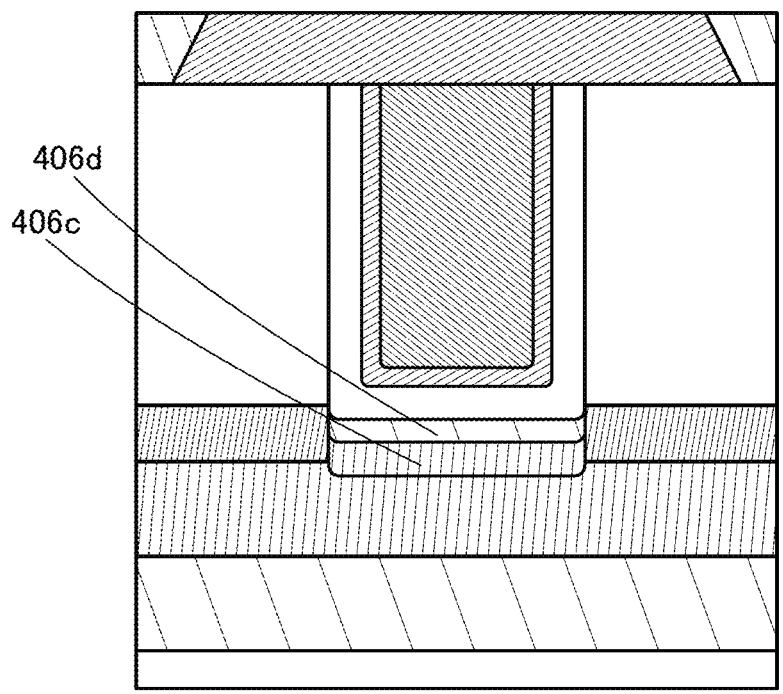

FIGS. 11A and 11B are each an enlarged view of an opening provided in the insulator 410 of the transistor in this embodiment. The top surface of the insulator 406d is approximately the same level as the top surfaces of the conductor 416a and the conductor 416b. Note that the top surface of the insulator 406d is a surface that is close to the conductor 404a in a region where the insulator 406d overlaps with the bottom surfaces of the conductor 404a and the conductor 404b. Ideally, the top surface of the insulator 406d is preferably the same level as the top surfaces of the conductors 416a and 416b as illustrated in FIG. 11A.

It is preferable that the top surface of the insulator 406c be approximately the same level as the interface between the semiconductor 406b and the conductors 416a and 416b. Note that the top surface of the insulator 406c is a surface that is close to the conductor 404a in a region where the insulator 406c overlaps with the bottom surfaces of the conductor 404a and the conductor 404b. Ideally, the top surface of the insulator 406c is preferably the same level as the interface between the semiconductor 406b and the conductors 416a and 416b. Note that the insulator 406c should at least fills in an over-etched portion of the semiconductor 406b; however, it is not limited thereto, the top surface of the insulator 406c may be above the interface between the semiconductor 406b and the conductors 416a and 416b as illustrated in FIG. 11B.

The transistor of this embodiment has a structure in which two insulators, the insulators 406c and 406d, are provided over the semiconductor 406b; however, it is not limited thereto, three or more stacked layers may also be provided.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Note that electrical characteristics of the transistor can be stabilized when the transistor is surrounded by an insulator with a function of blocking oxygen and impurities such as hydrogen. For example, an insulator with a function of blocking oxygen and impurities such as hydrogen may be used as the insulator 408.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

For example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed using plasma containing oxygen, oxygen can be added to the insulator 410 to be a base layer of the insulator 408 or a side surface of the insulator 412. The added oxygen becomes excess oxygen in the insulator 410 or the insulator 412. When the insulator 408 contains aluminum oxide, entry of impurities such as hydrogen into the semiconductor 406b can be inhibited. In addition, when the insulator 408 contains aluminum oxide, outward diffusion of excess oxygen that is added to the insulator 410 and the insulator 412 can be reduced, for example.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with low relative dielectric constant. For example, the insulator 410 preferably contains silicon oxide, silicon oxynitride, silicon nitride oxide, silicon nitride, silicon oxide to which fluorine is added, silicon oxide to which carbon is added, silicon oxide to which carbon and nitrogen are added, silicon oxide having pores, a resin, or the like. Alternatively, the insulator 410 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. When silicon oxide or silicon oxynitride, which is thermally stable, is combined with a resin, the stacked-layer structure can have thermal stability and low relative dielectric constant. Examples of the resin include polyester, polyolefin, polyamide (e.g., nylon or aramid), polyimide, polycarbonate, and acrylic.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, for the insulator 412, a material containing silicon oxide or silicon oxynitride is preferably used.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. The insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when an aluminum oxide, a gallium oxide, or a hafnium oxide of the insulator 412 is on the insulators 406c and 406d side, entry of silicon included in the silicon oxide or the silicon oxynitride into the semiconductor 406b can be suppressed. When silicon oxide or silicon oxynitride is on the insulators 406c and 406d side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

Each of the conductors 416a and 416a may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

Each of the conductors 404, 413, and 420 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a, the insulator 406c, and the insulator 406d, oxides containing one or more elements other than oxygen contained in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The insulator 406a, the insulator 406c, and the insulator 406d are oxides including one or more elements, or two or more elements other than oxygen included in the semiconductor 406b. Since the insulator 406a, the insulator 406c, and the insulator 406d each include one or more elements, or two or more elements other than oxygen included in the semiconductor 406b, a defect state is less likely to be formed at the interface between the insulator 406a and the semiconductor 406b, the interface between the semiconductor 406b and the insulator 406c, and the interface between the insulator 406c and the insulator 406d.

As the semiconductor 406b, an oxide having an electron affinity higher than those of the insulators 406a, 406c, and 406d is used. For example, as the semiconductor 406b, an oxide having an electron affinity higher than those of the insulators 406a, 406c, and 406d by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band. Furthermore, the insulator 406c preferably has a higher electron affinity than the insulator 406d.

When gate voltage is applied to such a transistor in which the insulator 406a is placed under the semiconductor 406b and the insulators 406c and 406d are placed over the semiconductor 406b, a channel is formed in the semiconductor 406b whose electron affinity is the highest among the insulator 406a, the semiconductor 406b, the insulator 406c, and the insulator 406d. In this manner, a buried channel structure can be formed.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. Furthermore, in some cases, there is a mixed region of the insulator 406c and the insulator 406d between the insulator 406c and the insulator 406d. The mixed region has a low density of defect states. For that reason, in a stack including the insulator 406a, the semiconductor 406b, the insulator 406c, and the insulator 406d energy changes continuously at their interfaces and in the vicinity of the interface (continuous junction). Note that boundaries of the insulator 406a, the semiconductor 406b, and the insulator 406c are not clear in some cases.

At this time, electrons move mainly in the semiconductor 406b, not in the insulator 406a, the insulator 406c, and the insulator 406d.

As factors of inhibiting electron movement are decreased, the on-state current of the transistor can be increased. Electron movement is inhibited, for example, in the case where physical unevenness in a channel formation region is large.

To increase the on-state current of the transistor, for example, root mean square (RMS) roughness with a measurement area of 1 μm×1 μm of the top surface or the bottom surface of the semiconductor 406b (a formation surface; here, the top surface of the insulator 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

The above four-layer structure is an example. For example, a stacked-layer structure in which any one of the insulators described as examples of the insulator 406a, the insulator 406c, and the insulator 406d is provided below or over the insulator 406a or below or over the insulator 406d may be employed.

Note that an oxide semiconductor which can be used for the semiconductor will be described in detail in another embodiment.

<Method 7 for Manufacturing Transistor>

A method for manufacturing the transistor of the present invention in FIGS. 10A to 10C will be described below with reference to FIGS. 18A to 18H, FIGS. 19A to 19F, and FIGS. 20A to 20F.

First, the substrate 400 is prepared.

Figure 18A:
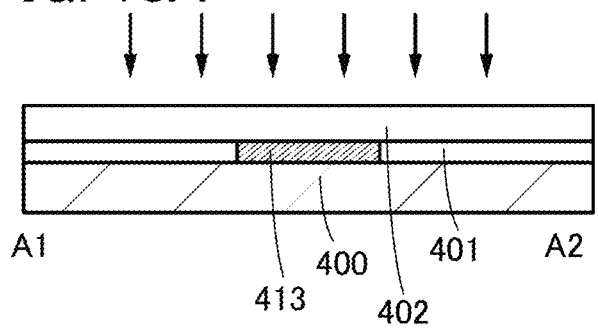
FIGS. 18A to 18H are cross-sectional views each illustrating part of a transistor of one embodiment of the present invention.
Figure 18B:
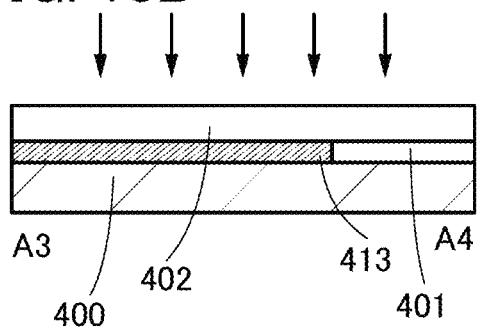

Next, as illustrated in FIGS. 18A and 18B, the insulator to be the insulator 401 is formed over the substrate 400. An opening is formed in the insulator 401, and the conductor to be the conductor 413 is formed over the insulator 401. The conductor to be the conductor 413 can be formed by a sputtering method, a CVD method, an MBE method, a PLD method, an ALD method, or the like. The conductor 413 may have a multilayer structure including a conductor that is less likely to transmit oxygen. The conductor 413 may be embedded to the opening in the insulator 401 by chemical mechanical polishing (CMP) or the like. Alternatively, the conductor 413 may be formed in such a manner that a conductor is formed and processed by a photolithography method or the like.

In the photolithography method, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that dry etching treatment such as ashing or wet etching treatment can be used for removal of the resist mask. Alternatively, wet etching treatment is performed after dry etching treatment. Further alternatively, dry etching treatment is performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, as indicated by arrows in FIGS. 18A and 18B, high-density-plasma treatment may be performed. High-density-plasma treatment is preferably performed in an oxygen atmosphere or a nitrogen atmosphere. The oxygen atmosphere is a gas atmosphere containing oxygen atoms, which includes atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In the oxygen atmosphere, an inert gas such as nitrogen or a rare gas (e.g., helium or argon) may be included. When high-density plasma treatment is performed in an oxygen atmosphere in such a manner, carbon, hydrogen, or the like can be released. In addition, in the case where high-density-plasma treatment is performed in an oxygen atmosphere, organic compound such as hydrocarbon can be easily released from an object.

The high-density plasma treatment in a nitrogen atmosphere may be high-density plasma treatment in an atmosphere containing nitrogen and a rare gas, an atmosphere containing nitrogen, hydrogen, and a rare gas, or an atmosphere containing ammonia and a rare gas, for example. With this high-density plasma treatment in a nitrogen atmosphere, a surface of the treated object and its vicinity can be nitrided. The nitrided region can be formed to be extremely thin on the surface side of the treated object. This nitrided region can prevent diffusion of impurities.

After the high-density plasma treatment in an oxygen atmosphere is performed, the high-density plasma treatment in a nitrogen atmosphere may be performed. Alternatively, after the high-density plasma treatment in a nitrogen atmosphere is performed, the high-density plasma treatment in an oxygen atmosphere may be performed. Annealing treatment may be performed before or after each high-density plasma treatment. Note that it is in some cases preferable to let an enough amount of gas flow in order to increase the plasma density. When the gas amount is not enough, the deactivation rate of radicals becomes higher than the generation rate of radicals in some cases. For example, it is preferable in some cases to let a gas flow at 100 sccm or more, 300 sccm or more, or 800 sccm or more.

The high-density plasma treatment is performed using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically 400° C.). Furthermore, a mixed gas of oxygen and argon can be used.

For example, the high density plasma is generated using a 2.45 GHz microwave and preferably has an electron density of higher than or equal to $1\times10^{11}/cm^3$ and lower than or equal to $1\times10^{13}/cm^3$, an electron temperature of 2 eV or lower, or an ion energy of 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Therefore, it is preferable to perform the high-density plasma treatment while a bias is applied to the substrate.

Following the high-density plasma treatment, annealing treatment may be successively performed without an exposure to the air. Following annealing treatment, the high-density plasma treatment may be successively performed without an exposure to the air. By performing high-density plasma treatment and annealing treatment in succession, entry of impurities during the treatment can be suppressed. Moreover, by performing annealing treatment after the high-density plasma treatment in an oxygen atmosphere, unnecessary oxygen that is added into the treated object but is not used to fill oxygen vacancies can be eliminated. The annealing treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the annealing treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

Next, the insulator 402 is formed. The insulator 402 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such damage due to exposure to plasma is not caused and the yield of the semiconductor device can be increased. In a thermal CVD method, an object is not exposed to plasma during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

In addition, treatment to add oxygen to the insulator 402 may be performed. For the treatment to add oxygen, an ion implantation method, a plasma treatment method, or the like can be used. Note that oxygen added to the insulator 402 is excess oxygen.

Figure 18C:
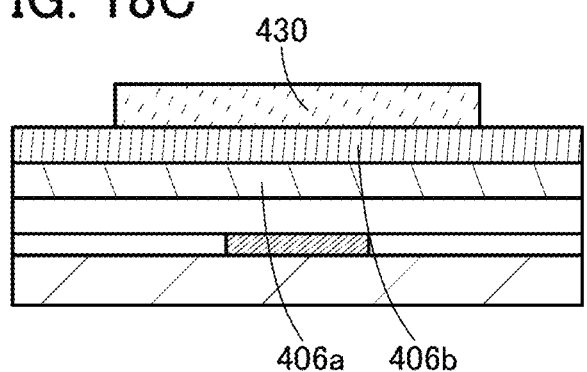
Figure 18D:
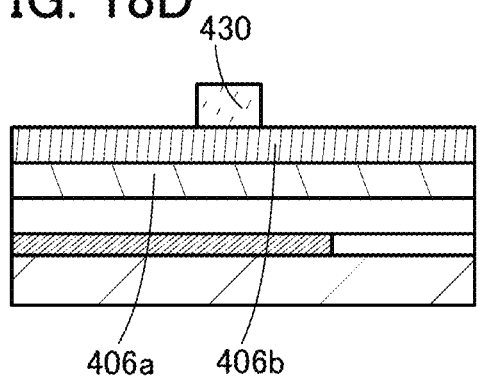

Next, as illustrated in FIGS. 18C and 18D, the insulator to be the insulator 406a, the semiconductor to be the semiconductor 406b, and the resist mask 430 are formed.

First, the insulator to be the insulator 406a is formed over the insulator 402. The insulator to be the insulator 406a can be formed by a sputtering method, a CVD method, an MBE method, a PLD method, an ALD method, or the like. It is particularly preferable to use a facing-target sputtering apparatus. Note that in this specification and the like, deposition using a facing-target sputtering apparatus can also be referred to as vapor deposition sputtering (VDSP).

The use of the facing-target sputtering apparatus can reduce plasma damage induced during deposition of the insulator. Thus, oxygen vacancies in the insulator can be reduced. In addition, the use of the facing-target sputtering apparatus allows deposition in high vacuum. In that case, impurity concentration (e.g., concentration of hydrogen, a rare gas (such as argon), or water) in the deposited insulator can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), ammonia ($NH_3$), or the like may be used, for example.

Next, carbon, hydrogen, and the like may be released by performing the high-density-plasma treatment. In addition, in the case where high-density-plasma treatment is performed under an oxygen atmosphere, organic compounds such as hydrocarbons can be released from an object.

In addition, treatment to add oxygen to the insulator to be the insulator 406a may be performed. For the treatment to add oxygen, an ion implantation method, a plasma treatment method, or the like can be used. Note that oxygen added to the insulator to be the insulator 406a is excess oxygen.

Next, the semiconductor to be the semiconductor 406b is formed over the insulator to be the insulator 406a. The semiconductor can be formed by a sputtering method, a CVD method, an MBE method, a PLD method, an ALD method, or the like. It is particularly preferable to use a facing-target sputtering apparatus.

The use of the facing-target sputtering apparatus can reduce plasma damage induced during deposition of the semiconductor. Accordingly, oxygen vacancies in the semiconductor can be reduced. In addition, the use of a facing-target sputtering apparatus allows deposition in high vacuum. In that case, impurity concentration (e.g., concentration of hydrogen, a rare gas (such as argon), or water) in the deposited semiconductor can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), or ammonia ($NH_3$) may be used, for example.

Next, first heat treatment is preferably performed. The first heat treatment can be performed at a temperature higher than or equal to 250° C. and lower than or equal to 650° C., preferably higher than or equal to 450° C. and lower than or equal to 600° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying a radio frequency (RF) voltage to a substrate side may be provided. The use of high-density plasma enables high-density oxygen radicals to be produced, and application of the RF voltage to the substrate side allows oxygen radicals generated by the high-density plasma to be efficiently introduced into the semiconductor 406b. Alternatively, after plasma treatment using an inert gas with the apparatus, plasma treatment using oxygen in order to compensate released oxygen may be performed.

Figure 18E:
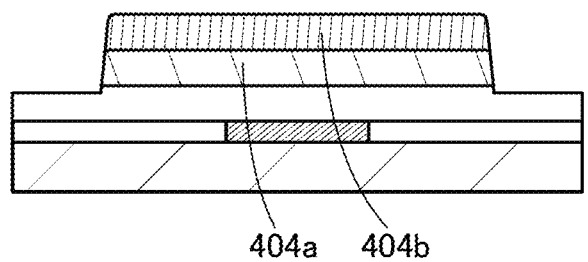
Figure 18F:
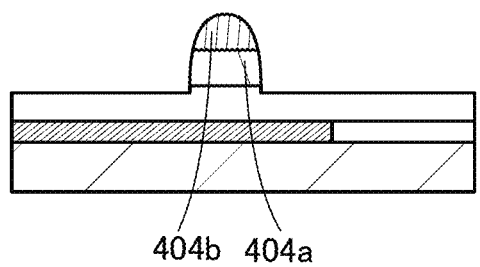

Next, the insulator to be the insulator 406a and the semiconductor to be the semiconductor 406b are processed by a photolithography method or the like using a resist mask 430 to form a multilayer film including the insulator 406a and the semiconductor 406b as illustrated in FIGS. 18E and 18F. Note that when the multilayer film is formed, the insulator 402 is also subjected etching to have a thinned region in some cases. That is, the insulator 402 may have a protruding portion in a region in contact with the multilayer film.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 18G:
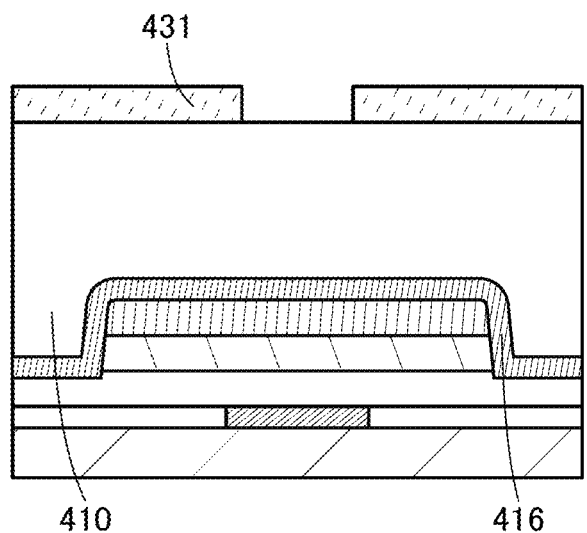
Figure 18H:
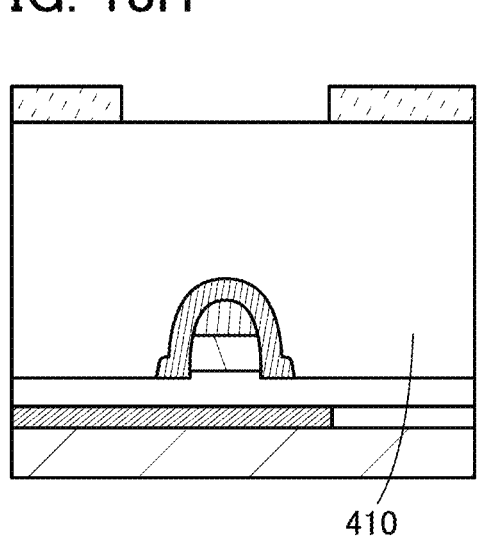

Next, as illustrated in FIGS. 18G and 18H, the conductor 416 and the insulator to be the insulator 410 are formed.

First, the conductor 416 is formed. The conductor 416 can be formed by a sputtering method, a CVD method, an MBE method, a PLD method, an ALD method, or the like.

Note that the conductor 416 covers the multilayer film. The side surface of the insulator 406a and the top and side surfaces of the semiconductor 406b are partly damaged in forming the conductor over the multilayer film, and then a region where resistance is reduced might be formed. Since each of the insulator 406a and the semiconductor 406b includes a region whose resistance is lowered, the contact resistance between the conductor 416 and the semiconductor 406b can be lowered.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, the conductor 416 is processed by a photolithography method or the like, so that the conductors 416a and 416b are formed.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, the insulator to be the insulator 410 is formed. The insulator to be the insulator 410 can be formed by a sputtering method, a CVD method, an MBE method, a PLD method, an ALD method, or the like. Alternatively, the insulator to be the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator to be the insulator 410 may be formed to have a flat top surface. For example, the top surface of the insulator to be the insulator 410 may have planarity immediately after the film formation. Alternatively, after the film formation, an upper portion of the insulator to be the insulator 410 may be removed so that the top surface of the insulator to be the insulator 410 becomes parallel to a reference surface such as a rear surface of the substrate. Such treatment is referred to as planarization treatment. As the planarization treatment, for example, chemical mechanical polishing treatment, dry etching treatment, or the like can be performed. However, the top surface of the insulator to be the insulator 410 is not necessarily flat.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, a resist mask 431 is formed over the insulator to be the insulator 410 by a photolithography method or the like. Here, an organic coating film may be formed between the top surface of the insulator to be the insulator 410 and the resist mask 431 in order to improve the adhesion between the top surface of the insulator to be the insulator 410 and the resist mask 431.

Figure 19A:
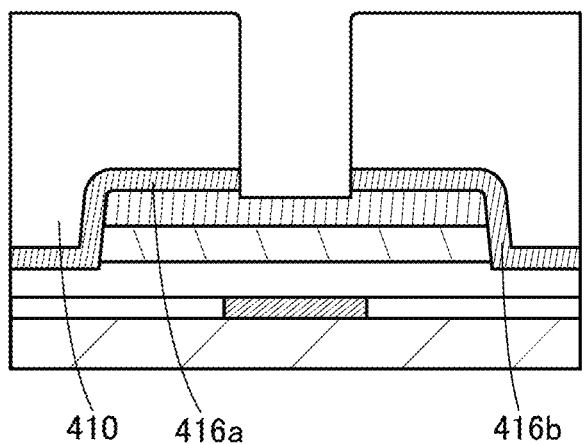
FIGS. 19A to 19F are cross-sectional views each illustrating part of a transistor of one embodiment of the present invention.
Figure 19B:
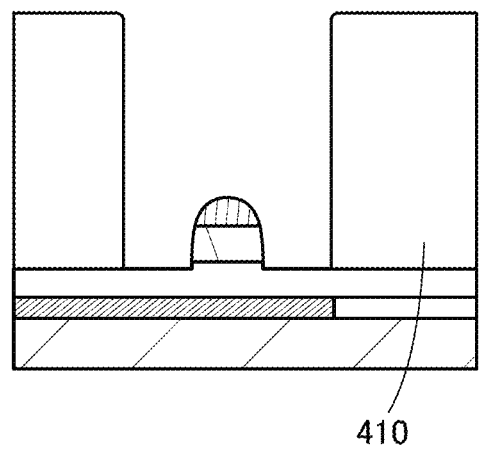

Next, as illustrated in FIGS. 19A and 19B, an opening is formed in the insulator 410 and the conductor 416. First, the insulator to be the insulator 410 is subjected to a first processing by a dry etching method or the like to expose the top surface of the conductor 416. In a dry etching method, any of the above dry etching apparatuses can be used; however, a dry etching apparatus in which high-frequency power sources with different frequencies are connected to the parallel-plate electrodes is preferably used.

Next, the conductor 416 is subjected to a second processing by a dry etching method or the like so as to be separated into the conductor 416a and the conductor 416b. Note that the insulator 410 and the conductor 416 may be processed in the same photolithography process. Processing in the same photolithography process can reduce the number of manufacturing steps. Thus, a semiconductor device including the transistor can be manufactured with high productivity.

At this time, the semiconductor 406b has a region that is exposed. The exposed region of the semiconductor 406b is partly removed by the second processing in some cases. Furthermore, impurity elements such as residual components of the etching gas are attached to the exposed surface of the semiconductor 406b in some cases. For example, chlorine and the like may be attached when a chlorine-based gas is used as the etching gas. When a hydrocarbon-based gas is used as the etching gas, carbon, hydrogen, and the like may be attached. The impurity elements attached to the exposed surface of the semiconductor 406b are preferably reduced. The impurity elements can be reduced by cleaning treatment using dilute hydrofluoric acid, cleaning treatment using ozone, cleaning treatment using ultra violet rays, or the like. Note that some kinds of cleaning treatment may be used in combination. Accordingly, the exposed surface of the semiconductor 406b, that is, the region where channel is formed has a high resistance.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 19C:
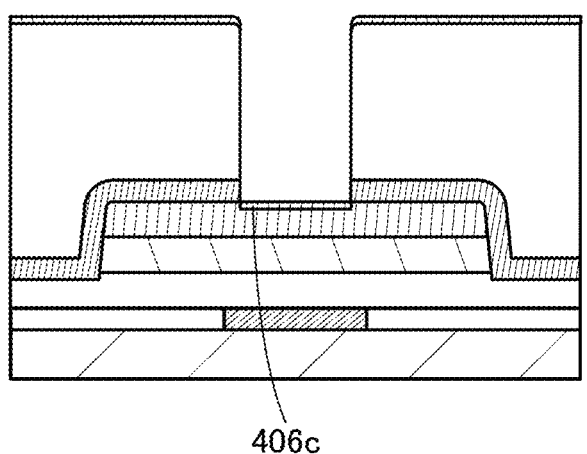
Figure 19D:
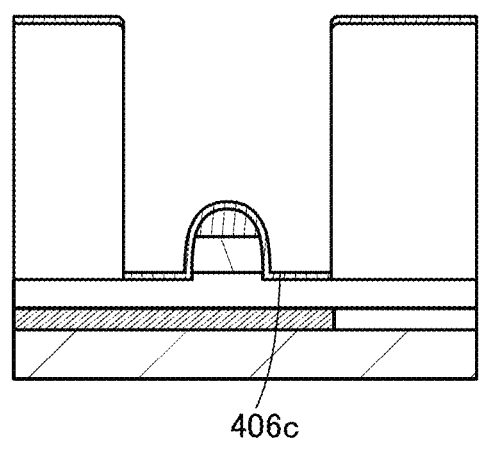

Next, as illustrated in FIGS. 19C and 19D, the insulator 406c is formed over top and side surfaces of the semiconductor 406b, a side surface of the insulator 406a, a top surface of the insulator 402, and a top surface of the insulator 410, which are surfaces except for at least the side surface of the insulator 410. Note that the insulator 406c is preferably formed so as to fill in a depression formed in the semiconductor 406b. The insulator 406c can be formed by a sputtering method.

Here, a sputtering apparatus which is used for formation of the insulator 406c and the insulator 406d is described with reference to FIG. 21 and FIG. 22.

FIG. 21 is a cross-sectional view illustrating part of a sputtering apparatus 101. The sputtering apparatus 101 illustrated in FIG. 21 includes a member 190, a collimator 150 over the member 190, a target holder 120, a backing plate 110 placed over the target holder 120, a target 100 placed over the backing plate 110, a magnet unit 130 including a magnet 130N and a magnet 130S placed under the target 100 with the backing plate 110 positioned therebetween, and a magnet holder 132 that supports the magnet unit 130. Note that in this specification, a magnet unit means a group of magnets. The magnet unit can be replaced with "cathode", "cathode magnet", "magnetic member", "magnetic part", or the like.

A substrate stage 170 placed to face the target 100 and a substrate 160 held by the substrate stage 170 are illustrated. FIG. 21 also illustrates a magnetic force line 180a and a magnetic force line 180b formed by the magnet unit 130.

The target holder 120 and the backing plate 110 are fixed to each other with a bolt and have the same potential. The target holder 120 has a function of supporting the target 100 with the backing plate 110 positioned therebetween.

The backing plate 110 has a function of fixing the target 100.

The sputtering apparatus 101 may have a water channel inside or under the backing plate 110. By making fluid (air, nitrogen, a rare gas, water, oil, or the like) flow through the water channel, discharge anomaly due to an increase in the temperature of the target 100 or damage to the sputtering apparatus 101 due to deformation of a component such as the target 100 can be prevented in the sputtering. In that case, the backing plate 110 and the target 100 are preferably adhered to each other with a bonding member because the cooling capability is increased.

A gasket is preferably provided between the target holder 120 and the backing plate 110, in which case an impurity is less likely to enter the sputtering apparatus 101 from the outside or the water channel.

In the magnet unit 130, the magnet 130N and the magnet 130S are placed such that their surfaces on the target 100 side have opposite polarities. Here, the case where the pole of the magnet 130N on the target 100 side is the north pole and the pole of the magnet 130S on the target 100 side is the south pole is described. Note that the layout of the magnets and the poles in the magnet unit 130 are not limited to those illustrated in FIG. 21.

The magnetic force line 180a is one of magnetic force lines that form a horizontal magnetic field in the vicinity of the top surface of the target 100. The vicinity of the top surface of the target 100 corresponds to a region in which the perpendicular distance from the top surface of the target 100 is, for example, greater than or equal to 0 mm and less than or equal to 10 mm, in particular, greater than or equal to 0 mm and less than or equal to 5 mm.

The magnetic force line 180b is one of magnetic force lines that form a horizontal magnetic field in a plane apart from the top surface of the magnet unit 130 by a perpendicular distance d. The perpendicular distance d is, for example, greater than or equal to 0 mm and less than or equal to 20 mm or greater than or equal to 5 mm and less than or equal to 15 mm.

In the deposition, a potential V1 applied to the target holder 120 is, for example, lower than a potential V2 applied to the substrate stage 170. The potential V2 applied to the substrate stage 170 is, for example, the ground potential. A potential V3 applied to the magnet holder 132 is, for example, the ground potential. Note that the potentials V1, V2, and V3 are not limited to the above description. Not all the target holder 120, the substrate stage 170, and the magnet holder 132 are necessarily supplied with potentials. For example, the substrate stage 170 may be electrically floating.

FIG. 21 illustrates an example where the backing plate 110 and the target holder 120 are not electrically connected to the magnet unit 130 and the magnet holder 132, but electrical connection is not limited thereto. For example, the backing plate 110 and the target holder 120 may be electrically connected to the magnet unit 130 and the magnet holder 132, and the backing plate 110, the target holder 120, the magnet unit 130, and the magnet holder 132 may have the same potential.

When the potential V1 is applied to the target holder 120 under the conditions that the deposition gas (e.g., oxygen, nitrogen, or a rare gas such as argon) flows in the sputtering apparatus 101 and the pressure in the sputtering apparatus 101 is constant (e.g., greater than or equal to 0.05 Pa and less than or equal to 10 Pa, preferably greater than or equal to 0.1 Pa and less than or equal to 0.8 Pa), a plasma is formed in a magnetic field formed by the magnet unit 130. The potential of the plasma is a potential Vp that is higher than the potential V1. At this time, a cation in the plasma is accelerated toward the target 100 by a potential difference between the potential Vp and the potential V1. Then, the cation collides with the target 100 to release sputtered particles 194. The released sputtered particles that reach the substrate 160 are deposited to form a film.

In a sputtering apparatus in general, a sputtered particle is less likely to reach a bottom portion of a small opening with a high aspect ratio. In addition, a sputtered particle, which flies in the oblique direction to the substrate, is deposited in the vicinity of upper part of an opening, which narrows the width of the upper part of the opening. In that case, the sputtered particle is not formed in the opening.

In contrast, with use of the sputtering apparatus with the above structure, released sputtered particles that fly in the oblique direction to the formation surface of the substrate 160 are attached to the collimator 150. That is, sputtered particles having a perpendicular component to the substrate 160, which have passed through the collimator 150 provided between the target 100 and the substrate 160, reach the substrate. Thus, sputtered particles are deposited on a plane parallel to the substrate. On the other hand, sputtered particles are not deposited on a plane perpendicular to the substrate, or the amount of deposition thereof on the plane perpendicular to the substrate is smaller than that on the plane parallel to the substrate. Therefore, with use of the sputtering apparatus with the above structure, the insulator 406c can be formed on planes without planes perpendicular to the substrate as illustrated in FIGS. 19C and 19D.

The perpendicular distance between the target 100 and the collimator 150 and that between the substrate 160 and the collimator 150 may be appropriately changed in accordance with quality of a film which is formed. Thus, the collimator 150 may include a movable portion 151 and a movable portion 152 as illustrated in FIG. 22. By including the movable portion 151, whether the collimator 150 is used or not can be easily selected. By including the movable portion 152, the perpendicular distance between the collimator 150 and the substrate 160 and that between the collimator 150 and the target 100 can be easily adjusted.

Alternatively, a long throw sputtering method can also be used. In the long throw sputtering method, the perpendicular distance between the target 100 and the substrate 160 is set large, whereby the incident direction of the sputtered particle can be approximately perpendicular to the substrate 160. Accordingly, the insulator 406c can be formed on planes without planes perpendicular to the substrate even when the collimator 150 is not used. Note that the perpendicular distance between the substrate 160 and the target 100 is greater than or equal to 150 mm and less than or equal to 500 mm. Note that a combination of the long throw sputtering method and the collimator 150 may be employed.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Figure 19E:
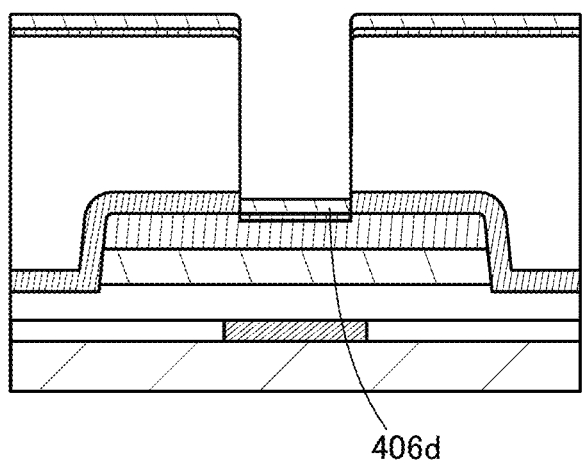
Figure 19F:
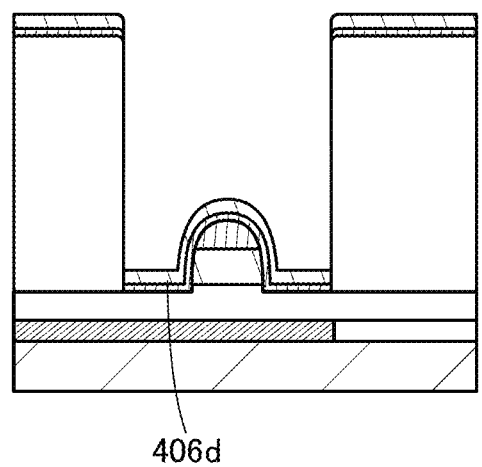

Next, as illustrated in FIGS. 19E and 19F, the insulator 406d is formed. The insulator 406d can be formed in the steps similar to those of the insulator 406c.

Figure 20A:
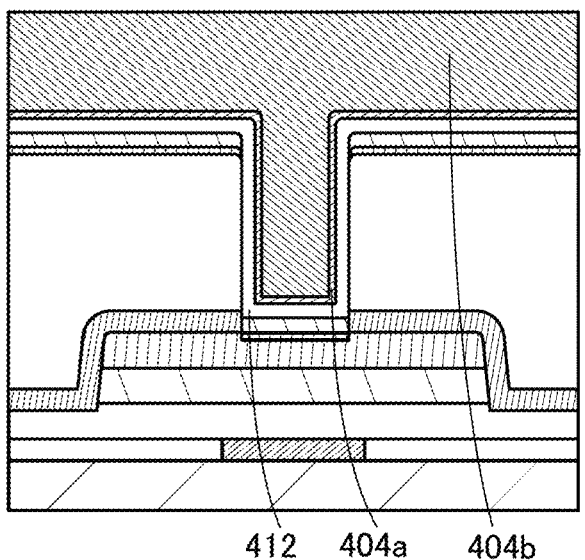
FIGS. 20A to 20F are cross-sectional views each illustrating part of a transistor of one embodiment of the present invention.
Figure 20B:
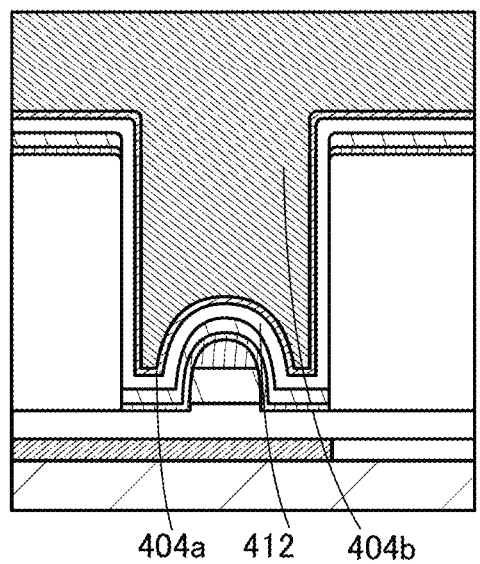

Next, as illustrated in FIGS. 20A and 20B, the insulator to be the insulator 412, the conductor to be the conductor 404a, and the conductor to be the conductor 404b are formed.

First, the insulator to be the insulator 412 is formed over the insulator 410 and the insulator 406d. The insulator to be the insulator 412 can be formed by a sputtering method, a CVD method, an MBE method, a PLD method, an ALD method, or the like.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Next, a conductor to be the conductor 404a and a conductor to be the conductor 404b are formed. The conductor to be the conductor 404a and the conductor to be the conductor 404b can be formed by a sputtering method, a CVD method, an MBE method, a PLD method, an ALD method, or the like. The conductor to be the conductor 404a and the conductor the conductor to be the conductor 404b are formed so as to fill the opening formed in the insulator 410 and the like. Therefore, the CVD method (the MCVD method, in particular) is preferred. A stacked-layer film of a conductor formed by an ALD method or the like and a conductor formed by a CVD method is preferred in some cases to increase adhesion of the conductor formed by an MCVD method. For example, a stacked-layer film where titanium nitride and tungsten are formed in this order may be used.

Figure 20C:
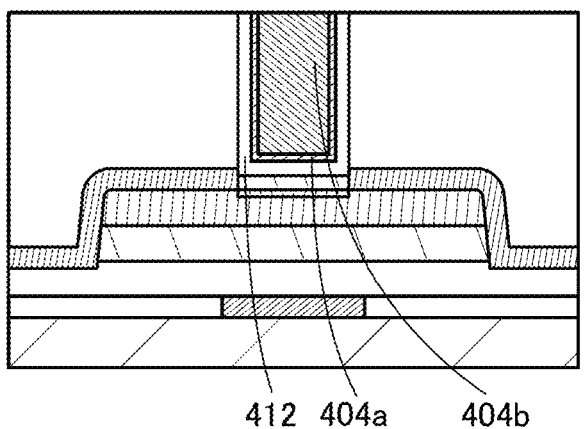
Figure 20D:
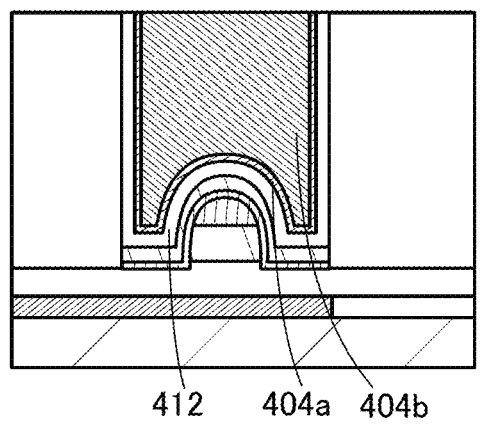

Next, as illustrated in FIGS. 20C and 20D, the conductor 404a, the conductor 404b, the insulator 412, the insulator 406c, and the insulator 406d are removed to expose the insulator 410 by CMP treatment or the like. Here, the insulator 410 can be used as a stopper layer and the thickness of the insulator 410 is reduced in some cases. Therefore, the insulator 410 is set to have a sufficient thickness so that the conductor 404a and the conductor 404b have sufficiently low resistance in a completed transistor, whereby a plurality of transistors with small variation in characteristics can be manufactured.

Note that the CMP treatment may be performed only once or plural times. When the CMP treatment is performed plural times, it is preferable that first polishing be performed at a high polishing rate and final polishing be performed at a low polishing rate. By performing polishing steps with different polishing rates in combination, the planarity of the polished surface can be further increased.

Next, the conductor to be the conductor 420 is formed. Note that the conductor 420 may have a stacked-layer structure. The conductor to be the conductor 420 can be formed by a sputtering method, a CVD method, an MBE method, a PLD method, an ALD method, or the like. Next, the conductor to be the conductor 420 is processed by a photolithography method or the like, so that the conductor 420 is formed.

Figure 20E:
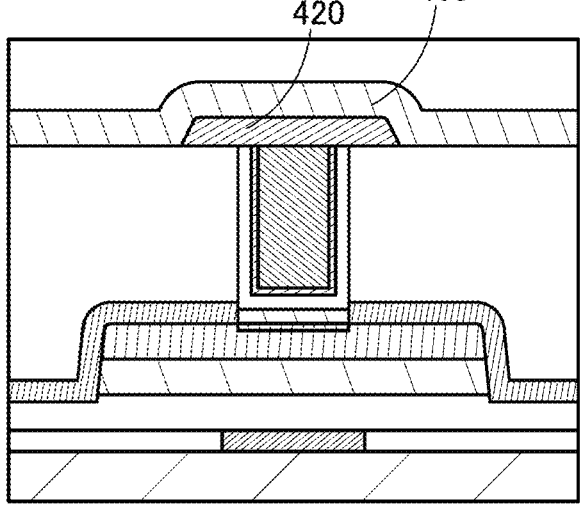
Figure 20F:
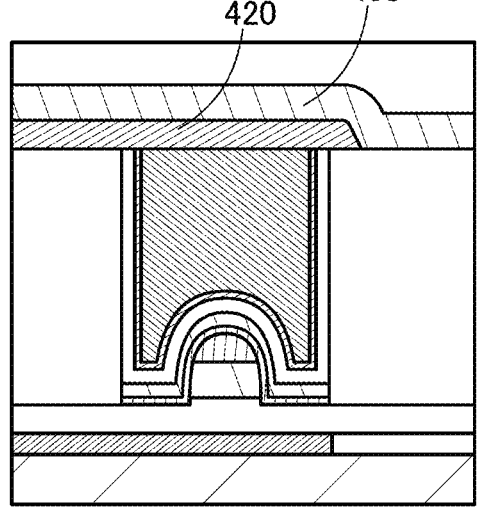

Next, as illustrated in FIGS. 20E and 20F, the insulator 408 is formed over the insulator 410 and the conductor 420. The insulator 408 can be formed by a sputtering method, a CVD method, an MBE method, a PLD method, an ALD method, or the like. Aluminum oxide is preferably formed as the insulator 408 using plasma containing oxygen, so that oxygen in the plasma can be added to the top surface of the insulator 410 as excess oxygen (exO). Excess oxygen can be added to the insulator 408 by supplying oxygen through the insulator 410. Here, the mixed region containing a large amount of excess oxygen might be formed in the interface between the insulator 408 and the insulator 410 and the vicinity of the interface.

Next, carbon, hydrogen, and the like may be released by performing the high-density-plasma treatment. In addition, in the case where the high-density-plasma treatment is performed in an oxygen atmosphere, organic compound such as hydrocarbon can be released from an object.

Furthermore, second heat treatment may be performed at any time after the formation of the insulator 408. By the second heat treatment, the excess oxygen contained in the insulator 410 and the mixed region 414 is moved to the semiconductor 406b through the insulator 412, the insulator 402, the insulator 406d, the insulator 406c, and the insulator 406a. Since excess oxygen is moved to the semiconductor 406b as described above, defects (oxygen vacancies) in the semiconductor 406b can be reduced.

Note that the second heat treatment may be performed at a temperature such that excess oxygen in the insulator 410 and the mixed region 414 is diffused to the semiconductor 406b. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen from the insulator 402 or the like can be inhibited. Note that the second heat treatment is not necessarily performed when heating during formation of the films can work as heat treatment comparable to the second heat treatment.

Although not illustrated, an opening reaching the conductor 416a and an opening reaching the conductor 416b may be formed in the insulator 408 and the insulator 410, and conductors serving as wirings may be formed in the openings. Alternatively, an opening reaching the conductor 404 may be formed in the insulator 408, and a conductor serving as a wiring may be formed in the opening.

Through the above steps, the transistor illustrated in FIGS. 10A to 10C can be manufactured.

In Embodiment 5, one embodiment of the present invention has been described. Note that one embodiment of the present invention is not limited to the above examples. That is, since various embodiments of the present invention are disclosed in this embodiment and other embodiments, one embodiment of the present invention is not limited to a specific embodiment. The example in which an oxide semiconductor is used as a semiconductor has been described as one embodiment of the present invention; however, one embodiment of the present invention is not limited thereto. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

The structure and method described in this embodiment can be implemented by being combined as appropriate with any of the other structures and methods described in the other embodiments.

Embodiment 6

Transistor Structure 8

Figure 12A:
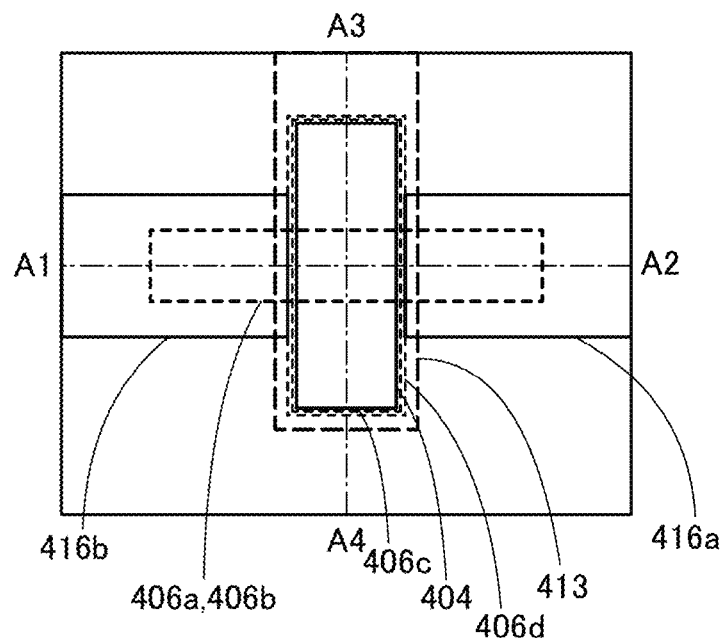
FIGS. 12A to 12C are a top view and cross-sectional views illustrating a transistor of one embodiment of the present invention.
Figure 12B:
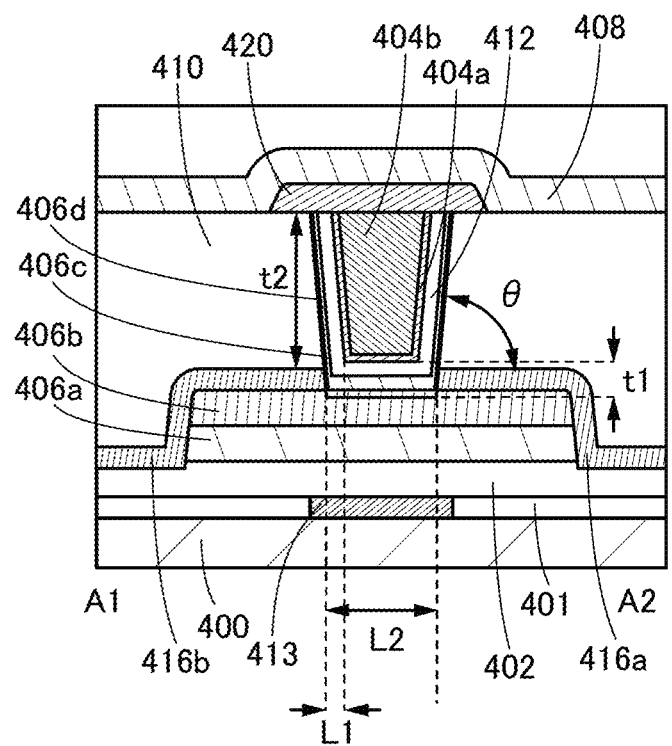
Figure 12C:
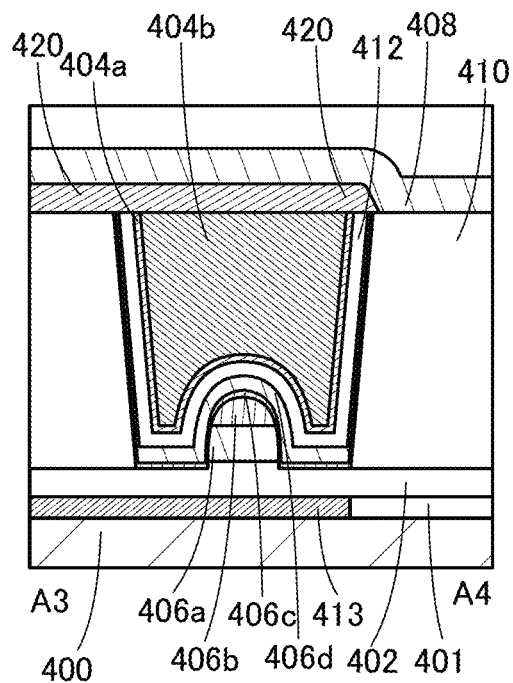
Figure 13A:
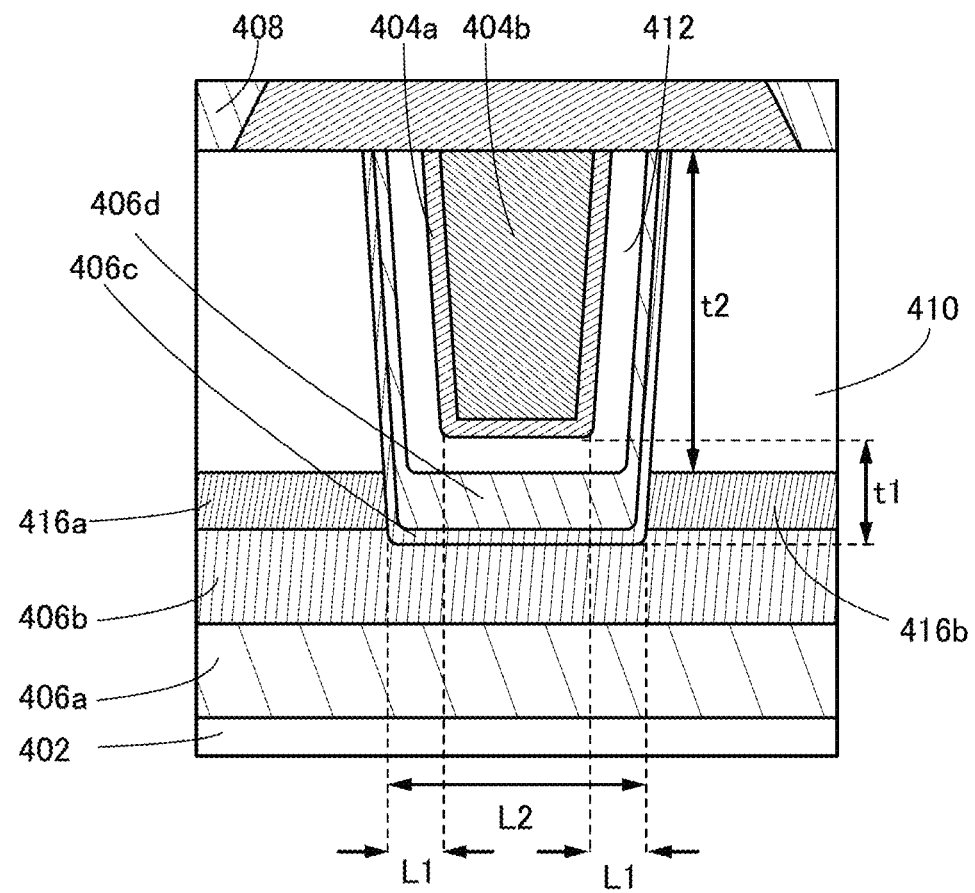
FIGS. 13A and 13B are cross-sectional views illustrating transistors of embodiments of the present invention.
Figure 13B:
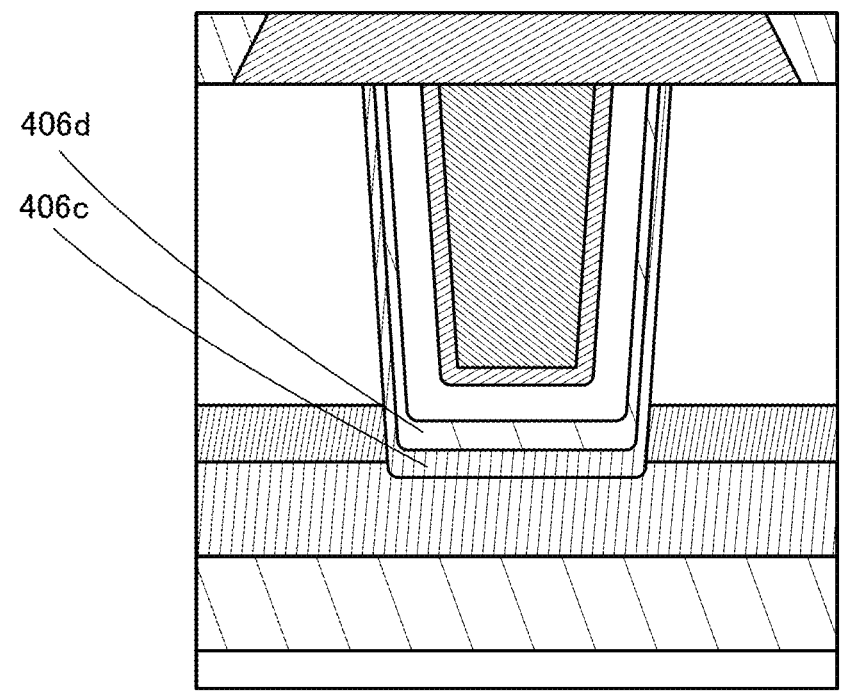

A transistor having a structure different from that in FIGS. 10A to 10C and a manufacturing method thereof will be described with reference to FIGS. 12A to 12C and FIGS. 13A and 13B. FIGS. 12A to 12C are a top view and cross-sectional views of a semiconductor device of one embodiment of the present invention. FIG. 12A is the top view, and FIGS. 12B and 12C are the cross-sectional views taken along dashed-dotted lines A1-A2 and A3-A4 in FIG. 12A, respectively. Note that for simplification of the drawing, some components are not illustrated in the top view in FIG. 12A. FIGS. 13A and 13B are enlarged views of cross-sectional views illustrated in FIGS. 12B and 12C.

In the transistor in FIG. 12B, the angle θ between the side surface of the insulator 410 and a top surface of the conductor 416a is greater than 0° and less than 90°, and the insulator 406d is formed on the side surface of the insulator 410 with the insulator 406c positioned therebetween. The angle θ is preferably greater than or equal to 75° C. and less than 90° C., preferably greater than or equal to 80° C. and less than 90° C., further preferably greater than or equal to 85° C. and less than 90° C. The insulator 406c and the insulator 406d are formed thinner in a region overlapping with the side surface of the conductor 404 with the insulator 412 interposed therebetween than in a region overlapping with the bottom surface of the conductor 404. For the other components, the description of the transistor in FIGS. 10A to 10C is referred to.

As long as t1 is greater than L1 and L1/t1 is less than 1, either one of the insulator 406c and the insulator 406d in a region covering the side surface of the insulator 410 may be formed thin. Furthermore, one of the insulator 406c and the insulator 406d in a region covering the side surface of the insulator 410 may be formed, and the other is not necessarily provided.

FIGS. 13A and 13B are each an enlarged view of an opening provided in the insulator 410 of the transistor in this embodiment. The top surface of the insulator 406d is approximately the same level as the top surfaces of the conductor 416a and the conductor 416b. Note that the top surface of the insulator 406d is a surface that is close to the conductor 404a in a region where the insulator 406d overlaps with the bottom surfaces of the conductor 404a and the conductor 404b. Ideally, the top surface of the insulator 406d is preferably the same level as the top surfaces of the conductors 416a and 416b as illustrated in FIG. 13A.

It is preferable that the top surface of the insulator 406c be approximately the same level as the interface between the semiconductor 406b and the conductors 416a and 416b. Note that the top surface of the insulator 406c is a surface that is close to the conductor 404a in a region where the insulator 406c overlaps with the bottom surfaces of the conductor 404a and the conductor 404b. Ideally, the top surface of the insulator 406c is preferably the same level as the interface between the semiconductor 406b and the conductors 416a and 416b. Note that the insulator 406c should at least fills in an over-etched portion of the semiconductor 406b; however, it is not limited thereto, the top surface of the insulator 406c may be above the interface between the semiconductor 406b and the conductors 416a and 416b as illustrated in FIG. 13B.

The transistor of this embodiment has a structure in which two insulators, the insulators 406c and 406d, are provided over the semiconductor 406b; however, it is not limited thereto, three or more stacked layers may also be provided.

<Method 8 for Manufacturing Transistor>

First, the steps up to the step illustrated in FIG. 18H described in Embodiment 5 are performed.

Next, the side surface of the insulator 410 is formed so that the angle θ between the side surface of the insulator 410 and the top surface of the conductor 416a is greater than 0° and less than 90°. Then, the insulator 406c and the insulator 406d are formed with use of the film formation apparatus described in Embodiment 5. Here, for example, the smaller the angle θ is, the higher the probability of deposition of sputtered particles becomes, in which case the insulator 406c and the insulator 406d are formed thick on the side surface of the insulator 410. The insulator 406c and the insulator 406d are formed thin on the side surface of the insulator 410 as the angle θ gets larger. In such a manner, the thicknesses of the insulator 406c and the insulator 406d formed on the side surface of the insulator 410 can be adjusted by the angle θ. That is, L1, which is the width of the offset region to be formed, can be reduced. Accordingly, t1 is greater than L1, and L1/t1 is less than 1.

The subsequent steps may be performed in a manner similar to the steps illustrated in the method 1 for manufacturing the transistor described in Embodiment 5.

Through the above steps, the transistor illustrated in FIGS. 12A to 12C can be manufactured.

The structure and method described in this embodiment can be implemented by being combined as appropriate with any of the other structures and methods described in the other embodiments.

Embodiment 7

Transistor Structures 9 and 10

Transistors having structures different from that in FIGS. 10A to 10C and a manufacturing method thereof will be described with reference to FIGS. 14A to 14C and FIGS. 15A to 15C. FIGS. 14A to 14C and FIGS. 15A to 15C are top views and cross-sectional views of semiconductor devices of one embodiment of the present invention.

Figure 14A:
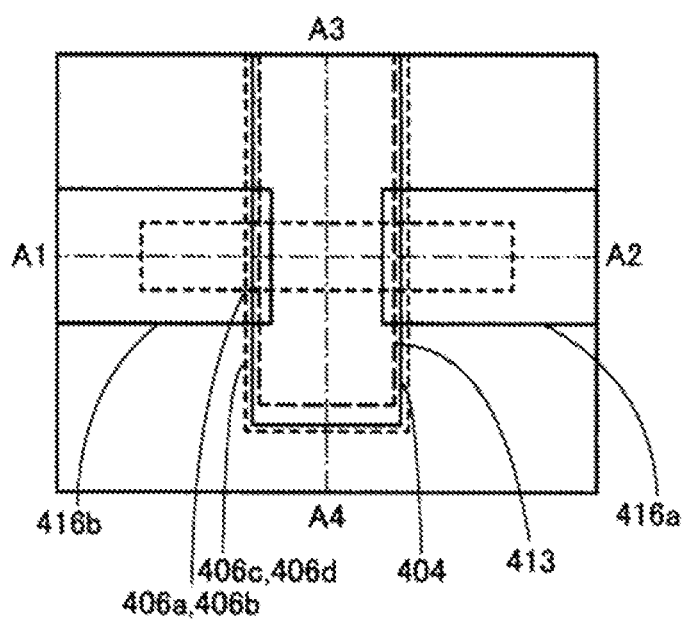
FIGS. 14A to 14C are a top view and cross-sectional views illustrating a transistor of one embodiment of the present invention.
Figure 14B:
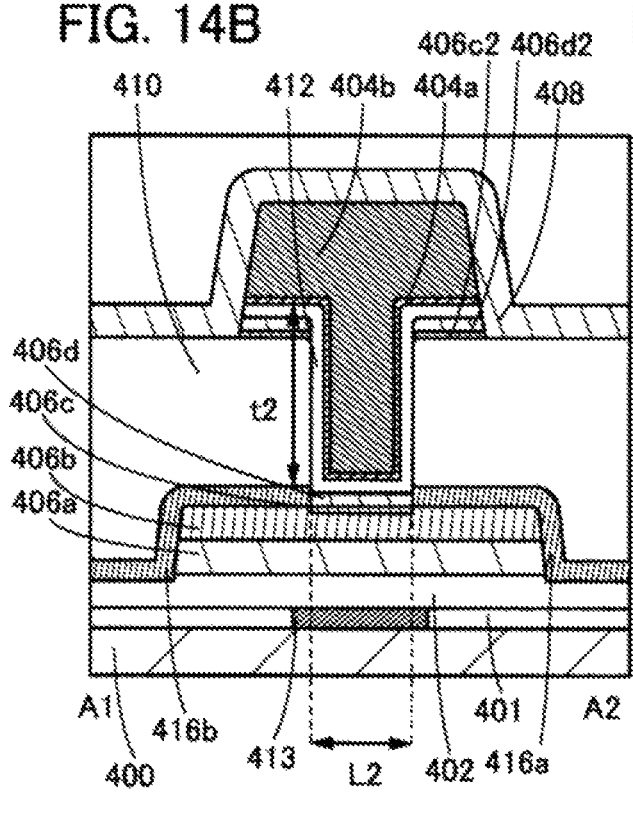
Figure 14C:
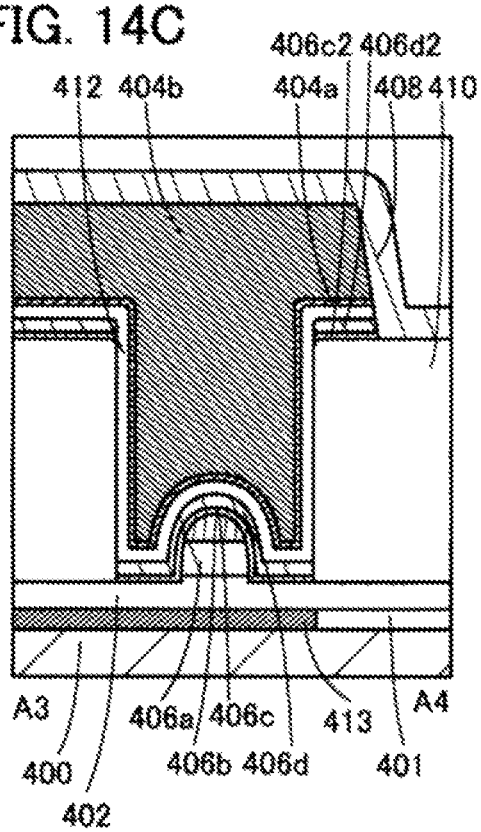
Figure 15A:
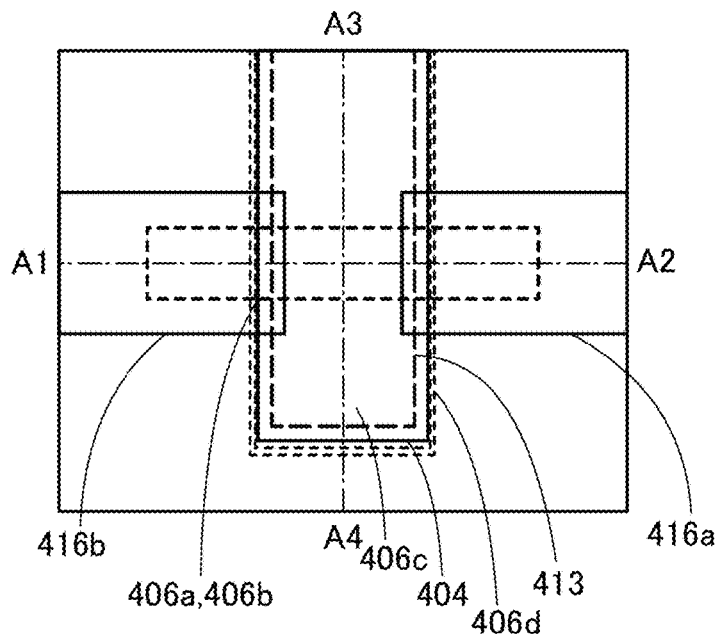
FIGS. 15A to 15C are a top view and a cross-sectional view which illustrate a transistor of one embodiment of the present invention.

The transistors illustrated in FIGS. 14A to 14C and FIGS. 15A to 15C are described. Note that FIGS. 14A and 15A are top views. FIG. 14B is a cross-sectional view taken along dashed-dotted line A1-A2 in FIG. 14A. FIG. 14C is a cross-sectional view taken along dashed-dotted line A3-A4 illustrated in FIG. 14A. Note that for simplification of the drawing, some components in the top view in FIG. 14A are not illustrated.

Figure 15B:
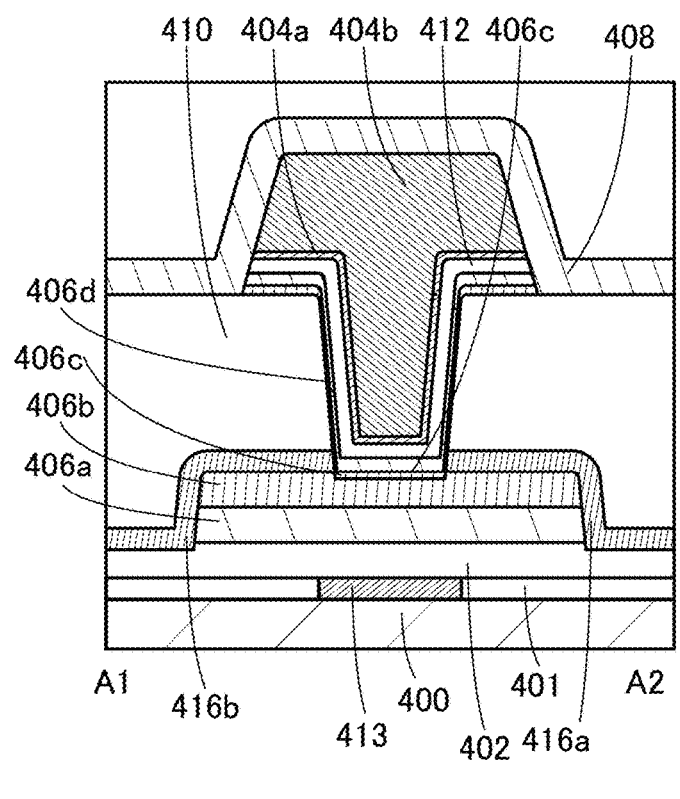
Figure 15C:
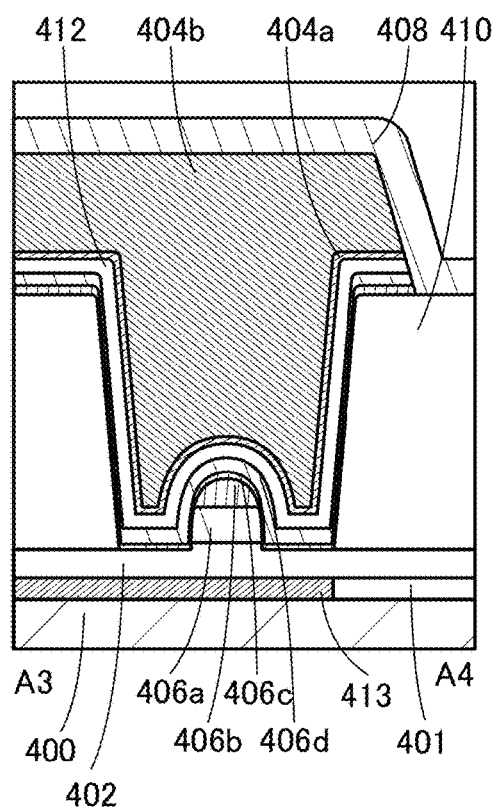

FIG. 15B is a cross-sectional view taken along dashed-dotted line A1-A2 illustrated in FIG. 15A. FIG. 15C is a cross-sectional view taken along dashed-dotted line A3-A4 illustrated in FIG. 15A. Note that for simplification of the drawing, some components in the top view in FIG. 15A are not illustrated.

In transistors in FIGS. 14A to 14C and FIGS. 15A to 15C, the insulator 406c2 (the insulator 406c in FIGS. 15B and 15C), the insulator 406d2 (the insulator 406d in FIGS. 15B and 15C), the insulator 412, the conductor 404a, and the conductor 404b are also formed on part of regions of a top surface of the insulator 410. For the other components, the description of the transistor in FIGS. 10A to 10C or the transistor in FIGS. 12A to 12C is referred to.

In the transistors in FIGS. 14A to 14C and FIGS. 15A to 15C, part of the conductor 404a and the conductor 404b serving as a gate electrode may function as a wiring. That is, part of the conductors 404a and 404b which is formed over the insulator 410 with the insulator 406c2 (the insulator 406c in FIGS. 15B and 15C), the insulator 406d2 (the insulator 406d in FIGS. 15B and 15C), and the insulator 412 positioned therebetween correspond to the conductor 420 in the transistor structure 1. That is, in the structure, t2 is the perpendicular distance between the part of the conductor 404a which is over the insulator 410 and the conductor 416a or the conductor 416b. Note that since the insulator 406c2 (the insulator 406c in FIGS. 15B and 15C), the insulator 406d2 (the insulator 406d in FIGS. 15B and 15C), the insulator 412, the conductor 404a, and the conductor 404b are formed at the same time, the insulator 406c, the insulator 406d2 (the insulator 406d in FIGS. 15B and 15C), and the insulator 412 are positioned between the top surface of the insulator 410 and part of the conductor 404a which is formed over the insulator 410. Therefore, t2, the length of the summation of the thicknesses of the insulator 410, the insulator 406c2 (the insulator 406c in FIGS. 15B and 15C), and the insulator 406d2 (the insulator 406d in FIGS. 15B and 15C), can be sufficiently large, so that parasitic capacitance can be reduced.

<Methods 9 and 10 for Manufacturing Transistor>

A method for manufacturing the transistor illustrated in FIGS. 14A to 14C is described below.

First, the steps up to the step illustrated in FIG. 19F described in Embodiment 5 are performed.

Next, the insulator 406c, the insulator 406d, the insulator 412, the conductor 404a, and the conductor 404b are formed by a photolithography method or the like. With this structure, a conductor corresponding to the conductor 420 in the transistor structure 1 can be formed at the same time using the conductor 404a and the conductor 404b.

Next, the insulator 408 is formed.

Through the above steps, the transistor illustrated in FIGS. 14A to 14C can be manufactured.

In the transistor in FIGS. 15A to 15C, the insulator 406c, the insulator 406d, the insulator 412, the conductor 404a, and the conductor 404b each having a desired shape are formed in steps similar to those of the transistor illustrated in FIGS. 12A to 12C. Then, the insulator 406c, the insulator 406d, the insulator 412, the conductor 404a, and the conductor 404b are formed by a photolithography method. With this structure, a conductor corresponding to the conductor 420 in the transistor structure 1 can be formed using the conductor 404a and the conductor 404b.

Through the above steps, the transistor illustrated in FIGS. 15A to 15C can be manufactured.

The structure and method described in this embodiment can be implemented by being combined as appropriate with any of the other structures and methods described in the other embodiments.

Embodiment 8

Transistor Structures 11 and 12

Transistors having structures different from that in FIGS. 10A to 10C and a manufacturing method thereof will be described with reference to FIGS. 16A to 16C and FIGS. 17A to 17C. FIGS. 16A to 16C and FIGS. 17A to 17C are top views and cross-sectional views of semiconductor devices of one embodiment of the present invention.

Figure 16A:
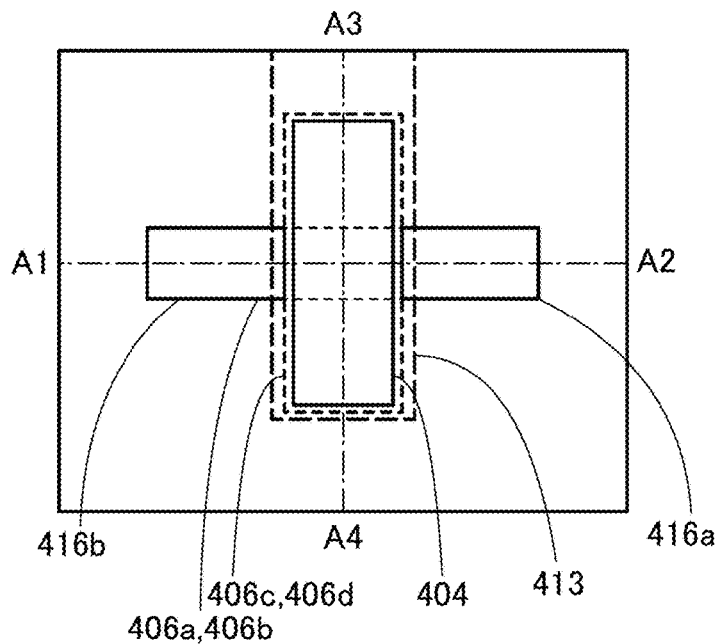
FIGS. 16A to 16C are a top view and cross-sectional views illustrating a transistor of one embodiment of the present invention.
Figure 16B:
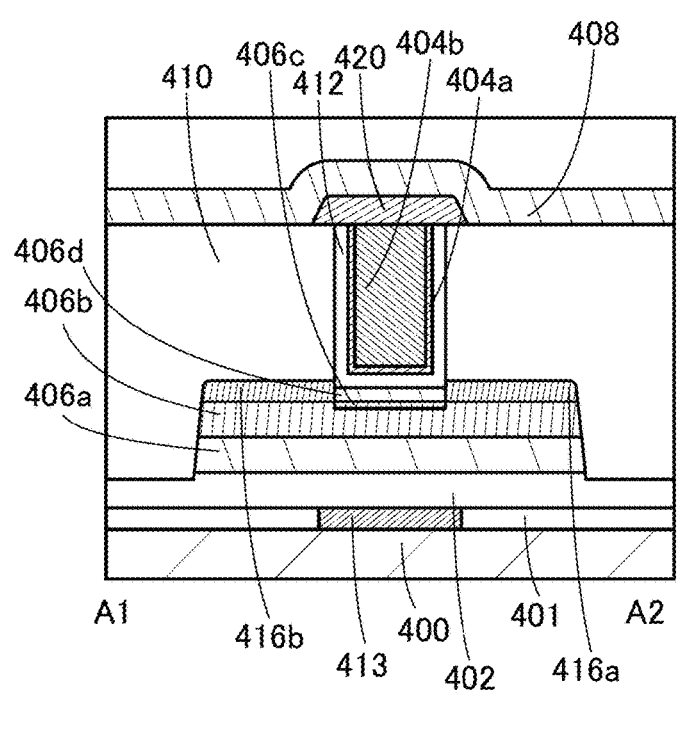
Figure 16C:
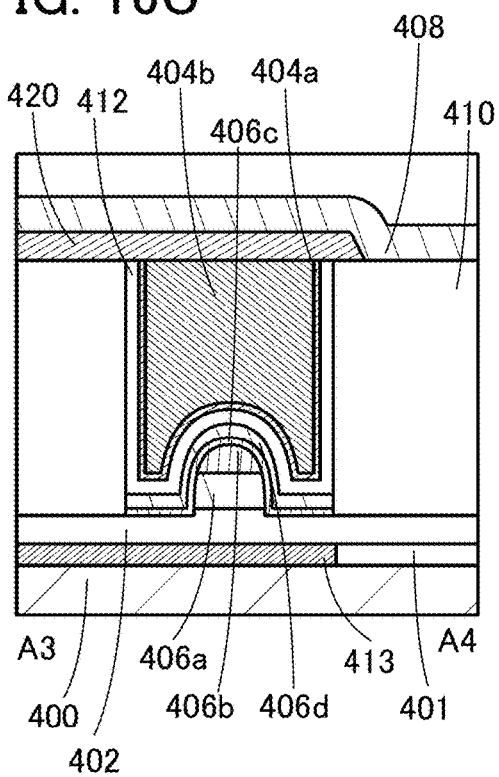
Figure 17A:
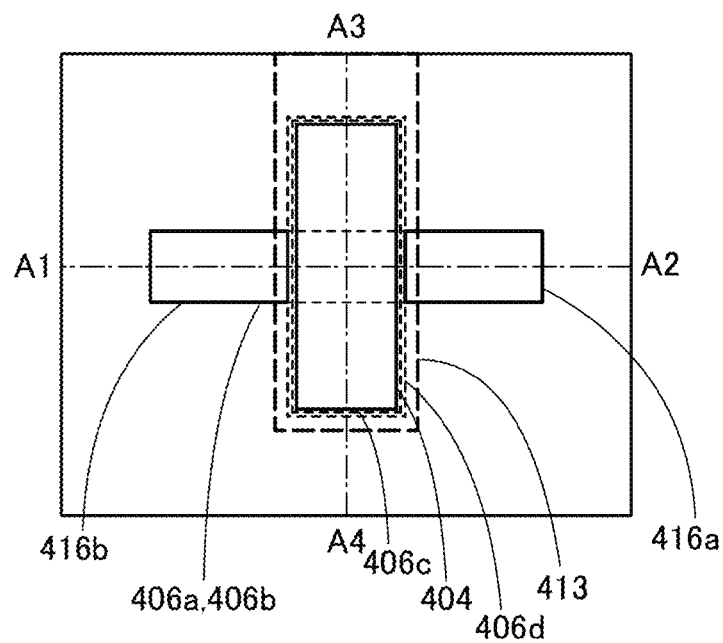
FIGS. 17A to 17C are a top view and cross-sectional views which illustrate a transistor of one embodiment of the present invention.

The transistors described in FIGS. 16A to 16C and FIGS. 17A to 17C are described. Note that FIGS. 16A and 17A are top views. FIG. 16B is a cross-sectional view taken along dashed-dotted line A1-A2 in FIG. 16A. FIG. 16C is a cross-sectional view taken along dashed-dotted line A3-A4 illustrated in FIG. 16A. Note that for simplification of the drawing, some components in the top view in FIG. 16A are not illustrated.

Figure 17B:
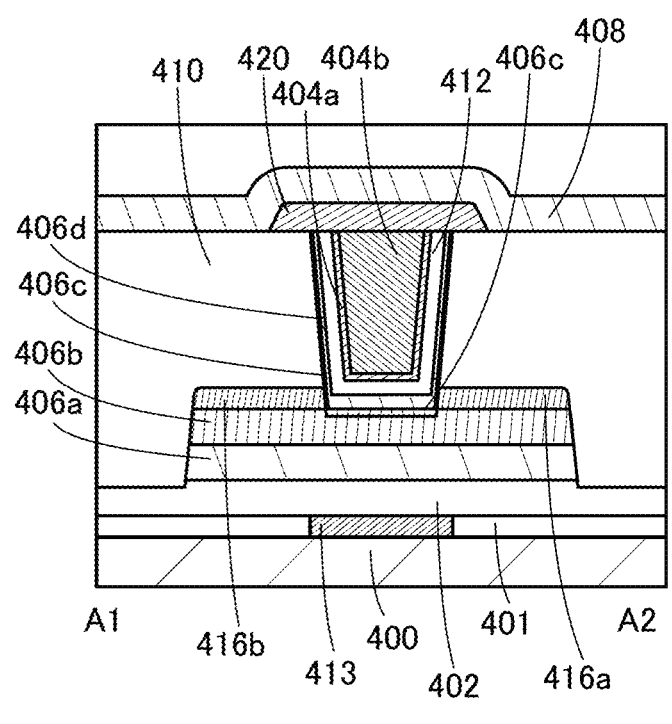
Figure 17C:
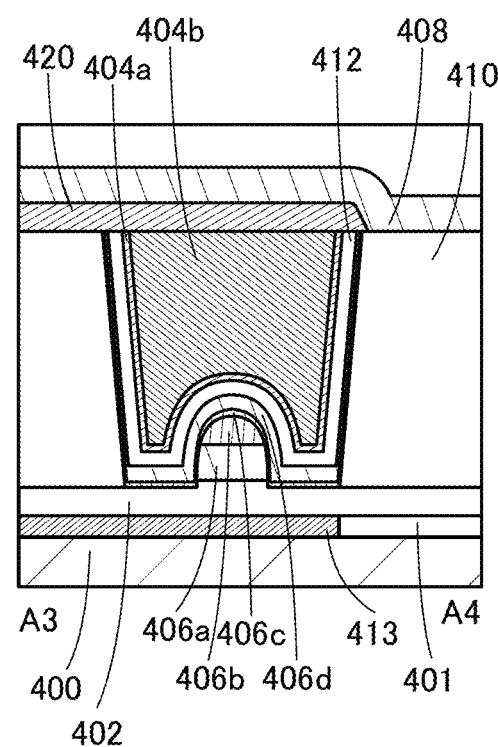

FIG. 17B is a cross-sectional view taken along dashed-dotted line A1-A2 illustrated in FIG. 17A. FIG. 17C is a cross-sectional view taken along dashed-dotted line A3-A4 illustrated in FIG. 17A. Note that for simplification of the drawing, some components are not illustrated in the top view in FIG. 17A.

In the transistors illustrated in FIGS. 16A to 16C and FIGS. 17A to 17C, the conductor 416a and the conductor 416b are formed only over the semiconductor 406b. For the other components, the description of the transistor in FIGS. 10A to 10C or the transistor in FIGS. 12A to 12C is referred to.

<Methods 11 and 12 for Manufacturing Transistor>

A method for manufacturing the transistor illustrated in FIGS. 16A to 16C is described below.

First, the steps up to the step illustrated in FIGS. 18A and 18B described in Embodiment 5 are performed.

Then, the conductor 416 is formed after the insulator 406a and the semiconductor 406b are formed. Then, a resist is formed over the conductor 416 by a photolithography method or the like, and first etching is performed on the conductor 416 using the resist as a mask. Then, after the resist is removed, a second etching is performed using the conductor 416 as a mask. The second etching is performed on the insulator 406a and the semiconductor 406b.

The following steps are similar to the steps after the step illustrated in FIGS. 18G and 18H. Through the above steps, the transistor illustrated in FIGS. 16A to 16C can be manufactured.

In the transistor illustrated in FIGS. 17A to 17C, the insulator 406a, the semiconductor 406b, and the conductor 416 are formed in a manner similar to that of the transistor illustrated in FIGS. 16A to 16C. Then, the transistor is preferably formed through the steps similar to those of the transistor illustrated in FIGS. 12A to 12C.

Through the above steps, the transistor illustrated in FIGS. 17A to 17C can be manufactured.

The structure and method described in this embodiment can be implemented by being combined as appropriate with any of the other structures and methods described in the other embodiments.

Embodiment 9

Deposition Apparatus

The structure of a deposition apparatus including the above sputtering apparatus will be described below. A structure of a deposition apparatus that hardly allows the entry of impurities into a film during deposition will be described with reference to FIG. 23 and FIGS. 24A to 24C.

Figure 23:
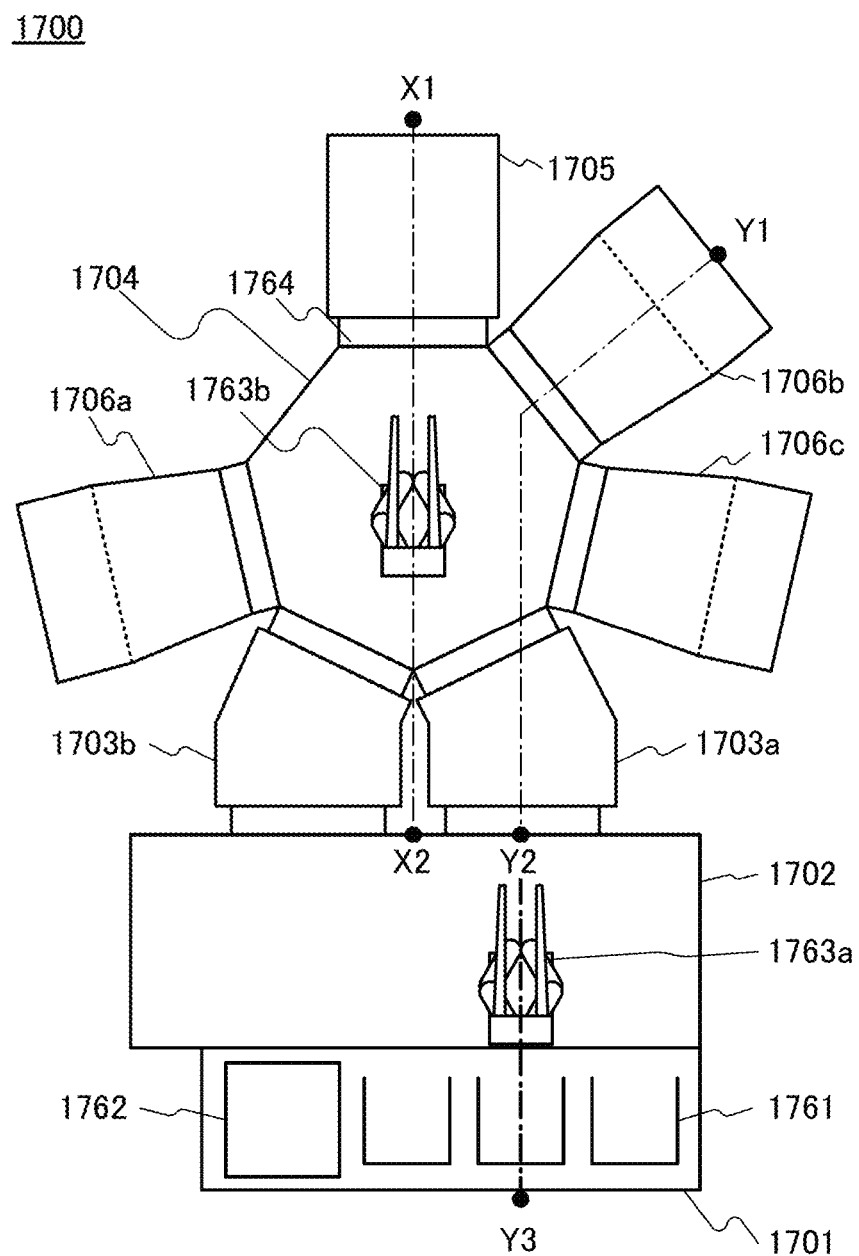
FIG. 23 is a top view illustrating an example of a deposition apparatus.

FIG. 23 is a top view schematically illustrating a single wafer multi-chamber deposition apparatus 1700. The deposition apparatus 1700 includes an atmosphere-side substrate supply chamber 1701 including a cassette port 1761 for holding a substrate and an alignment port 1762 for performing alignment of a substrate, an atmosphere-side substrate transfer chamber 1702 through which a substrate is transferred from the atmosphere-side substrate supply chamber 1701, a load lock chamber 1703a where a substrate is carried in and the pressure inside the chamber is switched from atmospheric pressure to reduced pressure or from reduced pressure to atmospheric pressure, an unload lock chamber 1703b where a substrate is carried out and the pressure inside the chamber is switched from reduced pressure to atmospheric pressure or from atmospheric pressure to reduced pressure, a transfer chamber 1704 through which a substrate is transferred in a vacuum, a substrate-heating chamber 1705 where a substrate is heated, and deposition chambers 1706a, 1706b, and 1706c. Note that the sputtering apparatus 101 can be used for all or part of the deposition chambers 1706a, 1706b, and 1706c.

Note that a plurality of cassette ports 1761 may be provided as illustrated in FIG. 23 (in FIG. 23, three cassette ports 1761 are provided).

The atmosphere-side substrate transfer chamber 1702 is connected to the load lock chamber 1703a and the unload lock chamber 1703b, the load lock chamber 1703a and the unload lock chamber 1703b are connected to the transfer chamber 1704, and the transfer chamber 1704 is connected to the substrate-heating chamber 1705 and the deposition chambers 1706a, 1706b, and 1706c.

Gate valves 1764 are provided for connecting portions between chambers so that the pressure in each chamber except the atmosphere-side substrate supply chamber 1701 and the atmosphere-side substrate transfer chamber 1702 can be independently controlled. Moreover, the atmosphere-side substrate transfer chamber 1702 includes a transfer robot 1763a and the transfer chamber 1704 includes a transfer robot 1763b. With the transfer robots, a substrate can be transferred.

It is preferable that the substrate-heating chamber 1705 also serve as a plasma treatment chamber. In the deposition apparatus 1700, it is possible to transfer a substrate without exposure to the air between treatment and treatment; therefore, adsorption of impurities in the air on a substrate can be suppressed. In addition, the order of deposition, heat treatment, or the like can be freely determined. Note that the structures of the transfer chambers, the deposition chambers, the load lock chambers, the unload lock chambers, and the substrate-heating chambers are not limited to the above, and the structures thereof can be set as appropriate depending on the space for placement or the process conditions.

Figure 24A:
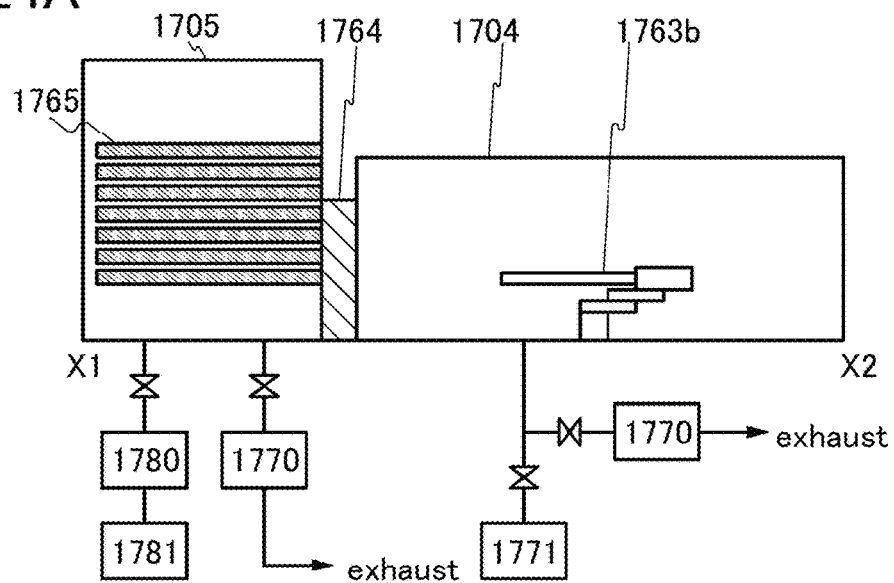
FIGS. 24A to 24C illustrate a structure example of a deposition apparatus.
Figure 24B:
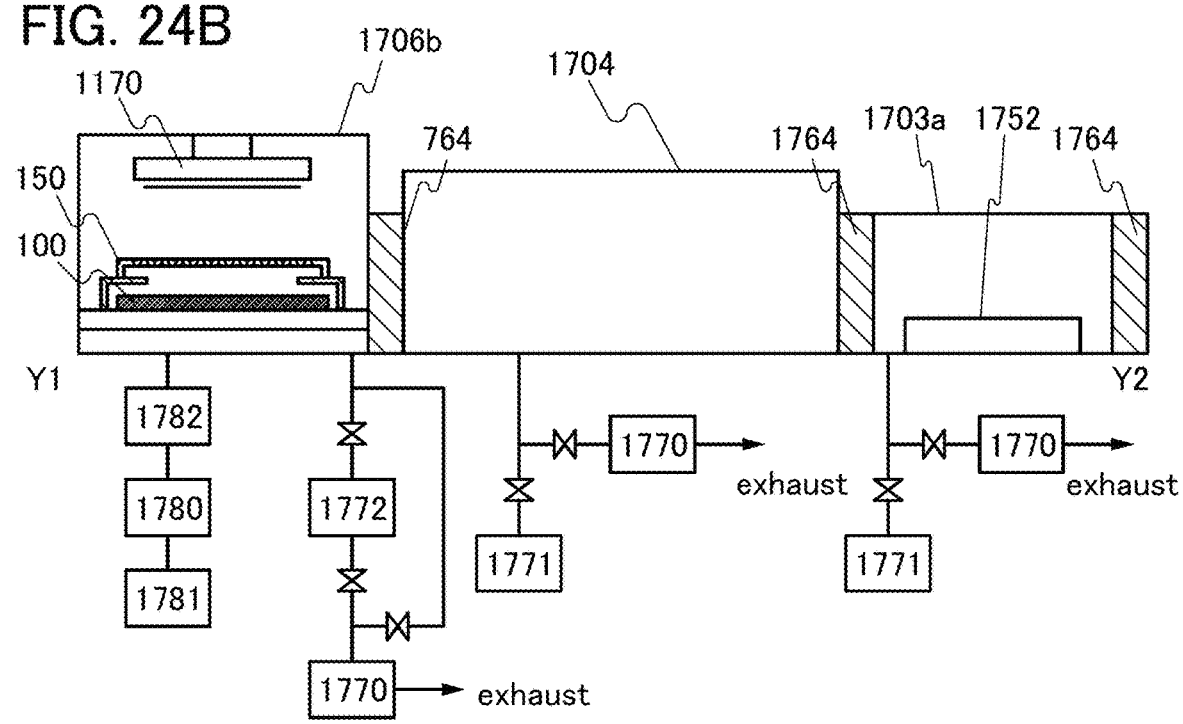
Figure 24C:
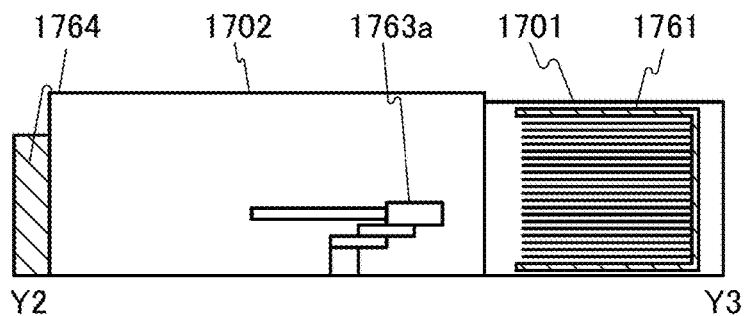

Next, FIG. 24A, FIG. 24B, and FIG. 24C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 1700 illustrated in FIG. 23.

FIG. 24A is a cross section of the substrate-heating chamber 1705 and the transfer chamber 1704, and the substrate-heating chamber 1705 includes a plurality of heating stages 1765 which can hold a substrate. Note that although the number of heating stages 1765 illustrated in FIG. 24A is seven, it is not limited thereto and may be greater than or equal to one and less than seven, or greater than or equal to eight. By increasing the number of the heating stages 1765, a plurality of substrates can be subjected to heat treatment at the same time, which leads to an increase in productivity. In addition, the substrate-heating chamber 1705 is connected to a vacuum pump 1770 through a valve. As the vacuum pump 1770, a dry pump and a mechanical booster pump can be used, for example.

As the substrate-heating chamber 1705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate-heating chamber 1705 is connected to a refiner 1781 through a mass flow controller 1780. Note that although the mass flow controller 1780 and the refiner 1781 can be provided for each of a plurality of kinds of gases, only one mass flow controller 1780 and one refiner 1781 are provided for easy understanding. As the gas introduced to the substrate-heating chamber 1705, a gas whose dew point is −80° C. or lower, preferably −100° C. or lower can be used; for example, an oxygen gas, a nitrogen gas, and a rare gas (e.g., an argon gas) are used.

The transfer chamber 1704 includes the transfer robot 1763*b*. The transfer robot 1763*b* includes a plurality of movable portions and an arm for holding a substrate and can transfer a substrate to each chamber. In addition, the transfer chamber 1704 is connected to the vacuum pump 1770 and a cryopump 1771 through valves. With such a structure, evacuation can be performed using the vacuum pump 1770 when the pressure inside the transfer chamber 1704 is in the range of atmospheric pressure to low or medium vacuum (about 0.1 Pa to several hundred Pa) and then, by switching the valves, evacuation can be performed using the cryopump 1771 when the pressure inside the transfer chamber 1704 is in the range of middle vacuum to high or ultra-high vacuum (0.1 Pa to $1 \times 10^{-7}$ Pa).

Alternatively, two or more cryopumps 1771 may be connected in parallel to the transfer chamber 1704. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 24B is a cross section of the deposition chamber 1706*b*, the transfer chamber 1704, and the load lock chamber 1703*a*.

Here, the details of each deposition chamber are described with reference to FIG. 24B. Note that the description on the sputtering apparatus 101 illustrated in FIG. 21 is referred to for the structure of each deposition chamber, and can be combined with the following description as appropriate. The deposition chamber 1706*b* illustrated in FIG. 24B includes the target 100, the substrate stage 170, and the collimator 150 provided between the target and the substrate stage. Note that here, a substrate is provided on the substrate stage 170. Although not illustrated, the substrate stage 170 may include a substrate holding mechanism which holds the substrate, a rear heater which heats the substrate from the back surface, or the like.

The deposition chamber 1706*b* is connected to a mass flow controller 1780 through a gas heating system 1782, and the gas heating system 1782 is connected to a refiner 1781 through the mass flow controller 1780. With the gas heating system 1782, a deposition gas can be heated to a temperature higher than or equal to 40° C. and lower than or equal to 400° C., preferably higher than or equal to 50° C. and lower than or equal to 200° C. Note that although the gas heating system 1782, the mass flow controller 1780, and the refiner 1781 can be provided for each of a plurality of kinds of gases, only one gas heating system 1782, one mass flow controller 1780, and one refiner 1781 are provided for easy understanding. As the deposition gas, a gas whose dew point is −80° C. or lower, preferably −100° C. or lower is preferably used.

Note that a parallel-plate-type sputtering apparatus or an ion beam sputtering apparatus may be provided in the deposition chamber 1706*b*.

In the case where the refiner is provided near a gas inlet, the length of a pipe between the refiner 1781 and the deposition chamber 1706*b* is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the deposition gas can be reduced as compared with a SUS316L-EP pipe, for example. In addition, a high-performance ultra-compact metal gasket joint (UPG joint) may be used as a joint of the pipe. A structure where all the materials of the pipe are metals is preferable because the effect of the generated released gas or the external leakage can be reduced as compared with a structure where resin or the like is used.

The deposition chamber 1706*b* is connected to a turbo molecular pump 1772 and a vacuum pump 1770 through valves. In addition, the deposition chamber 1706*b* preferably includes a cryotrap.

The cryotrap 1751 is a mechanism which can adsorb a molecule (or an atom) having a relatively high melting point, such as water. The turbo molecular pump 1772 is capable of stably evacuating a large-sized molecule (or atom), needs low frequency of maintenance, and thus enables high productivity, whereas it has a low capability in evacuating hydrogen and water. Hence, the cryotrap 1751 is connected to the deposition chamber 1706*b* so as to have a high capability in evacuating water or the like. The temperature of a refrigerator of the cryotrap 1751 is set to be lower than or equal to 100 K, preferably lower than or equal to 80 K. In the case where the cryotrap 1751 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

Note that the evacuation method of the deposition chamber 1706*b* is not limited to the above, and a structure similar to that in the evacuation method described in the transfer chamber 1704 (the evacuation method using the cryopump and the vacuum pump) may be employed. Needless to say, the evacuation method of the transfer chamber 1704 may have a structure similar to that of the deposition chamber 1706*b* (the evacuation method using the turbo molecular pump and the vacuum pump).

Note that in each of the transfer chamber 1704, the substrate-heating chamber 1705, and the deposition chamber 1706*b* which are described above, the back pressure (total pressure) and the partial pressure of each gas molecule (atom) are preferably set as follows. In particular, the back pressure and the partial pressure of each gas molecule (atom) in the deposition chamber 1706*b* need to be noted because impurities might enter a film to be formed.

In each of the above chambers, the back pressure (total pressure) is less than or equal to $1\times10^{-4}$ Pa, preferably less than or equal to $3\times10^{-5}$ Pa, more preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, more preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, more preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, more preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 1704, the substrate-heating chamber 1705, and the deposition chamber 1706*b*, which are described above, preferably have a small amount of external leakage or internal leakage.

For example, in each of the transfer chamber 1704, the substrate-heating chamber 1705, and the deposition chamber 1706*b* which are described above, the leakage rate is less than or equal to $3\times10^{-6}$ Pa·m$^3$/s, preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the deposition chamber 1706*b* can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 1700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 1700 may be covered with iron fluoride, aluminum oxide, chromium oxide, or the like.

The member of the deposition apparatus 1700 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the evacuation rate, it is important that the adsorbed substance present in the deposition chamber be desorbed as much as possible and evacuation be performed in advance with the use of a pump with high evacuation capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by evacuation, can be further increased. Note that when the inert gas is heated to substantially the same temperature as the baking temperature of the deposition chamber, the desorption rate of the adsorbed substance can be further increased. Here, a rare gas is preferably used as an inert gas. Depending on the kind of a film to be deposited, oxygen or the like may be used instead of an inert gas. For example, in the case of depositing an oxide, the use of oxygen which is the main component of the oxide is preferable in some cases.

Alternatively, treatment for evacuating the inside of the deposition chamber is preferably performed a certain period of time after heated oxygen, a heated inert gas such as a heated rare gas, or the like is used to increase a pressure in the deposition chamber. The heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film which will be deposited later can be reduced. Note that the dummy deposition may be performed at the same time as the baking of the deposition chamber.

Next, the details of the transfer chamber 1704 and the load lock chamber 1703a illustrated in FIG. 24B and the atmosphere-side substrate transfer chamber 1702 and the atmosphere-side substrate supply chamber 1701 illustrated in FIG. 24C are described. Note that FIG. 24C is a cross section of the atmosphere-side substrate transfer chamber 1702 and the atmosphere-side substrate supply chamber 1701.

For the transfer chamber 1704 illustrated in FIG. 24B, the description of the transfer chamber 1704 illustrated in FIG. 24A can be referred to.

The load lock chamber 1703a includes a substrate delivery stage 1752. When a pressure in the load lock chamber 1703a becomes atmospheric pressure by being increased from reduced pressure, the substrate delivery stage 1752 receives a substrate from the transfer robot 1763a provided in the atmosphere-side substrate transfer chamber 1702. After that, the load lock chamber 1703a is evacuated into vacuum so that the pressure therein becomes reduced pressure and then the transfer robot 1763b provided in the transfer chamber 1704 receives the substrate from the substrate delivery stage 1752.

Furthermore, the load lock chamber 1703a is connected to the vacuum pump 1770 and the cryopump 1771 through valves. For a method for connecting evacuation systems such as the vacuum pump 1770 and the cryopump 1771, the description of the method for connecting the transfer chamber 1704 can be referred to, and the description thereof is omitted here. Note that the unload lock chamber 1703b illustrated in FIG. 23 can have a structure similar to that in the load lock chamber 1703a.

The atmosphere-side substrate transfer chamber 1702 includes the transfer robot 1763a. The transfer robot 1763a can deliver a substrate from the cassette port 1761 to the load lock chamber 1703a or deliver a substrate from the load lock chamber 1703a to the cassette port 1761. Furthermore, a mechanism for suppressing entry of dust or a particle, such as high efficiency particulate air (HEPA) filter, may be provided above the atmosphere-side substrate transfer chamber 1702 and the atmosphere-side substrate supply chamber 1701.

The atmosphere-side substrate supply chamber 1701 includes a plurality of cassette ports 1761. The cassette port 1761 can hold a plurality of substrates.

The surface temperature of the target is set to be lower than or equal to 100° C., preferably lower than or equal to 50° C., more preferably about room temperature (typically, 25° C.). In a sputtering apparatus for a large substrate, a large target is often used. However, it is difficult to form a target for a large substrate without a juncture. In fact, a plurality of targets is arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target contains zinc, plasma damage is alleviated by the deposition in an oxygen gas atmosphere; thus, an oxide semiconductor in which zinc is unlikely to be volatilized can be obtained.

With the above deposition apparatus, entry of impurities into the film to be formed can be suppressed.

Embodiment 10

Manufacturing Apparatus

A manufacturing apparatus which performs high-density plasma treatment according to one embodiment of the present invention will be described below.

Figure 26:
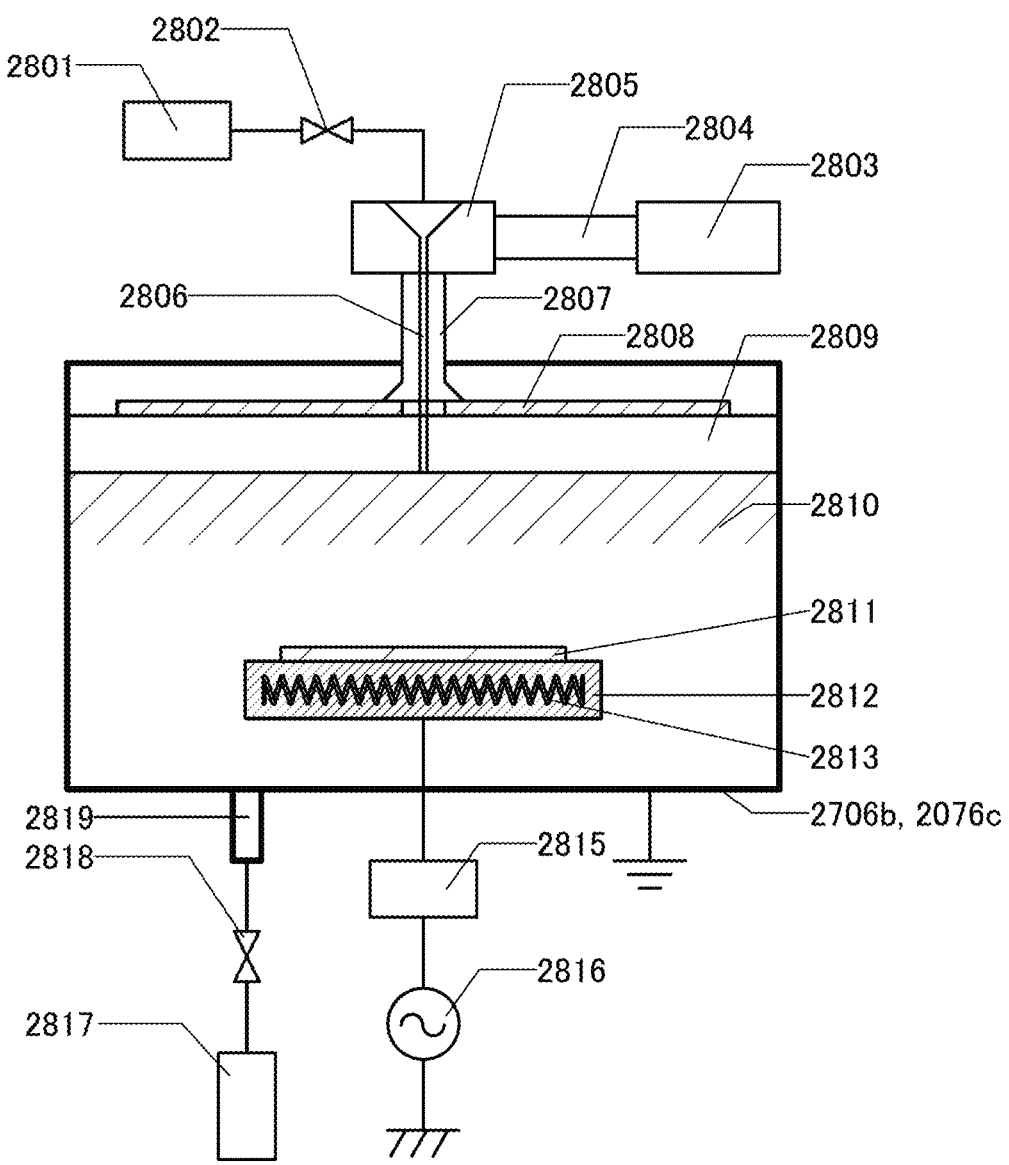
FIG. 26 is a top view illustrating a chamber of one embodiment of the present invention.
Figure 27:
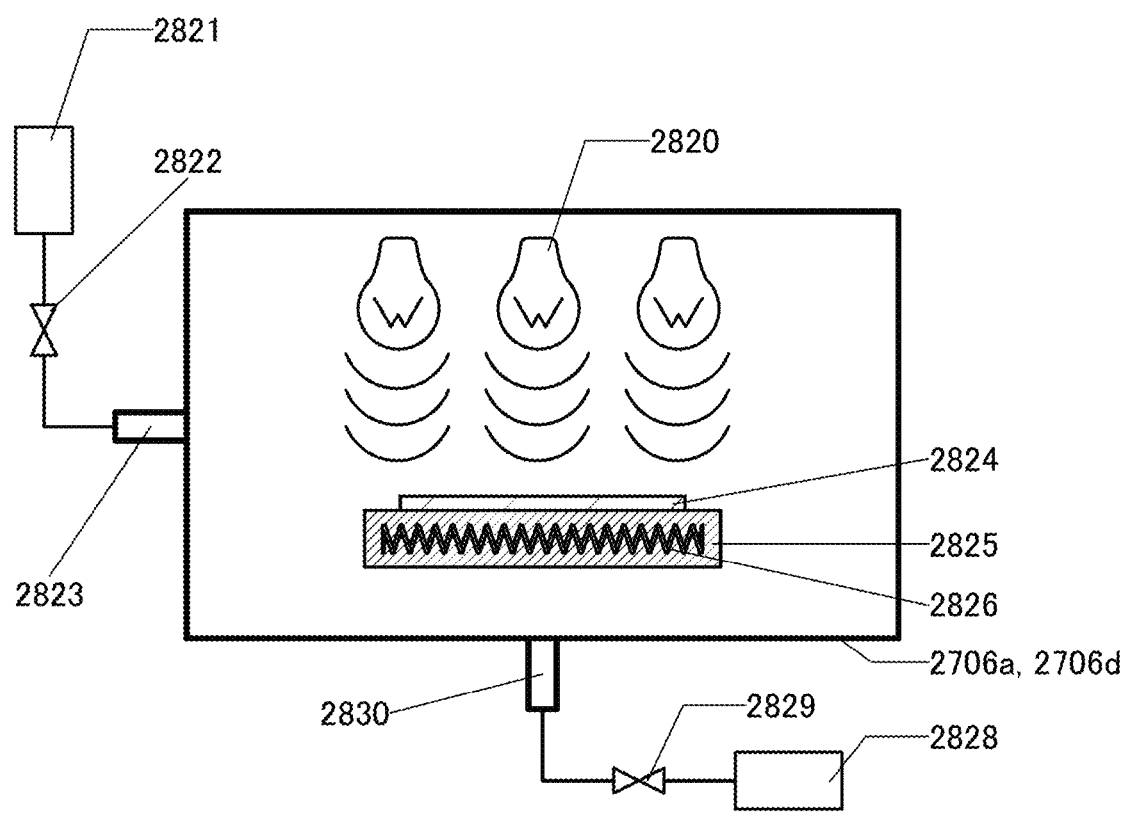
FIG. 27 is a top view illustrating a chamber of one embodiment of the present invention.

First, a structure of a manufacturing apparatus which hardly allows entry of impurities in manufacturing a semiconductor device or the like is described with reference to FIG. 25, FIG. 26, and FIG. 27.

Figure 25:
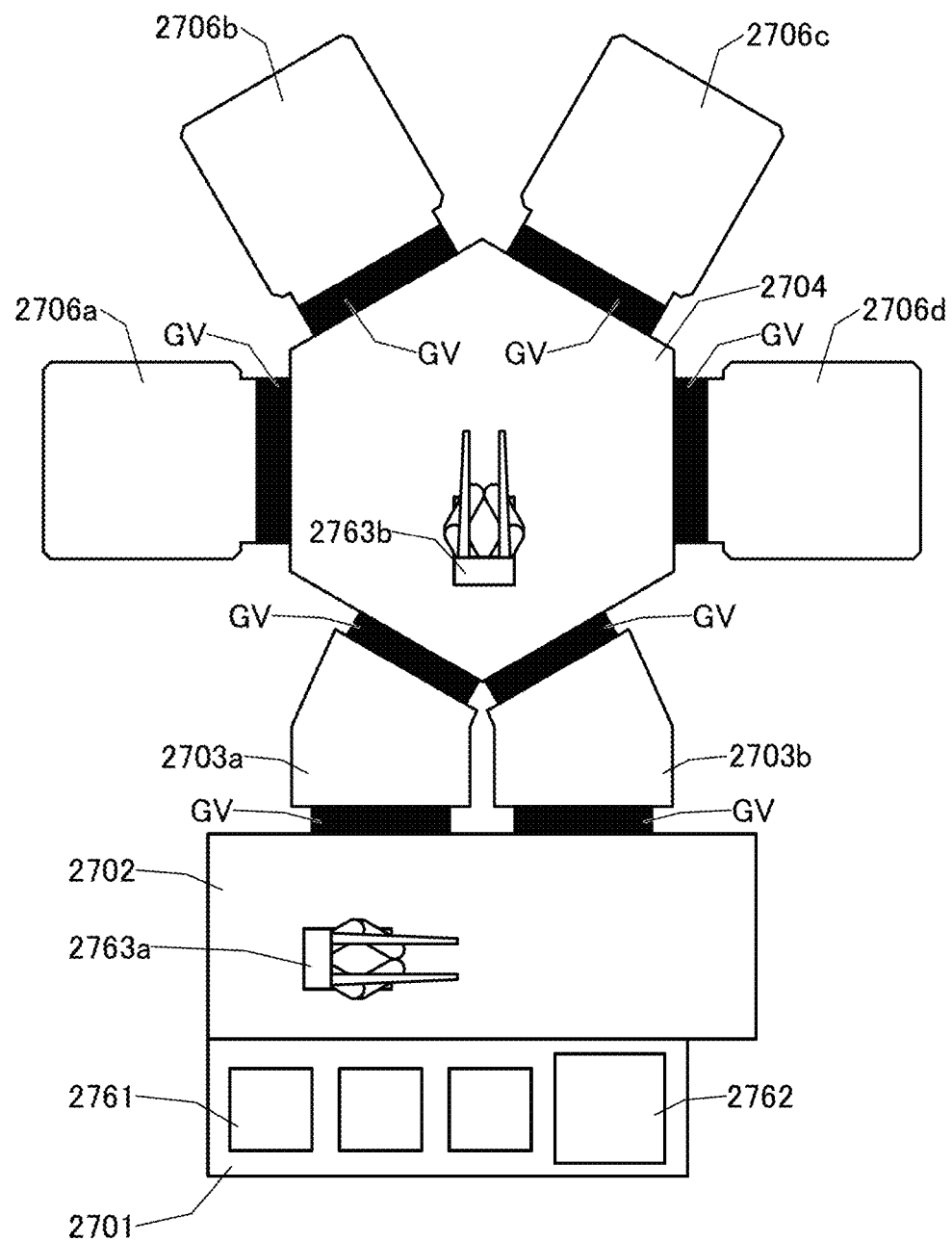
FIG. 25 is a top view illustrating a manufacturing apparatus of one embodiment of the present invention.

FIG. 25 is a top view schematically illustrating a single wafer multi-chamber manufacturing apparatus 2700. The manufacturing apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, and chambers 2706a, 2706b, 2706c, and 2706d.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chambers 2706a, 2706b, 2706c, and 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. In addition, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

In the transfer chamber 2704 and each of the chambers 2706a to 2706d, the back pressure (total pressure) is, for example, lower than or equal to $1 \times 10^{-4}$ Pa, preferably lower than or equal to $3 \times 10^{-5}$ Pa, further preferably lower than or equal to $1 \times 10^{-5}$ Pa. In the transfer chamber 2704 and each of the chambers 2706a to 2706d, the partial pressure of a gas molecule (atom) having a mass-to-charge ratio (m/z) of 18 is, for example, lower than or equal to $3 \times 10^{-5}$ Pa, preferably lower than or equal to $1 \times 10^{-5}$ Pa, further preferably lower than or equal to $3 \times 10^{-6}$ Pa. Moreover, in the transfer chamber 2704 and each of the chambers 2706a to 2706d, the partial pressure of a gas molecule (atom) having a mass-to-charge ratio (m/z) of 28 is, for example, lower than or equal to $3 \times 10^{-5}$ Pa, preferably lower than or equal to $1 \times 10^{-5}$ Pa, further preferably lower than or equal to $3 \times 10^{-6}$ Pa. Further, in the transfer chamber 2704 and each of the chambers 2706a to 2706d, the partial pressure of a gas molecule (atom) having a mass-to-charge ratio (m/z) of 44 is, for example, lower than or equal to $3 \times 10^{-5}$ Pa, preferably lower than or equal to $1 \times 10^{-5}$ Pa, further preferably lower than or equal to $3 \times 10'$ Pa.

Note that the total pressure and the partial pressure in the transfer chamber 2704 and each of the chambers 2706a to 2706d can be measured using a mass analyzer. For example, Qulee CGM-051, a quadrupole mass analyzer (also referred to as Q-mass) manufactured by ULVAC, Inc. can be used.

Moreover, the transfer chamber 2704 and each of the chambers 2706a to 2706d preferably have a small amount of external leakage or internal leakage. For example, in the transfer chamber 2704 and each of the chambers 2706a to 2706d, the leakage rate is less than or equal to $3 \times 10^{-6}$ Pa·m$^3$/s, preferably less than or equal to $1 \times 10^{-6}$ Pa·m$^3$/s. For example, the leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. For example, the leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. For example, the leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above-mentioned value.

For example, open/close portions of the transfer chamber 2704 and the chambers 2706a to 2706d can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the manufacturing apparatus 2700, aluminum, chromium, titanium, zirconium, nickel, or vanadium, which releases a small amount of gas containing impurities, is used. Alternatively, an alloy containing iron, chromium, nickel, or the like covered with the above material may be used. The alloy containing iron, chromium, nickel, or the like is rigid, resistant to heat, and suitable for processing. Here, when surface unevenness of the member is decreased by polishing or the like to reduce the surface area, the release of gas can be reduced.

Alternatively, the above member of the manufacturing apparatus 2700 may be covered with iron fluoride, aluminum oxide, chromium oxide, or the like.

The member of the manufacturing apparatus 2700 is preferably formed using only metal when possible. For example, in the case where a viewing window formed of quartz or the like is provided, it is preferable that the surface of the viewing window be thinly covered with iron fluoride, aluminum oxide, chromium oxide, or the like so as to suppress release of gas.

When an adsorbed substance is present in the transfer chamber 2704 and each of the chambers 2706a to 2706d, although the adsorbed substance does not affect the pressure in the transfer chamber 2704 and each of the chambers 2706a to 2706d because it is adsorbed onto an inner wall or the like, the adsorbed substance causes a release of gas when the inside of the transfer chamber 2704 and each of the chambers 2706a to 2706d is evacuated. Therefore, although there is no correlation between the leakage rate and the exhaust rate, it is important that the adsorbed substance present in the transfer chamber 2704 and each of the chambers 2706a to 2706d be desorbed as much as possible and exhaust be performed in advance with the use of a pump with high exhaust capability. Note that the transfer chamber 2704 and each of the chambers 2706a to 2706d may be subjected to baking to promote desorption of the adsorbed substance. By the baking, the desorption rate of the adsorbed substance can be increased about tenfold. The baking can be performed at a temperature of higher than or equal to 100° C. and lower than or equal to 450° C. At this time, when the adsorbed substance is removed while an inert gas is introduced into the transfer chamber 2704 and each of the chambers 2706a to 2706d, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as the inert gas.

Alternatively, treatment for evacuating the inside of the transfer chamber 2704 and each of the chambers 2706a to 2706d is preferably performed a certain period of time after heated oxygen, a heated inert gas such as a heated rare gas, or the like is introduced to increase the pressure in the transfer chamber 2704 and each of the chambers 2706a to 2706d. The introduction of the heated gas can desorb the adsorbed substance in the transfer chamber 2704 and each of the chambers 2706a to 2706d, and the impurities present in the transfer chamber 2704 and each of the chambers 2706a to 2706d can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the transfer chamber 2704 and each of the chambers 2706a to 2706d, so that the pressure therein can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the inside of the transfer chamber 2704 and each of the chambers 2706a to 2706d is evacuated in the time range of 5 minutes to 300 minutes, preferably 10 minutes to 120 minutes.

Next, the chambers 2706b and 2706c are described with reference to a schematic cross-sectional view of FIG. 26.

The chambers 2706b and 2706c are chambers capable of performing high-density plasma treatment on an object, for example. Because the chambers 2706b and 2706c have a common structure with the exception of the atmosphere used in the high-density plasma treatment, they are collectively described below.

The chambers 2706b and 2706c each include a slot antenna plate 2808, a dielectric plate 2809, a substrate stage 2812, and an exhaust port 2819. A gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chambers 2706b and 2706c.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Further, the gas supply source 2801 is connected to the mode converter 2805 through the valve 2802. Gas is transferred to the chambers 2706b and 2706c through the gas pipe 2806 which runs through the mode converter 2805, the waveguide 2807, and the dielectric plate 2809. The vacuum pump 2817 has a function of exhausting gas or the like from the chambers 2706b and 2706c through the valve 2818 and the exhaust port 2819. The high-frequency power source 2816 is connected to the substrate stage 2812 through the matching box 2815.

The substrate stage 2812 has a function of holding a substrate 2811. For example, the substrate stage 2812 has a function of holding the substrate 2811 by static electricity or mechanical strength. In addition, the substrate stage 2812 has a function of an electrode to which electric power is supplied from the high-frequency power source 2816. The substrate stage 2812 includes a heating mechanism 2813 therein and thus has a function of heating the substrate 2811.

As the vacuum pump 2817, a dry pump, a mechanical booster pump, an ion pump, a titanium sublimation pump, a cryopump, a turbomolecular pump, or the like can be used, for example. In addition to the vacuum pump 2817, a cryotrap may be used as well. The combinational use of the cryopump and the cryotrap allows water to be efficiently exhausted and is particularly preferable.

For example, the heating mechanism 2813 may be a heating mechanism which uses a resistance heater or the like for heating. Alternatively, a heating mechanism which utilizes heat conduction or heat radiation from a medium such as a heated gas for heating may be used. For example, RTA such as GRTA or LRTA can be used. In GRTA, heat treatment is performed using a high-temperature gas. An inert gas is used as the gas.

The gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (e.g., an argon gas) may be used.

As the dielectric plate 2809, silicon oxide (quartz), aluminum oxide (alumina), yttrium oxide (yttria), or the like may be used, for example. A protective layer may be further formed on a surface of the dielectric plate 2809. As the protective layer, magnesium oxide, titanium oxide, chromium oxide, zirconium oxide, hafnium oxide, tantalum oxide, silicon oxide, aluminum oxide, yttrium oxide, or the like may be used. The dielectric plate 2809 is exposed to an especially high density region of high-density plasma 2810 that is to be described later. Therefore, the protective layer can reduce the damage and consequently prevent an increase of particles or the like during the treatment.

The high-frequency generator 2803 has a function of generating a microwave with a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave propagates through the slot holes and the dielectric plate 2809. Then, an electric field is generated below the dielectric plate 2809, and the high-density plasma 2810 can be generated. The high-density plasma 2810 includes ions and radicals depending on the gas species supplied from the gas supply source 2801. For example, oxygen radicals, nitrogen radicals, or the like are included.

At this time, the quality of a film or the like over the substrate 2811 can be modified by the ions and radicals generated in the high-density plasma 2810. Note that it is preferable in some cases to apply a bias to the substrate 2811 using the high-frequency power source 2816. As the high-frequency power source 2816, a radio frequency (RF) power source with a frequency of 13.56 MHz, 27.12 MHz, or the like may be used, for example. The application of a bias to the substrate allows ions in the high-density plasma 2810 to efficiently reach a deep portion of an opening of the film or the like over the substrate 2811.

For example, in the chamber 2706b, oxygen radical treatment using the high-density plasma 2810 can be performed by introducing oxygen from the gas supply source 2801. In the chamber 2706c, nitrogen radical treatment using the high-density plasma 2810 can be performed by introducing nitrogen from the gas supply source 2801.

Next, the chambers 2706a and 2706d are described with reference to a schematic cross-sectional view of FIG. 27.

The chambers 2706a and 2706d are chambers capable of irradiating an object with an electromagnetic wave, for example. Because the chambers 2706a and 2706d have a common structure with the exception of the kind of the electromagnetic wave, they are collectively described below.

The chambers 2706a and 2706d each include one or more lamps 2820, a substrate stage 2825, a gas inlet 2823, and an exhaust port 2830. A gas supply source 2821, a valve 2822, a vacuum pump 2828, and a valve 2829 are provided outside the chambers 2706a and 2706d.

The gas supply source 2821 is connected to the gas inlet 2823 through the valve 2822. The vacuum pump 2828 is connected to the exhaust port 2830 through the valve 2829.

The lamp 2820 is provided to face the substrate stage 2825. The substrate stage 2825 has a function of holding a substrate 2824. The substrate stage 2825 includes a heating mechanism 2826 therein and thus has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp may be used, for example.

For example, part of or the whole electromagnetic wave emitted from the lamp 2820 is absorbed by the substrate 2824, so that the quality of a film or the like over the substrate 2824 can be modified. For example, defects can be generated or reduced or impurities can be removed. When the lamp 2820 radiates the electromagnetic wave while the substrate 2824 is heated, generation or reduction of defects or removal of impurities can be efficiently performed.

Alternatively, for example, the electromagnetic wave emitted from the lamp 2820 may cause heat generation in the substrate stage 2825, by which the substrate 2824 may be heated. In this case, the heating mechanism 2826 inside the substrate stage 2825 may be omitted.

For the vacuum pump 2828, the description of the vacuum pump 2817 is referred to. For the heating mechanism 2826, the description of the heating mechanism 2813 is referred to. For the gas supply source 2821, the description of the gas supply source 2801 is referred to.

With the above-described manufacturing apparatus, the quality of a film can be modified while the entry of impurities into an object suppressed.

The structure and method described in this embodiment can be implemented by being combined as appropriate with any of the other structures and methods described in the other embodiments.

Embodiment 11

Structure of Oxide Semiconductor

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 28A:
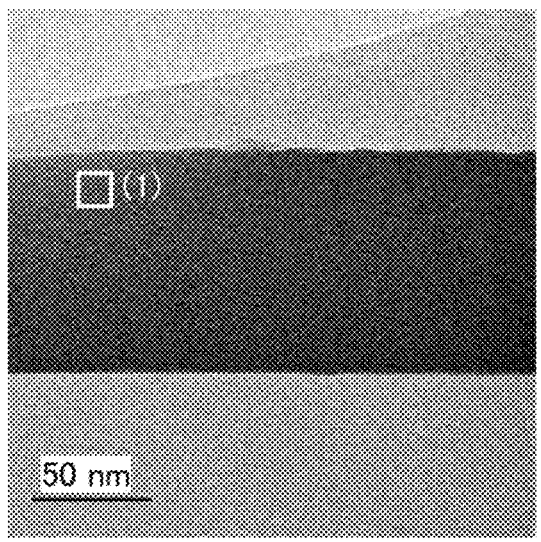
FIGS. 28A to 28D are Cs-corrected high-resolution TEM images of a cross section of a CAAC-OS and a cross-sectional schematic view of the CAAC-OS.

A CAAC-OS observed with TEM is described below. FIG. 28A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 28B:
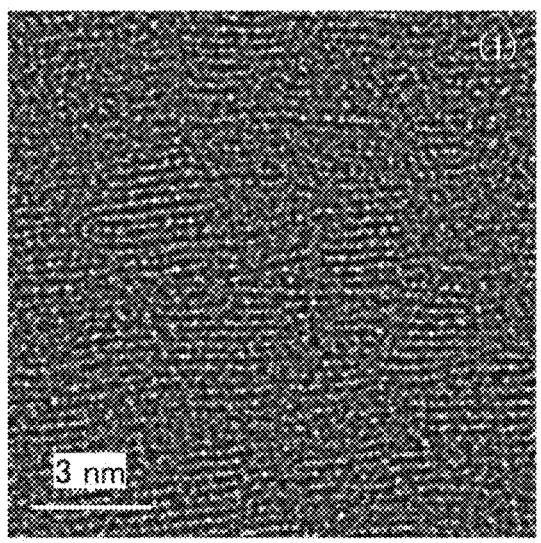

FIG. 28B is an enlarged Cs-corrected high-resolution TEM image of a region (1) in FIG. 28A. FIG. 28B shows that metal atoms are arranged in a layered manner in a pellet. Each metal atom layer has a configuration reflecting unevenness of a surface over which the CAAC-OS is formed (hereinafter, the surface is referred to as a formation surface) or the top surface of the CAAC-OS, and is arranged parallel to the formation surface or the top surface of the CAAC-OS.

Figure 28C:
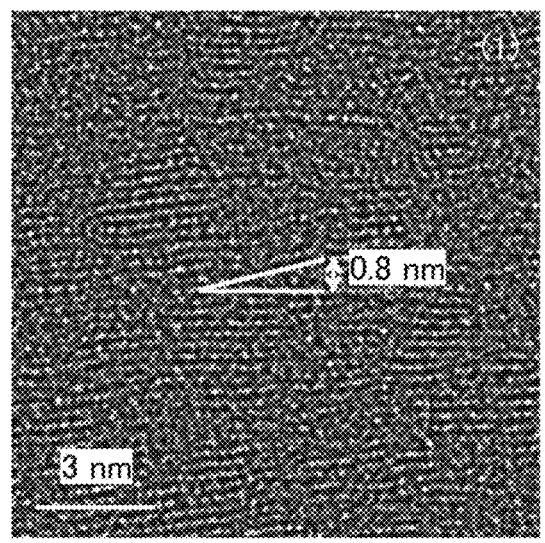

As shown in FIG. 28B, the CAAC-OS has a characteristic atomic arrangement. The characteristic atomic arrangement is denoted by an auxiliary line in FIG. 28C. FIGS. 28B and 28C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 28D:
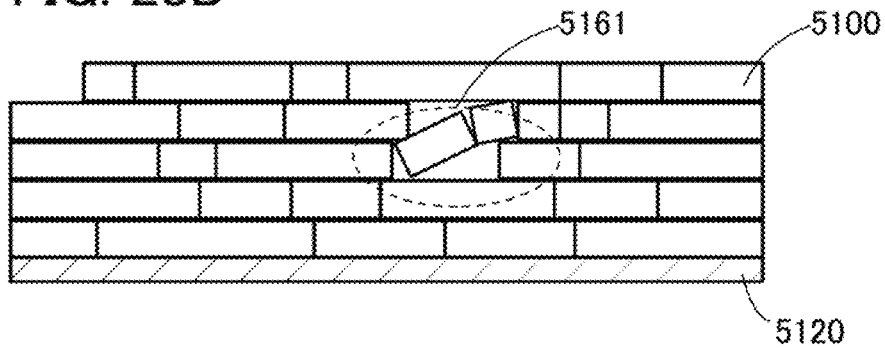

Here, according to the Cs-corrected high-resolution TEM images, the schematic arrangement of pellets 5100 of a CAAC-OS over a substrate 5120 is illustrated by such a structure in which bricks or blocks are stacked (see FIG. 28D). The part in which the pellets are tilted as observed in FIG. 28C corresponds to a region 5161 shown in FIG. 28D.

Figure 29A:
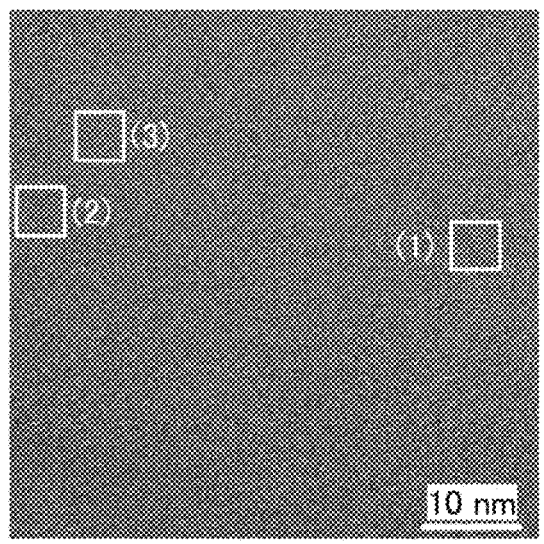
FIGS. 29A to 29D are Cs-corrected high-resolution TEM images of a plane of a CAAC-OS.
Figure 29B:
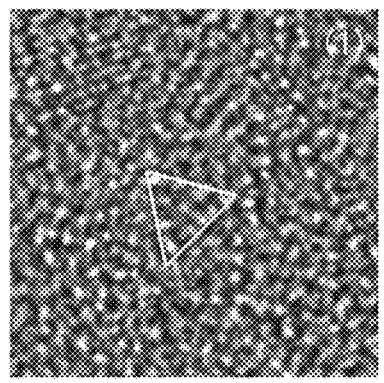
Figure 29C:
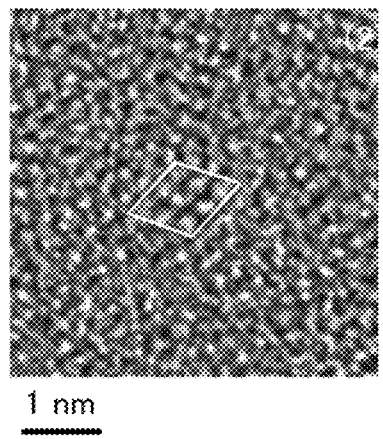
Figure 29D:
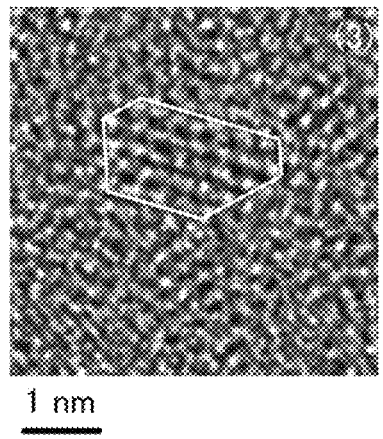

FIG. 29A shows a Cs-corrected high-resolution TEM image of a plane of the CAAC-OS observed from a direction substantially perpendicular to the sample surface. FIGS. 29B, 29C, and 29D are enlarged Cs-corrected high-resolution TEM images of regions (1), (2), and (3) in FIG. 29A, respectively. FIGS. 29B, 29C, and 29D indicate that metal atoms are arranged in a triangular, quadrangular, or hexagonal configuration in a pellet. However, there is no regularity of arrangement of metal atoms between different pellets.

Figure 30A:
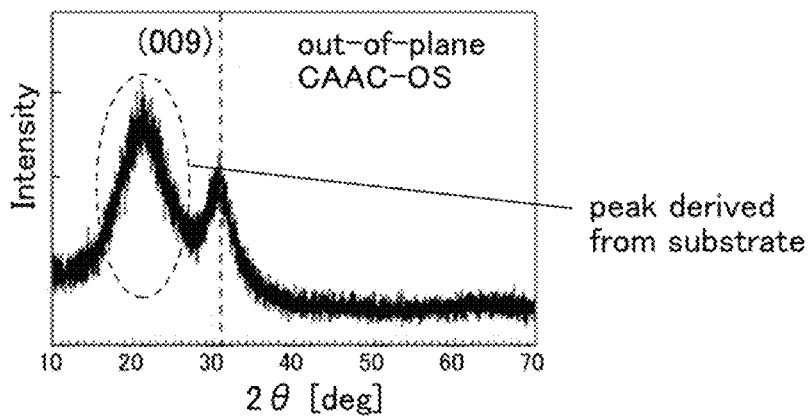
FIGS. 30A to 30C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 30A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 30B:
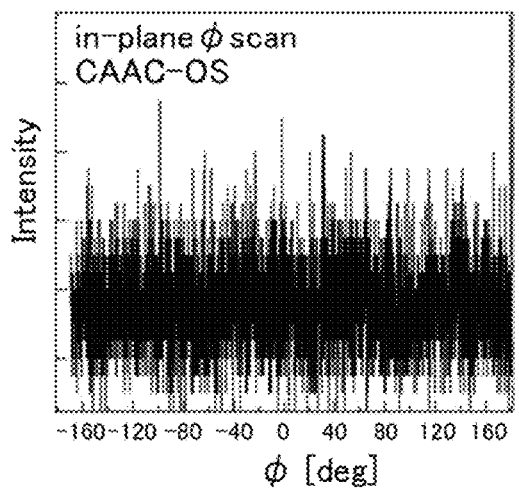
Figure 30C:
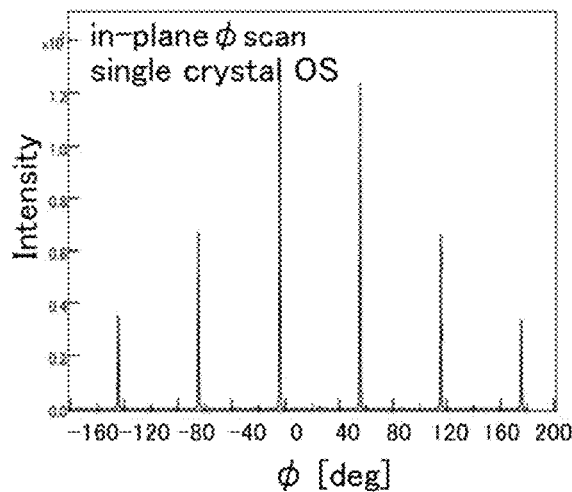

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 30B, a peak is not clearly observed. In contrast, in the case of a single crystal oxide semiconductor of InGaZnO$_4$, when φ scan is performed with 2θ fixed at around 56°, as shown in FIG. 30C, six peaks which are derived from crystal planes equivalent to the (110) plane are observed. Accordingly, the structural analysis using XRD shows that the directions of a-axes and b-axes are irregularly oriented in the CAAC-OS.

Figure 31A:
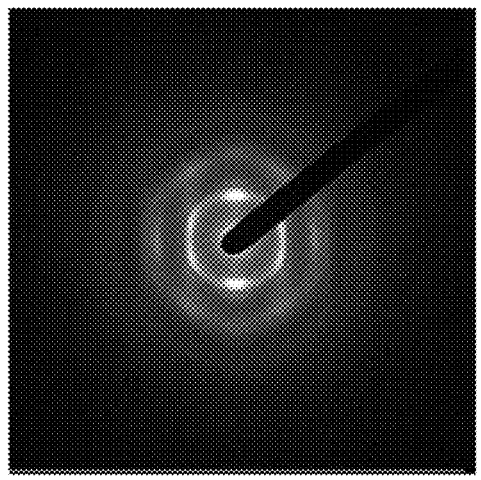
FIGS. 31A and 31B show electron diffraction patterns of a CAAC-OS.
Figure 31B:
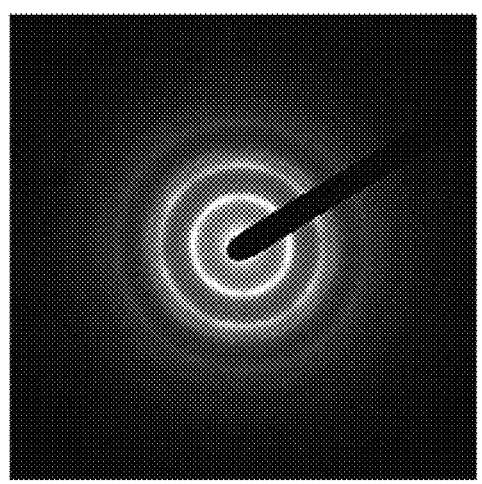

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 31A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 31B shows a diffraction pattern obtained in such a manner that an electron beam with a probe diameter of 300 nm is incident on the same sample in a direction perpendicular to the sample surface. As shown in FIG. 31B, a ring-like diffraction pattern is observed. Thus, the electron diffraction also indicates that the a-axes and b-axes of the pellets included in the CAAC-OS do not have regular alignment. The first ring in FIG. 31B is considered to be derived from the (010) plane, the (100) plane, and the like of the InGaZnO$_4$ crystal. The second ring in FIG. 31B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 32:
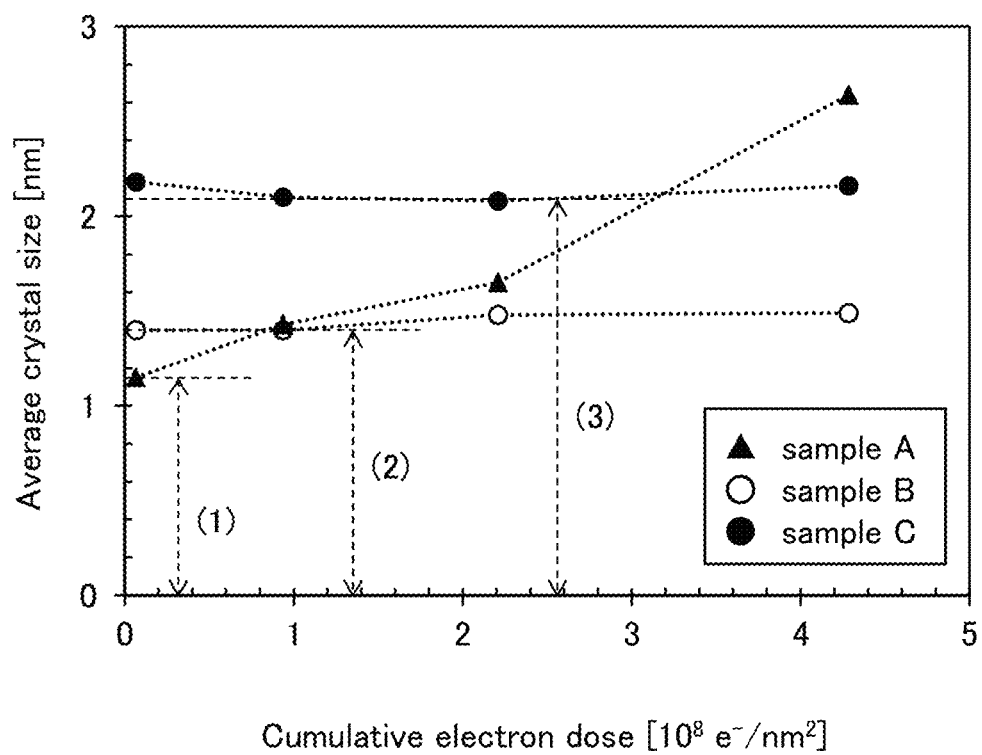
FIG. 32 shows a change of crystal parts of an In—Ga—Zn oxide owing to electron irradiation.

FIG. 32 shows change in the average size of crystal parts (at 22 points to 45 points) in each sample. Note that the crystal part size corresponds to the length of a lattice fringe. FIG. 32 indicates that the crystal part size in the a-like OS increases with an increase in the cumulative electron dose. Specifically, as shown by (1) in FIG. 32, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 32, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 12

In this embodiment, an example of a circuit of a semiconductor device including a transistor or the like of one embodiment of the present invention will be described.

<CMOS Inverter>

Figure 33A:
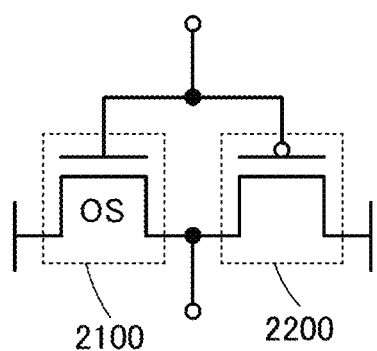
FIGS. 33A and 33B are circuit diagrams of a semiconductor device of one embodiment of the present invention.

A circuit diagram in FIG. 33A shows a configuration of what is called a CMOS inverter in which a p-channel transistor 2200 and an n-channel transistor 2100 are connected to each other in series and in which gates of them are connected to each other.

<Structure 1 of Semiconductor Device>

Figure 34:
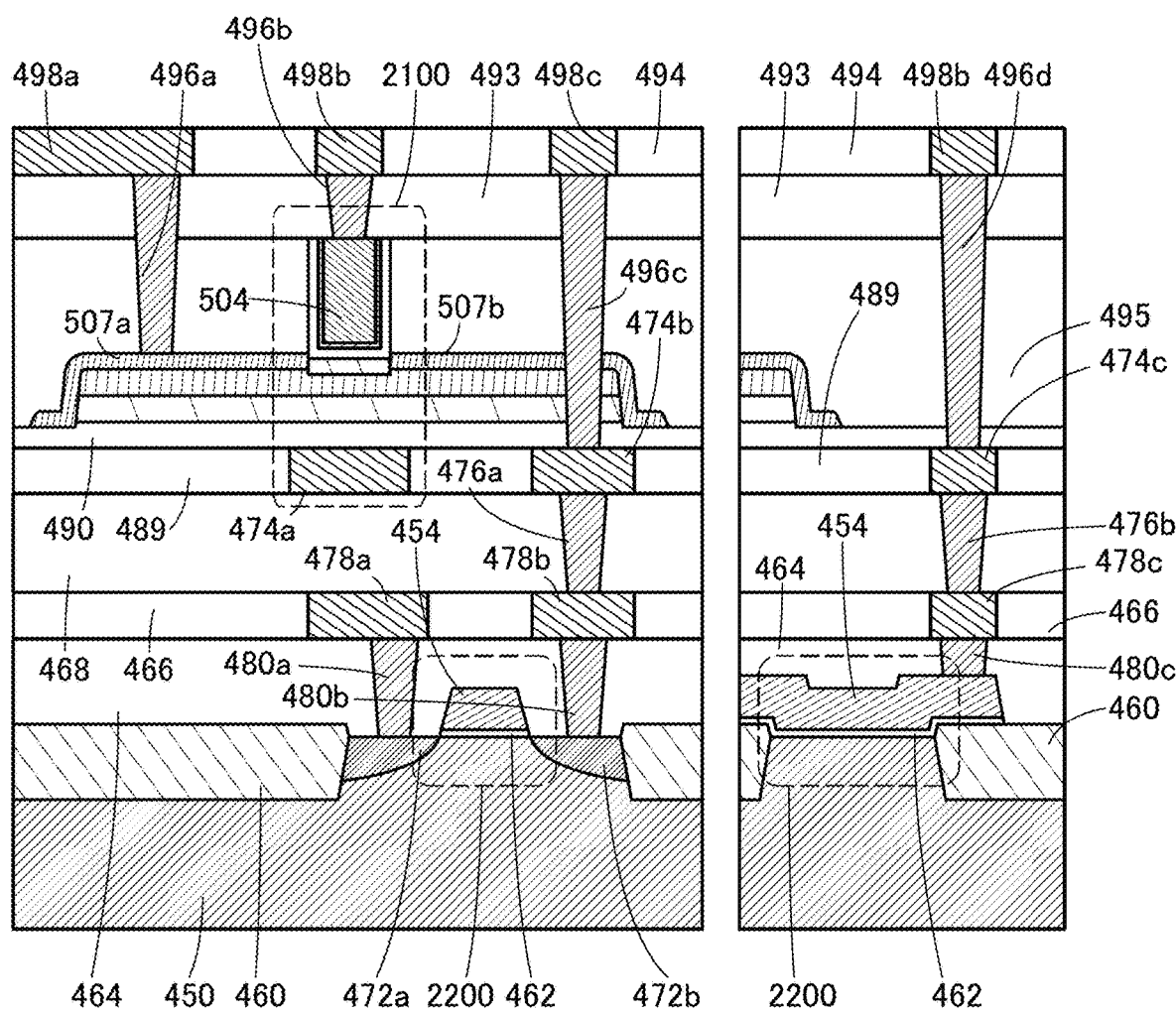
FIG. 34 is a cross-sectional view illustrating a semiconductor device of one embodiment of the present invention.

FIG. 34 is a cross-sectional view of the semiconductor device of FIG. 33A. The semiconductor device shown in FIG. 34 includes the transistor 2200 and the transistor 2100. The transistor 2100 is placed above the transistor 2200. Any of the transistors described in the above embodiments can be used as the transistor 2100. Thus, the description regarding the above-mentioned transistors can be referred to for the transistor 2100 as appropriate.

The transistor 2200 shown in FIG. 34 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 serves as a gate insulator. The conductor 454 serves as a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 34 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may serve as a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 413 in the above embodiment and thus, the description of the conductor 413 can be referred to for details about the conductor 474a.

The insulator 490 includes an opening reaching the conductor 474b. Note that the insulator 490 corresponds to the insulator 402 in the above embodiment and thus, the description of the insulator 402 can be referred to for details about the insulator 490.

The insulator 495 includes the opening reaching the conductor 474b through a conductor 507b that is one of a source and a drain of the transistor 2100, an opening reaching a conductor 507a that is the other of the source and the drain of the transistor 2100, an opening reaching the conductor 504 that is the gate electrode of the transistor 2100, and the opening reaching the conductor 474c. Note that the insulator 495 corresponds to the insulator 410 in the above embodiment and thus, the description of the insulator 410 can be referred to for details about the insulator 495.

The insulator 493 includes the opening reaching the conductor 474b through the conductor 507b that is one of the source and the drain of the transistor 2100, the opening reaching the conductor 507a that is the other of the source and the drain of the transistor 2100, the opening reaching the conductor 504 that is the gate electrode of the transistor 2100, and the opening reaching the conductor 474c. In the openings, the conductor 496a, the conductor 496b, the conductor 496c, and the conductor 496d are embedded. Note that in some cases, an opening provided in a component of the transistor 2100 or the like may be positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 35:
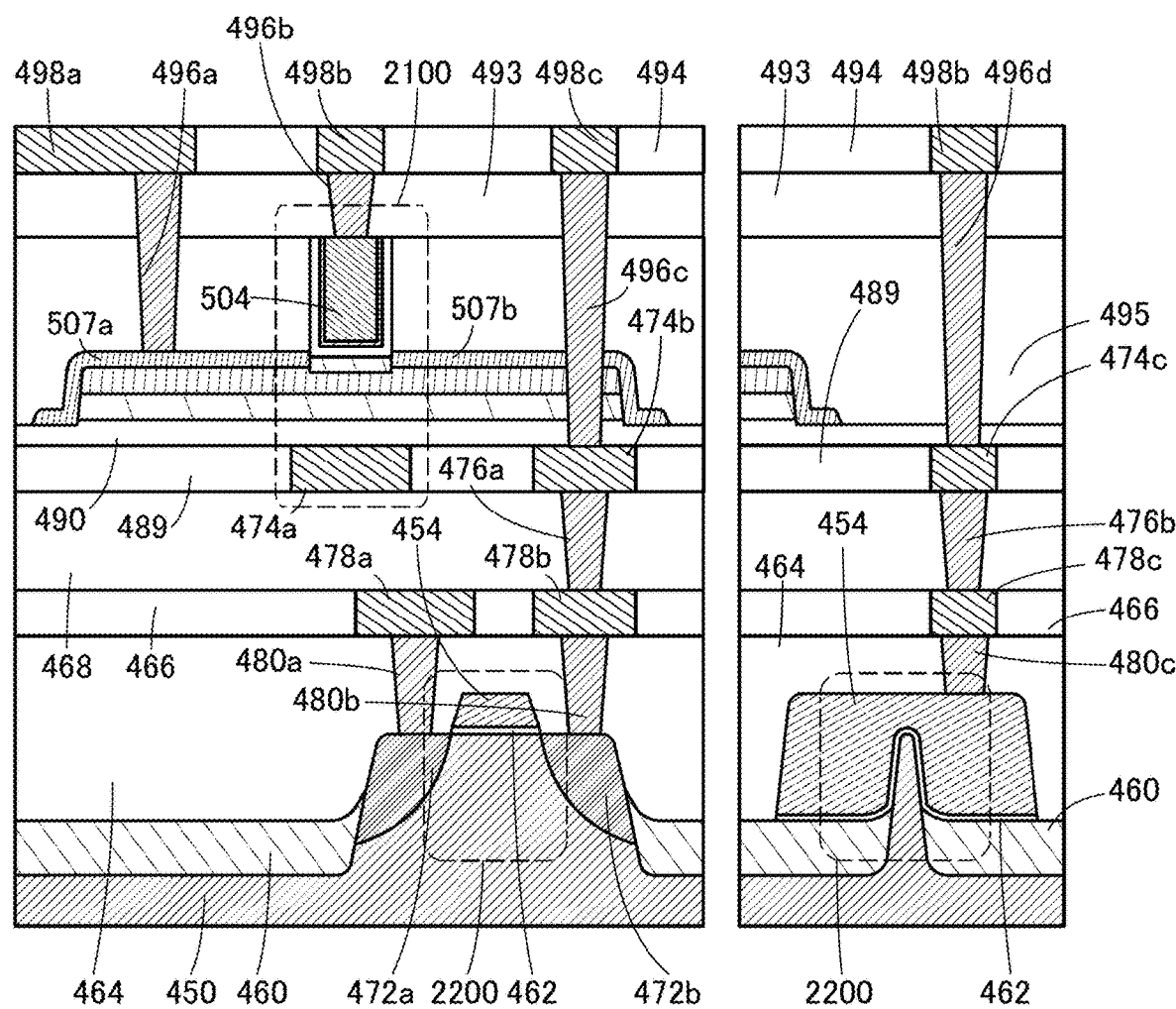
FIG. 35 is a cross-sectional view illustrating a semiconductor device of one embodiment of the present invention.

Note that a semiconductor device in FIG. 35 is the same as the semiconductor device in FIG. 34 except for the structure of the transistor 2200. Therefore, the description of the semiconductor device in FIG. 34 is referred to for the semiconductor device in FIG. 35. In the semiconductor device in FIG. 35, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 36:
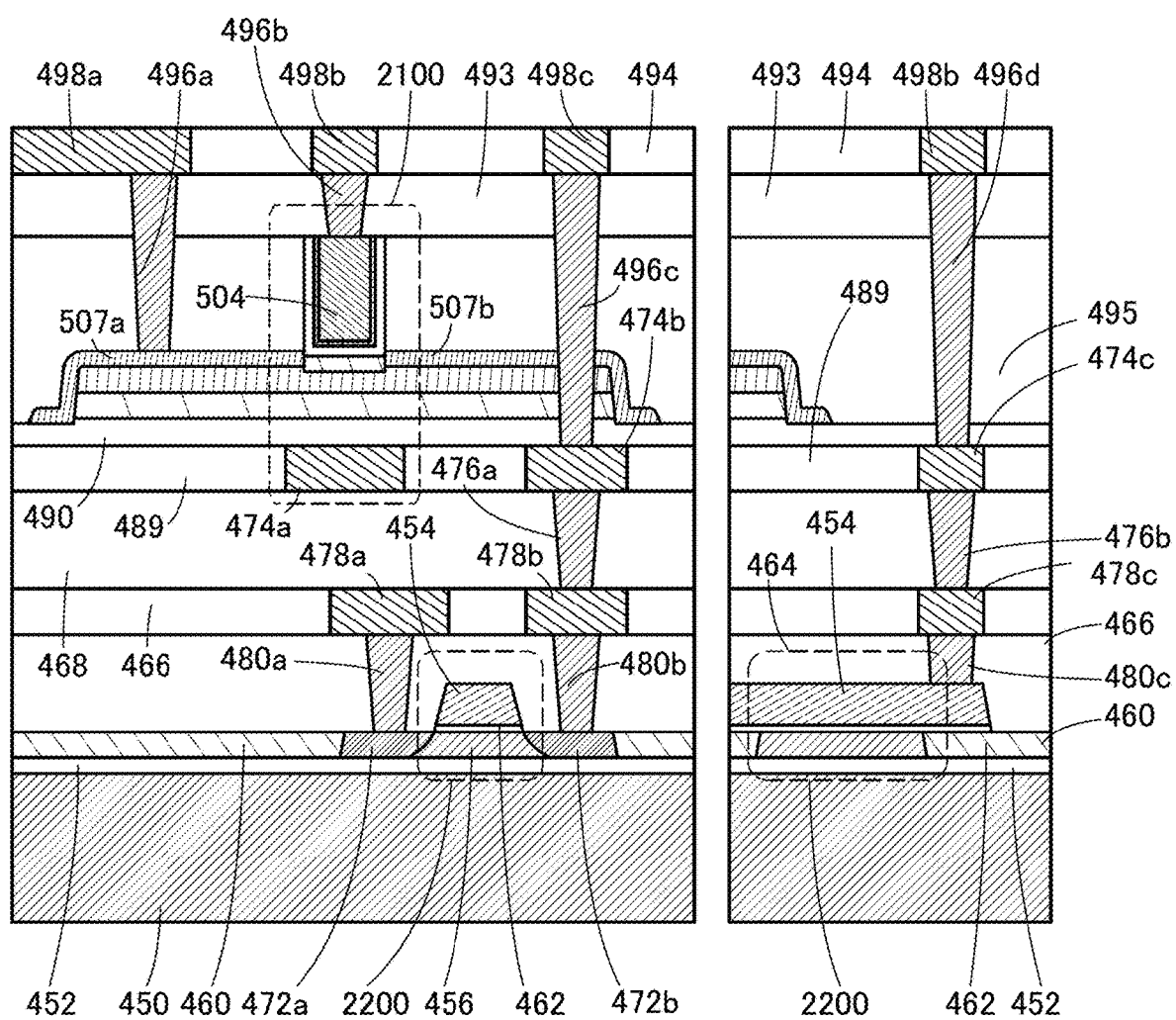
FIG. 36 is a cross-sectional view illustrating a semiconductor device of one embodiment of the present invention.

Note that a semiconductor device in FIG. 36 is the same as the semiconductor device in FIG. 34 except for the structure of the transistor 2200. Therefore, the description of the semiconductor device in FIG. 34 is referred to for the semiconductor device in FIG. 36. Specifically, in the semiconductor device in FIG. 36, the transistor 2200 is formed in the semiconductor substrate 450 that is an SOI substrate. In the structure in FIG. 36, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 34, FIG. 35, and FIG. 36, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 33B:
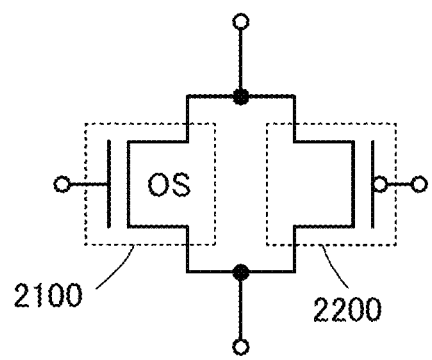

A circuit diagram in FIG. 33B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 37A:
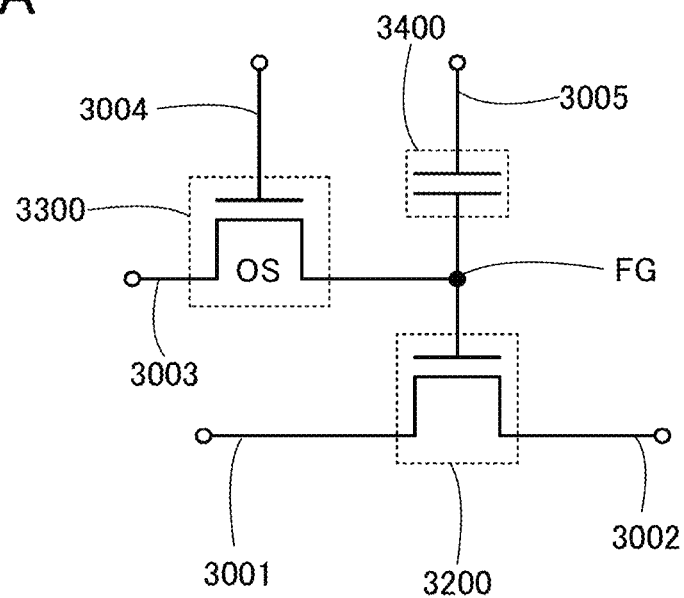
FIGS. 37A and 37B are circuit diagrams illustrating a memory device of one embodiment of the present invention.
Figure 37B:
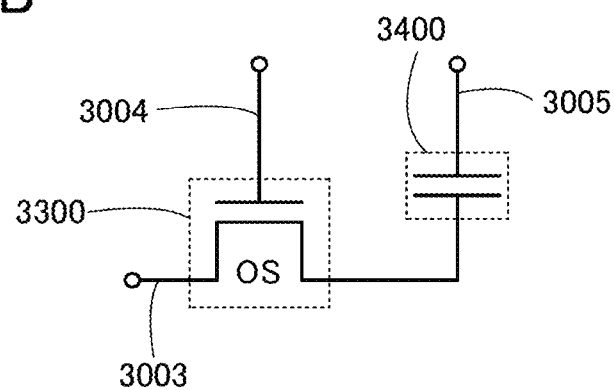

An example of a semiconductor device (memory device) which includes the transistor of one embodiment of the present invention, which can retain stored data even when not powered, and which has an unlimited number of write cycles is shown in FIGS. 37A and 37B.

The semiconductor device illustrated in FIG. 37A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 37A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 37A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state". Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state". In the case where the low-level electric charge is supplied to the node FG in writing, even when the potential of the fifth wiring 3005 is $V_0$ ($<V_{th\_L}$), the transistor 3200 still remains in "off state". Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device 1>

Figure 38:
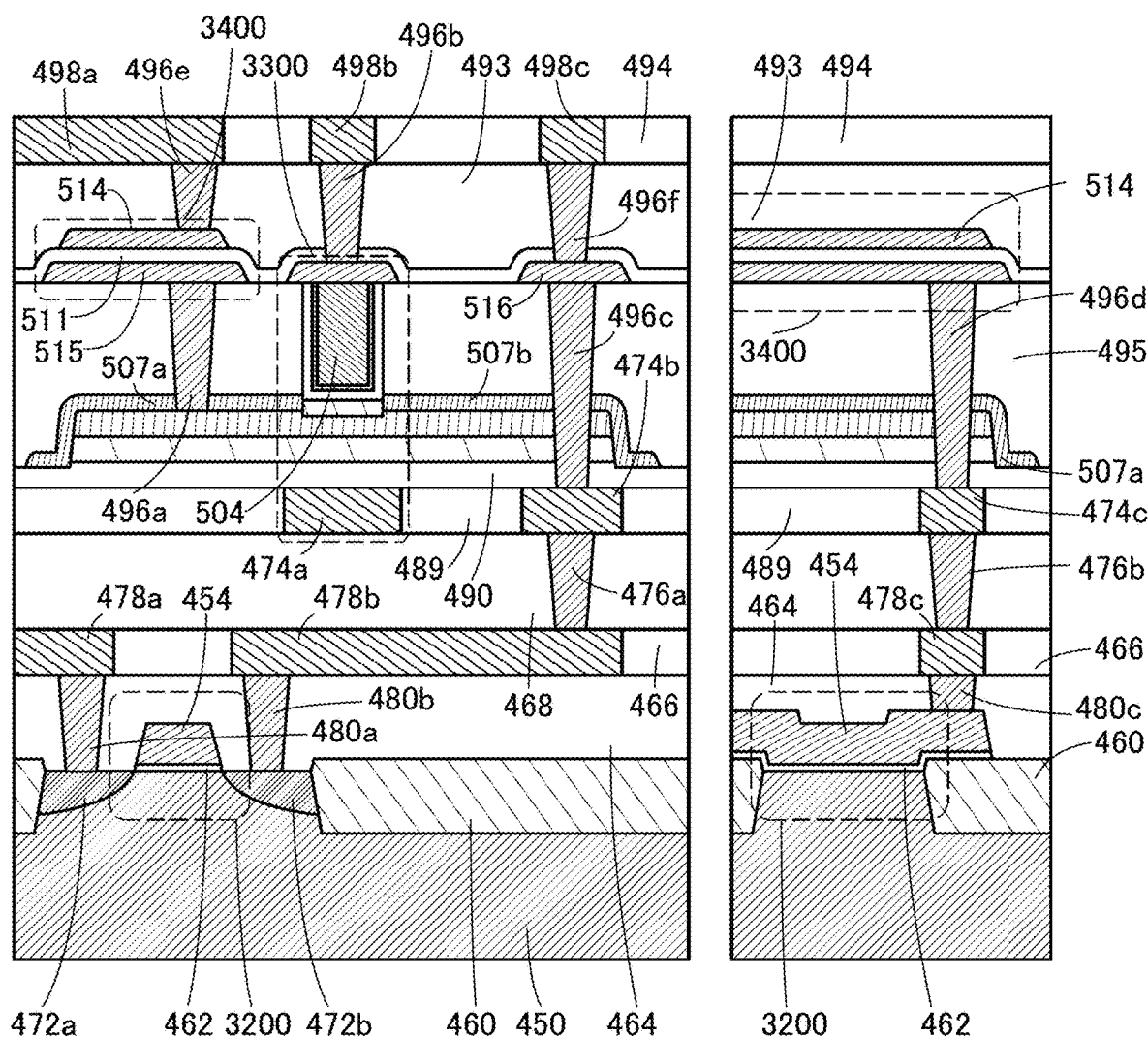
FIG. 38 is a cross-sectional view illustrating a semiconductor device of one embodiment of the present invention.

FIG. 38 is a cross-sectional view of the semiconductor device of FIG. 37A. The semiconductor device shown in FIG. 38 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 34 is referred to. Note that although the transistor 2200 is illustrated as a p-channel transistor in FIG. 34, the transistor 3200 may be an n-channel transistor.

The transistor 2200 illustrated in FIG. 38 is a transistor using the semiconductor substrate 450. The transistor 2200 includes the region 472a in the semiconductor substrate 450, the region 472b in the semiconductor substrate 450, the insulator 462, and the conductor 454.

The semiconductor device illustrated in FIG. 38 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the insulator 489, the insulator 490, the insulator 492, the insulator 493, the insulator 494, and the insulator 495.

The insulator 464 is provided over the transistor 3200. The insulator 466 is provided over the insulator 464. The insulator 468 is provided over the insulator 466. The insulator 489 is provided over the insulator 468. The transistor 2100 is provided over the insulator 489. The insulator 493 is provided over the transistor 2100. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 3300, an opening reaching the conductor 476a, and an opening reaching the conductor 476b. In the openings, the conductor 474a, the conductor 474b, and the conductor 474c are embedded.

The conductor 474a may serve as a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 504 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 490 includes an opening reaching the conductor 474b and an opening reaching the conductor 474c. Note that the insulator 490 corresponds to the insulator 402 in the above embodiment and thus, the description of the insulator 402 can be referred to for details about the insulator 490.

The insulator 495 includes an opening reaching the conductor 474b through the conductor 507b that is one of a source and a drain of the transistor 3300, an opening reaching the conductor 515 through the conductor 507a that is the other of the source and the drain of the transistor 3300, and an opening reaching the conductor 474c through the conductor 507a that is the other of the source and the drain of the transistor 3300. Note that the insulator 495 corresponds to the insulator 410 in the above embodiment and thus, the description of the insulator 410 can be referred to for details about the insulator 495.

The insulator 493 includes an opening reaching the conductor 514 that overlaps with the conductor 515 with the insulator 511 positioned therebetween, an opening reaching the conductor that is the gate electrode of the transistor 3300, and the opening reaching the conductor 516 that is electrically connected to the conductor 507b that is the one of the source and the drain of the transistor 3300. In the openings, the conductor 496e, the conductor 496b, and the conductor 496f are embedded. Note that in some cases, an opening provided in a component of the transistor 3300 or the like is through other components.

The insulator 494 includes an opening reaching the conductor 496e, an opening reaching the conductor 496b, and an opening reaching the conductor 496f In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 507b that is one of the source and the drain of the transistor 3300 through the conductor 480b, the conductor 478b, the conductor 476a, the conductor 474b, and the conductor 496c. The conductor 454 that is the gate electrode of the transistor 3200 is electrically connected to the conductor 507a that is the other of the source and the drain of the transistor 3300 through the conductor 480c, the conductor 478c, the conductor 476b, the conductor 474c, and the conductor 496d.

The capacitor 3400 includes a conductor 515, the conductor 514, and the insulator 511.

For the structures of other components, the description of FIG. 34 and the like can be referred to as appropriate.

Figure 39:
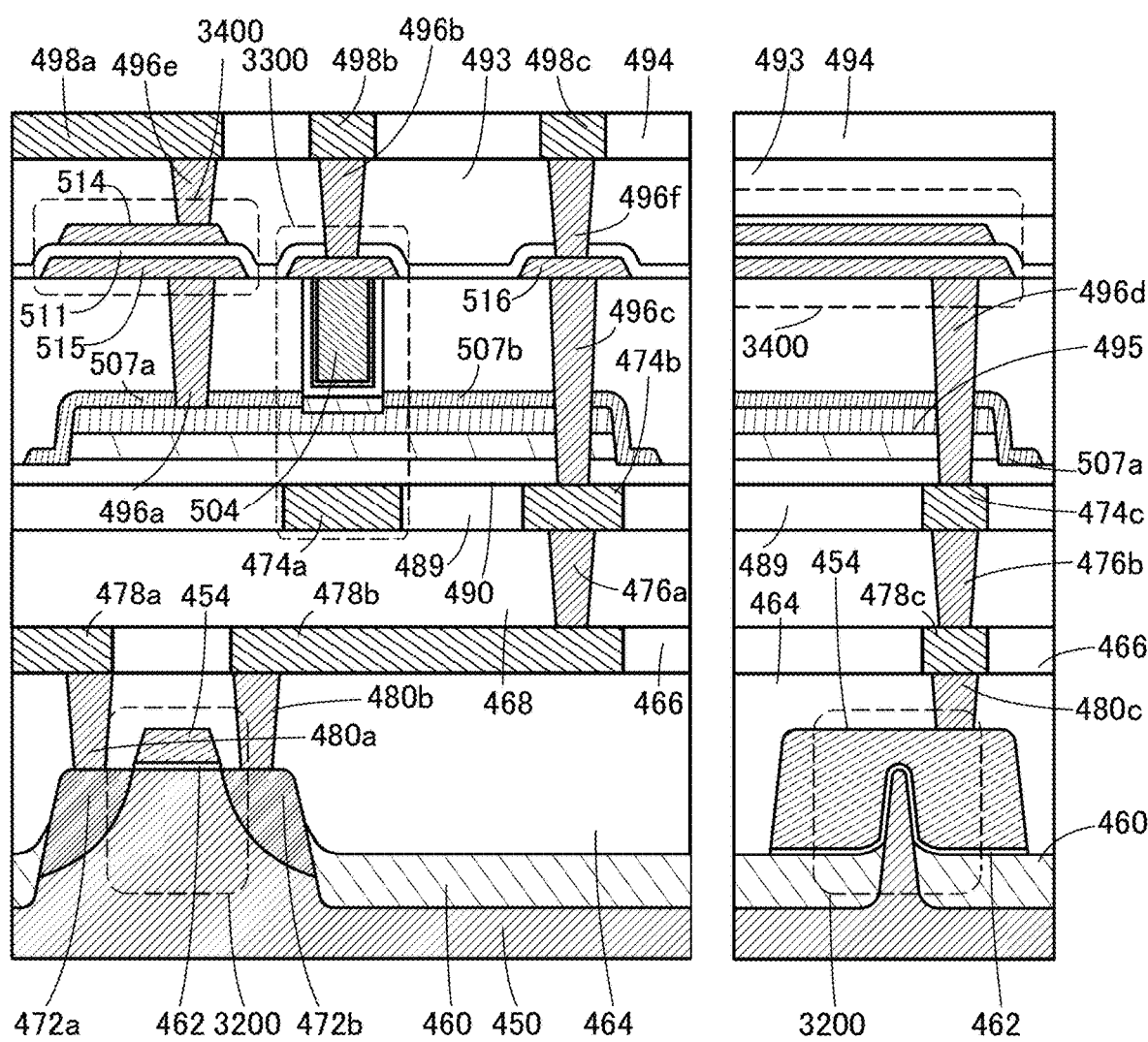
FIG. 39 is a cross-sectional view illustrating a semiconductor device of one embodiment of the present invention.

A semiconductor device in FIG. 39 is the same as the semiconductor device in FIG. 38 except for the structure of the transistor 3200. Therefore, the description of the semiconductor device in FIG. 38 is referred to for the semiconductor device in FIG. 39. Specifically, in the semiconductor device in FIG. 39, the transistor 3200 is a Fin-type transistor. For the Fin-type transistor 3200, the description of the transistor 2200 in FIG. 35 is referred to. Note that although the transistor 2200 is illustrated as a p-channel transistor in FIG. 35, the transistor 3200 may be an n-channel transistor.

Figure 40:
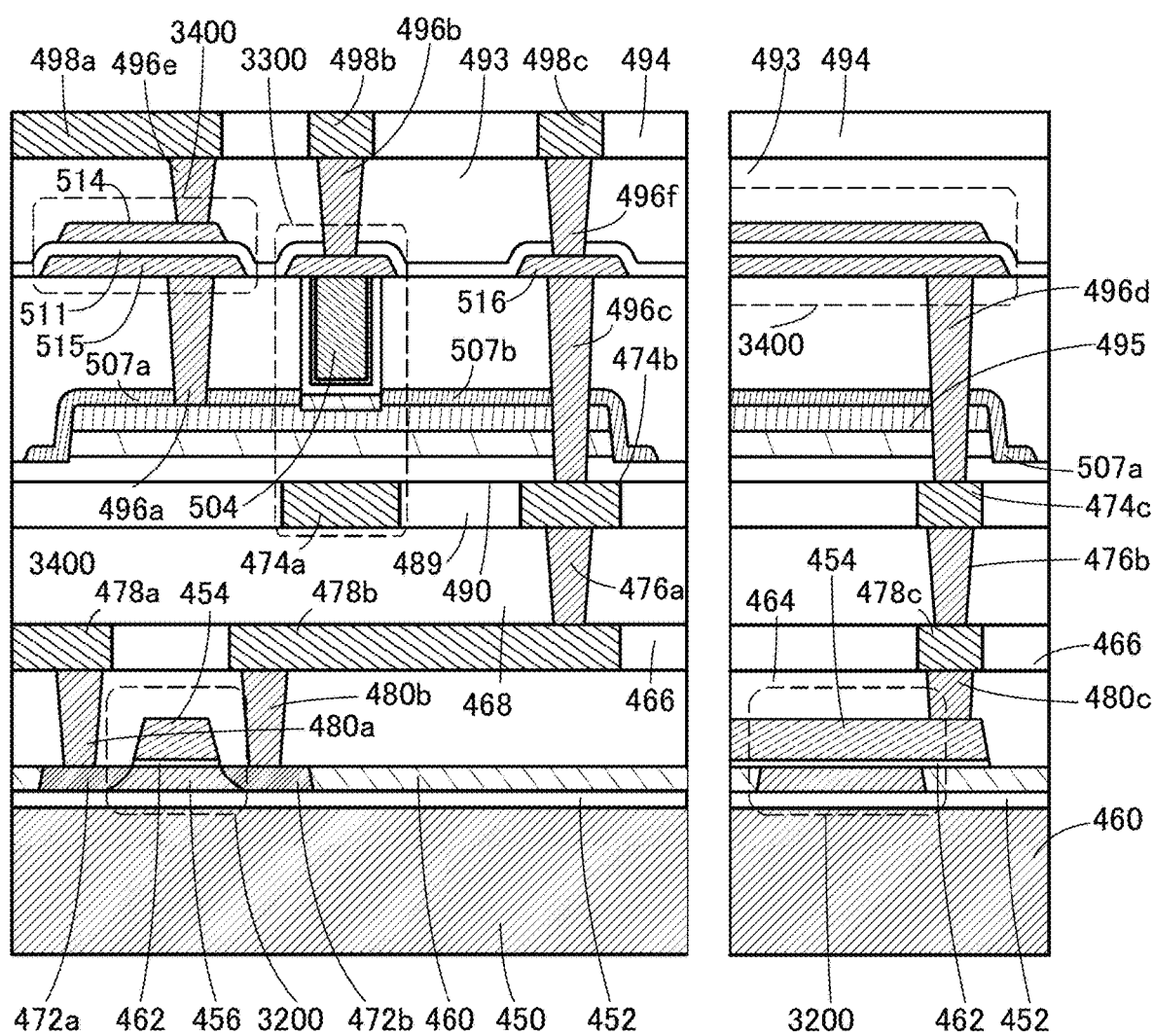
FIG. 40 is a cross-sectional view illustrating a semiconductor device of one embodiment of the present invention.

A semiconductor device in FIG. 40 is the same as the semiconductor device in FIG. 38 except for the structure of the transistor 3200. Therefore, the description of the semiconductor device in FIG. 38 is referred to for the semiconductor device in FIG. 40. Specifically, in the semiconductor device in FIG. 40, the transistor 3200 is provided in the semiconductor substrate 450 that is an SOI substrate. For the transistor 3200, which is provided in the semiconductor substrate 450 (SOI substrate), the description of the transistor 2200 in FIG. 36 is referred to. Note that although the transistor 2200 is illustrated as a p-channel transistor in FIG. 36, the transistor 3200 may be an n-channel transistor.

<Memory Device 2>

The semiconductor device in FIG. 37B is different from the semiconductor device in FIG. 37A in that the transistor 3200 is not provided. Also in this case, data can be written and retained in a manner similar to that of the semiconductor device in FIG. 37A.

Reading of data in the semiconductor device in FIG. 37B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 37A will be described with reference to a circuit diagram in FIG. 41.

Figure 41:
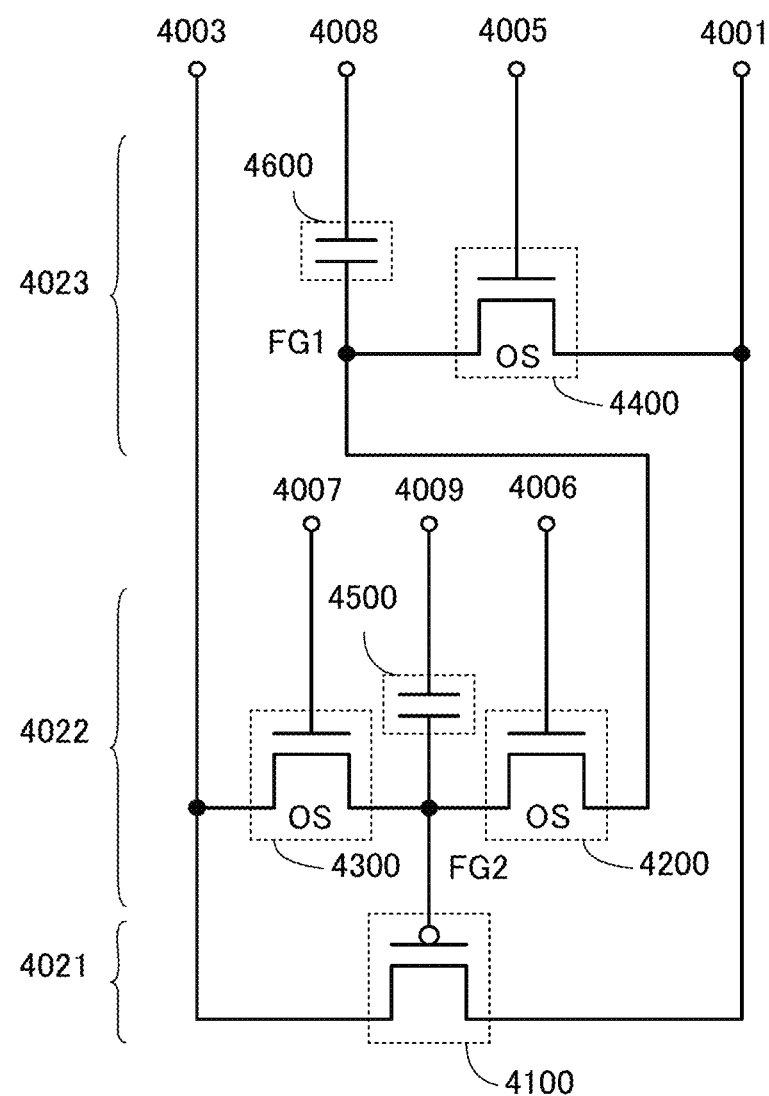
FIG. 41 is a circuit diagram of a semiconductor device of one embodiment of the present invention.

The semiconductor device illustrated in FIG. 41 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 41, a plurality of semiconductor devices in FIG. 41 are provided in a matrix. The semiconductor devices in FIG. 41 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 41, the transistor 4100 may be an n-channel transistor.

The semiconductor device in FIG. 41 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 41, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 41 preferably includes, as illustrated in FIG. 41, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 41 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}$-$V_{th}$" in which VD1 is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}$-$V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}$-$V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}$-$V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}$-$V_{th}$" written in the writing operation 1.

In the semiconductor device in FIG. 41, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}$-$V_{th}$" and "$V_{D2}$-$V_{th}$" are used as the written potentials are described, they are data voltages corresponding to multilevel data. Therefore, in the case where the data retention portions each retain 4-bit data, 16-value "$V_{D1}$-$V_{th}$" and 16-value "$V_{D2}$-$V_{th}$" can be obtained.

Next, operation of reading data from the semiconductor device illustrated in FIG. 41 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged.

The wirings 4005 to 4008 are set low. When the wiring 4009 is set low, the potential of the node FG2 which is electrically floating is set at "$V_{D2}$-$V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}$-$V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}$-$V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}$-$V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}$-$V_{th}$." Thus, the capacitance of the capacitor 4600 is preferably larger than the capacitance of the capacitor 4500. Alternatively, the potential written to the node FG1, "$V_{D1}$-$V_{th}$", is preferably larger than the potential corresponding to the same data, "$V_{D2}$-$V_{th}$." By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}$-$V_{th}$." The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}$-$V_{th}$," by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$." In the transistor 4100, $V_{gs}$ between "$V_{D1}$-$V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 41, the storage capacity can be increased by adding layers without increasing the area of the semiconductor device.

The read potential can be read as a voltage larger than the written data voltage by $V_{th}$. Therefore, $V_{th}$ of "$V_{D1}$-$V_{th}$" and $V_{th}$ of "$V_{D2}$-$V_{th}$" written in the writing operation can be canceled to be read. As a result, the memory capacity per memory cell can be improved and read data can be close to accurate data; thus, the data reliability becomes excellent.

Figure 42:
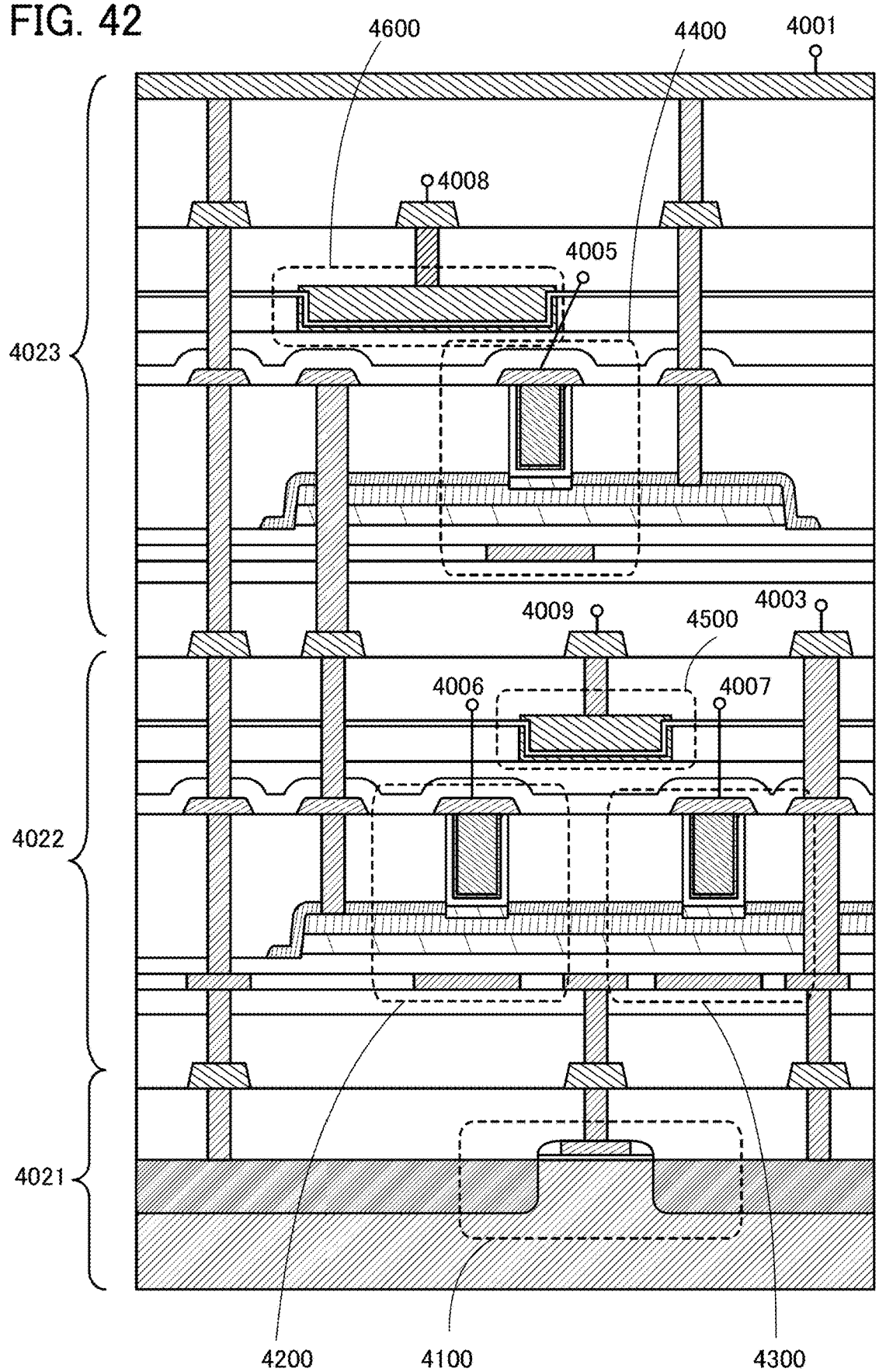
FIG. 42 is a cross-sectional view illustrating a semiconductor device of one embodiment of the present invention.

FIG. 42 is a cross-sectional view of a semiconductor device that corresponds to FIG. 41. The semiconductor device illustrated in FIG. 42 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200, 4300, and 4400, and the description of the transistor 3200 can be referred to for the transistor 4100. The description made with reference to FIG. 38 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 38 is parallel to the substrate. With this structure, a larger capacity can be obtained without increasing the occupation area.

<FPGA>

One embodiment of the present invention can also be applied to an LSI such as a field programmable gate array (FPGA).

Figure 43A:
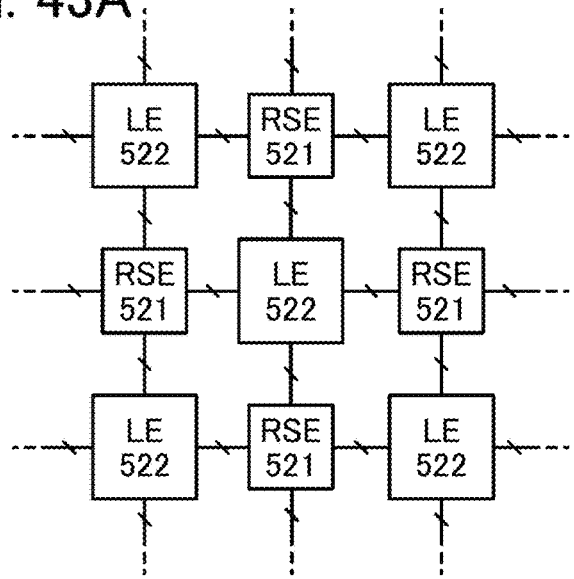
FIGS. 43A to 43E are circuit diagrams of a semiconductor device of one embodiment of the present invention.

FIG. 43A illustrates an example of a block diagram of an FPGA. The FPGA includes a routing switch element 521 and a logic element 522. The logic element 522 can switch functions of a logic circuit, such as a combination circuit or a sequential circuit, in accordance with configuration data stored in a configuration memory.

Figure 43B:
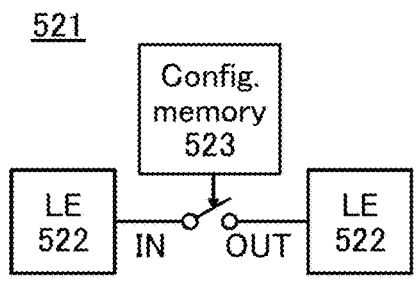

FIG. 43B is a schematic view illustrating a function of the routing switch element 521. The routing switch element 521 can switch a connection between the logic elements 522 in accordance with configuration data stored in a configuration memory 523. Note that although FIG. 43B illustrates one switch which switches a connection between a terminal IN and a terminal OUT, in an actual FPGA, a plurality of switches are provided between a plurality of the logic elements 522.

Figure 43C:
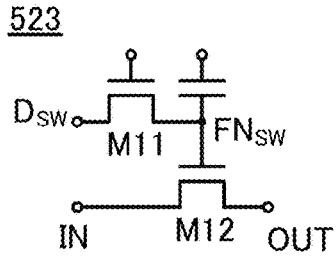

FIG. 43C illustrates a configuration example of a circuit serving as the configuration memory 523. The configuration memory 523 includes a transistor M11 that is an OS transistor and a transistor M12 that is a silicon (Si) transistor. Configuration data $D_{SW}$ is supplied to a node $FN_{SW}$ through the transistor M11. A potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 43D:
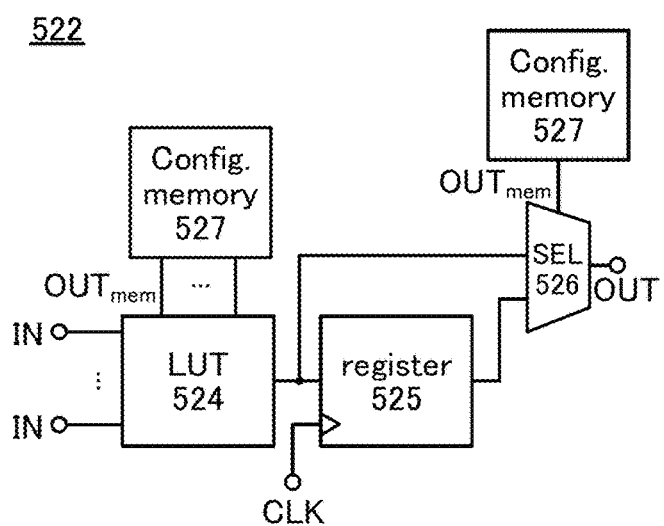

FIG. 43D is a schematic view illustrating a function of the logic element 522. The logic element 522 can switch a potential of a terminal $OUT_{mem}$ in accordance with configuration data stored in a configuration memory 527. A lookup table 524 can switch functions of a combination circuit that processes a signal of the terminal IN in accordance with the potential of the terminal $OUT_{mem}$. The logic element 522 includes a register 525 that is a sequential circuit and a selector 526 that switches signals of the terminal OUT. The selector 526 can select to output a signal of the lookup table 524 or to output a signal of the register 525 in accordance with the potential of the terminal $OUT_{mem}$, which is output from the configuration memory 527.

Figure 43E:
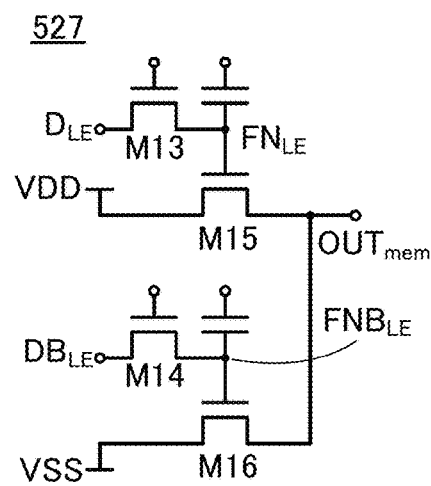

FIG. 43E illustrates configuration example of a circuit serving as the configuration memory 527. The configuration memory 527 includes a transistor M13 and a transistor M14 that are OS transistors, and a transistor M15 and a transistor M16 that are Si transistors. Configuration data $D_{LE}$ is supplied to a node $FN_{LE}$ through the transistor M13. Configuration data $DB_{LE}$ is supplied to a node $FNB_{LE}$ through the transistor M14. The configuration data $DB_{LE}$ corresponds to a potential of the configuration data $D_{LE}$ whose logic is inverted. The potential of the configuration data $D_{LE}$ and the potential of the configuration data $DB_{LE}$ can be retained by turning off the transistor M13 and the transistor M14, respectively. The on and off states of one of the transistors M15 and M16 are switched in accordance with the retained potentials of the configuration data $D_{LE}$ and the configuration data $DB_{LE}$, so that a potential VDD or a potential VSS can be supplied to the terminal $OUT_{mem}$.

For the configuration illustrated in FIGS. 43A to 43E, any of the structures described in the above embodiment can be used. For example, Si transistors are used as the transistors M12, M15, and M16, and OS transistors are used as the transistors M11, M13, and M14. In this case, a wiring for connecting the Si transistors provided in a lower layer can be formed with a low-resistance conductive material. Therefore, a circuit with high access speed and low power consumption can be obtained.

The structures described in this embodiment can be used in appropriate combination with any of the structures described in the other embodiments.

Embodiment 13

In this embodiment, an example of an imaging device including the transistor or the like of one embodiment of the present invention will be described.
<Configuration of Imaging Device>

Figure 44A:
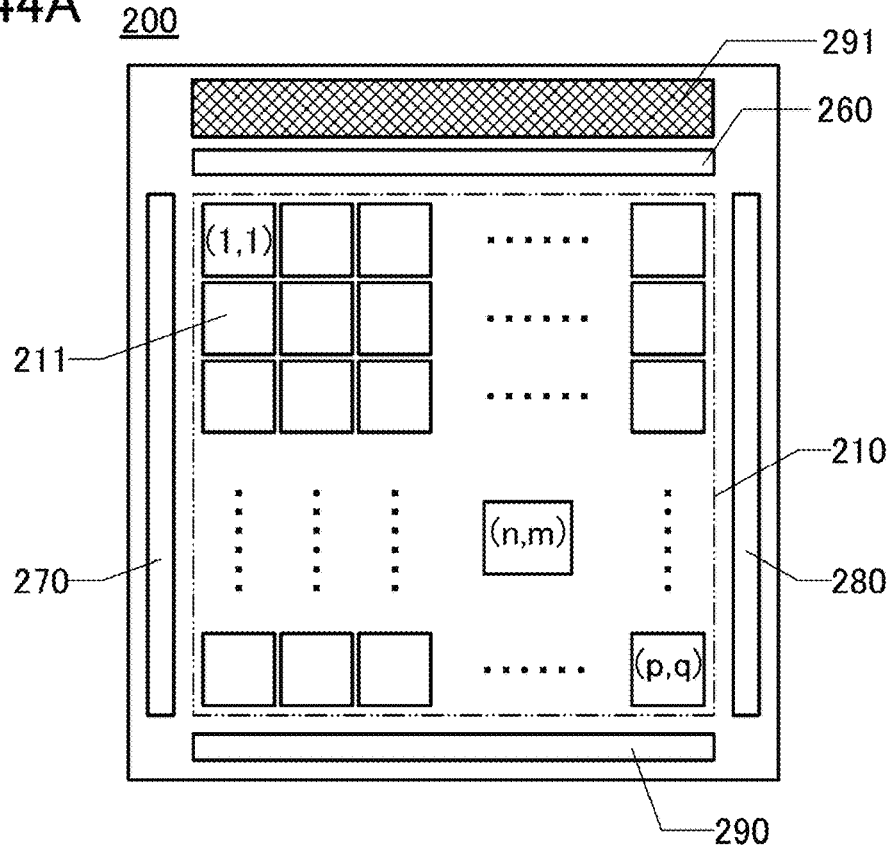
FIGS. 44A and 44B are top views each illustrating a semiconductor device of one embodiment of the present invention.

FIG. 44A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 44B:
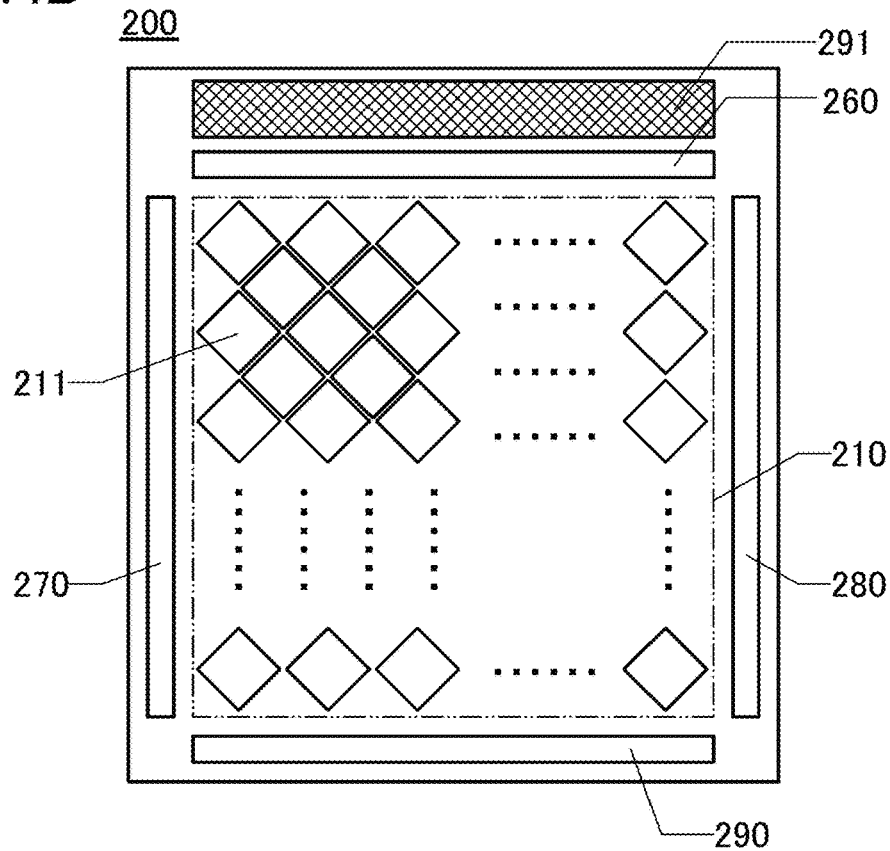

As illustrated in FIG. 44B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.
<Configuration Example 1 of Pixel>

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 45A:
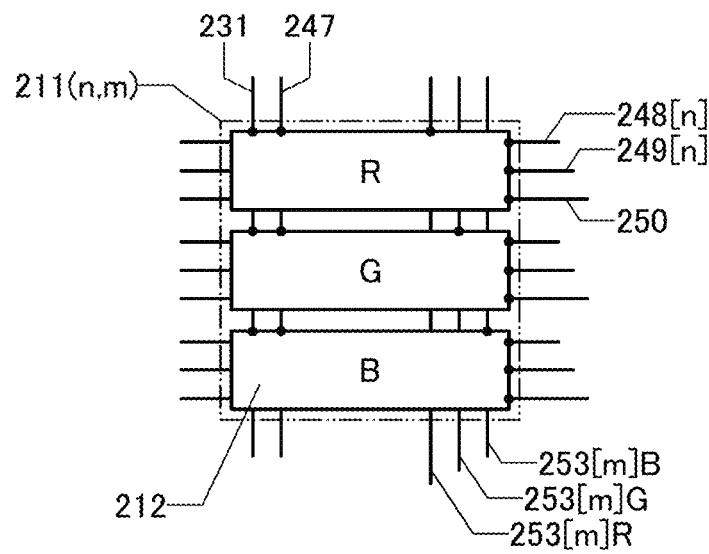
FIGS. 45A and 45B are block diagrams each illustrating a semiconductor device of one embodiment of the present invention.

FIG. 45A is a top view showing an example of the pixel 211 with which a color image is obtained. The pixel 211 illustrated in FIG. 45A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 45A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 45B:
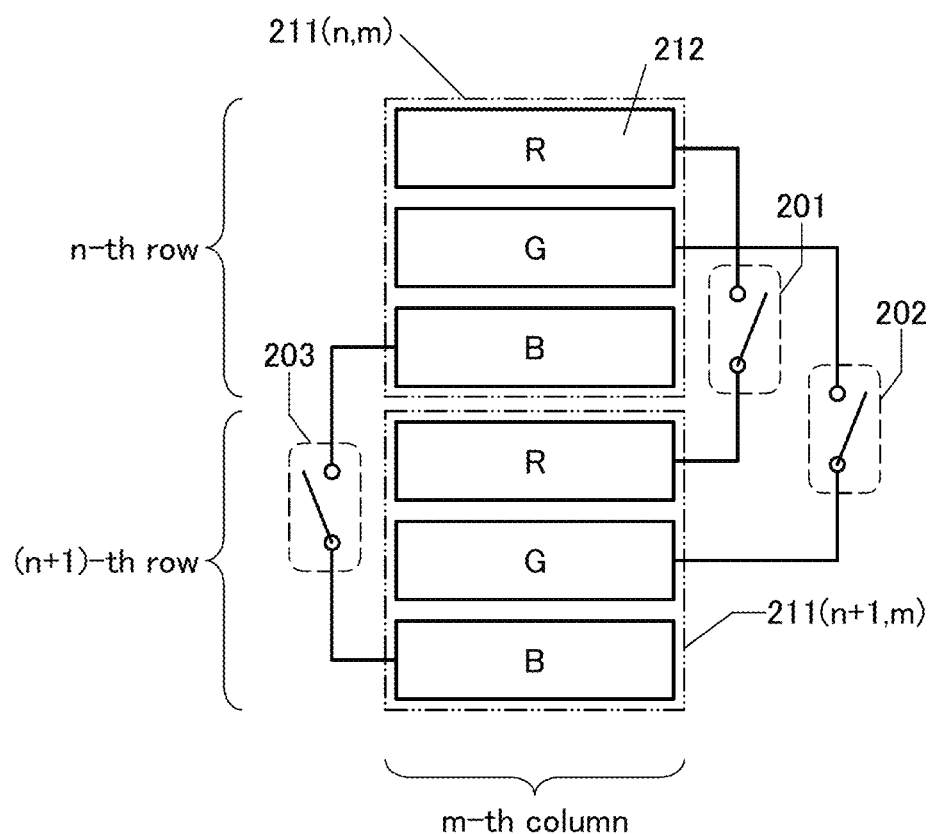

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 45B shows a connection example of the subpixels 212: the subpixel 212 in the pixel 211 arranged in the n-th (n is an integer greater than or equal to 1 and less than or equal top) row and the m-th (m is an integer greater than or equal to 1 and less than or equal to q) column and the subpixel 212 in the adjacent pixel 211 arranged in an (n+1)-th row and the m-th column. In FIG. 45B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 45A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 46A and 46B. With the lens 255, the photoelectric conversion element can receive incident light efficiently. Specifically, as illustrated in FIG. 46A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed double-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 46B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 46A:
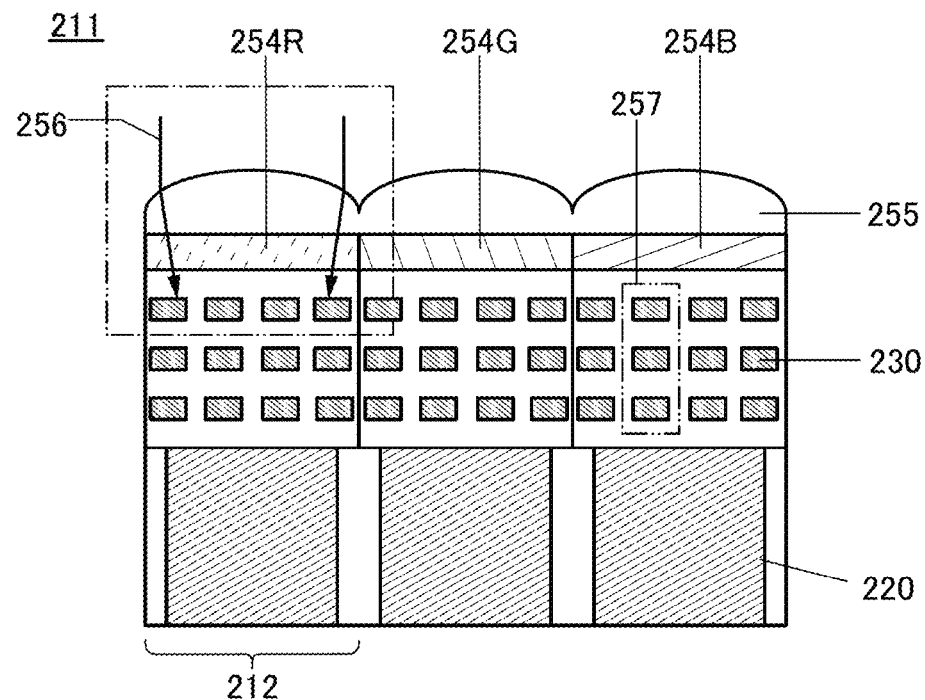
FIGS. 46A and 46B are each a cross-sectional view illustrating a semiconductor device of one embodiment of the present invention.
Figure 46B:
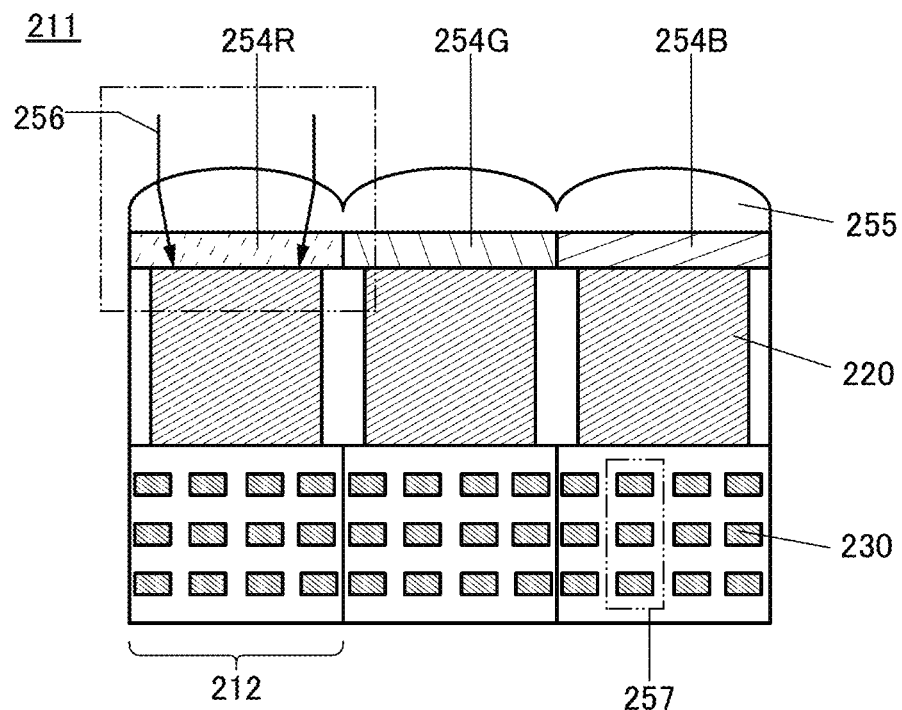

As the photoelectric conversion element 220 illustrated in FIGS. 46A and 46B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 45A and 45B.

<Configuration Example 2 of Pixel>

An example of a pixel including a transistor using silicon and a transistor using an oxide semiconductor will be described below.

Figure 47A:
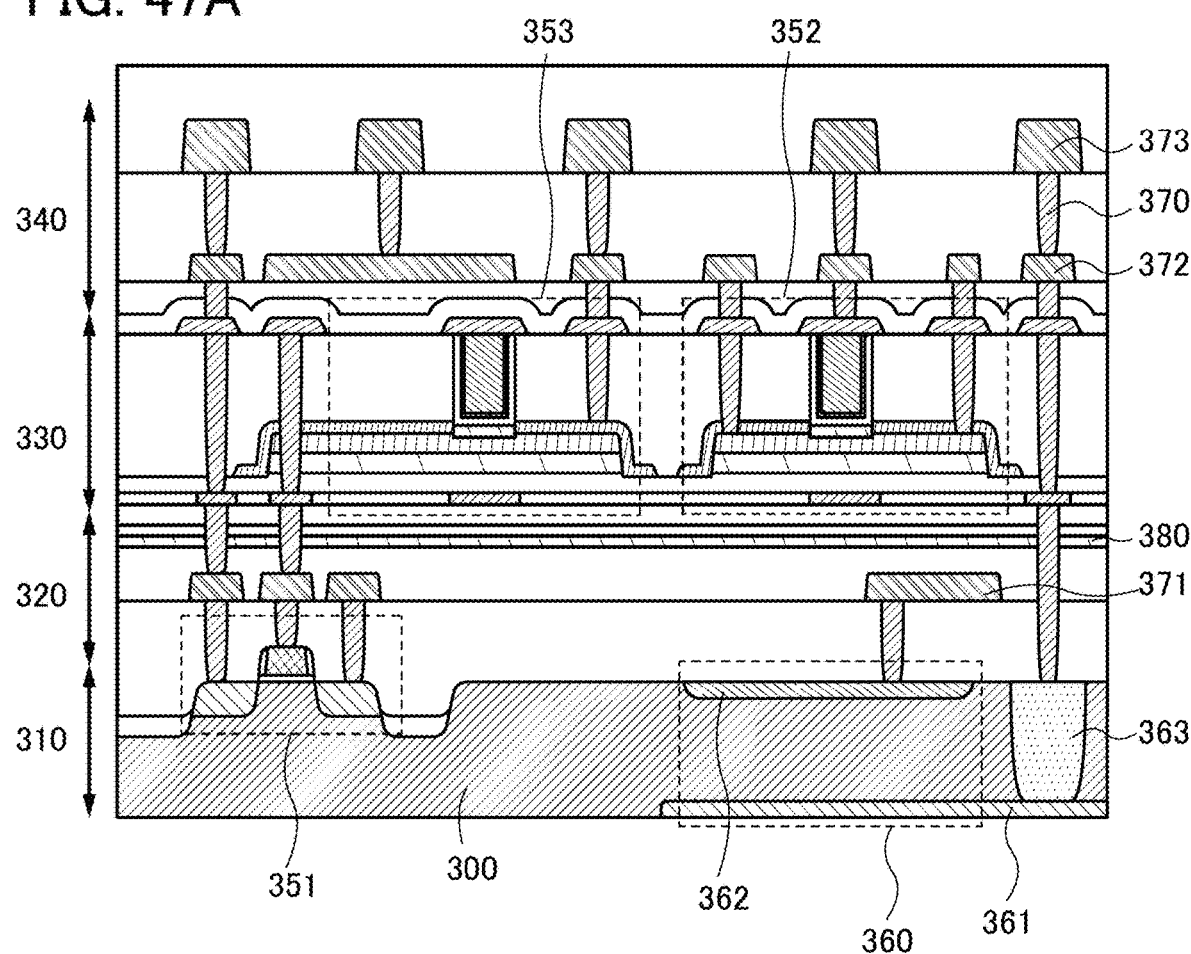
FIGS. 47A and 47B are cross-sectional views illustrating a semiconductor device of one embodiment of the present invention.
Figure 47B:
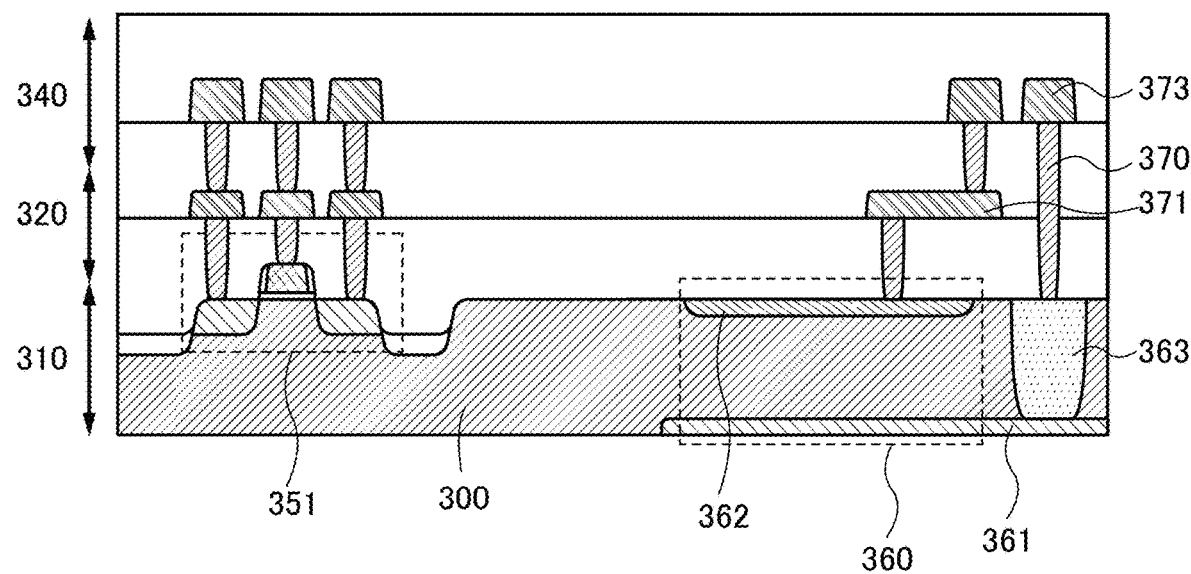

FIGS. 47A and 47B are each a cross-sectional view of an element included in an imaging device. The imaging device illustrated in FIG. 47A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 47A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 47B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 47A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 48A1 and FIG. 48B1, part or the whole of the imaging device can be bent. FIG. 48A1 illustrates a state in which the imaging device is bent in the direction of a dashed-dotted line X1-X2. FIG. 48A2 is a cross-sectional view illustrating a portion indicated by the dashed-dotted line X1-X2 in FIG. 48A1. FIG. 48A3 is a cross-sectional view illustrating a portion indicated by a dashed-dotted line Y1-Y2 in FIG. 48A1.

FIG. 48B1 illustrates a state where the imaging device is bent in the direction of a dashed-dotted line X3-X4 and the direction of a dashed-dotted line Y3-Y4. FIG. 48B2 is a cross-sectional view illustrating a portion indicated by the dashed-dotted line X3-X4 in FIG. 48B1. FIG. 48B3 is a cross-sectional view illustrating a portion indicated by the dashed-dotted line Y3-Y4 in FIG. 48B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 14

In this embodiment, examples of CPUs including semiconductor devices such as the transistor of one embodiment of the present invention and the above-described memory device will be described.

<Configuration of CPU>

Figure 49:
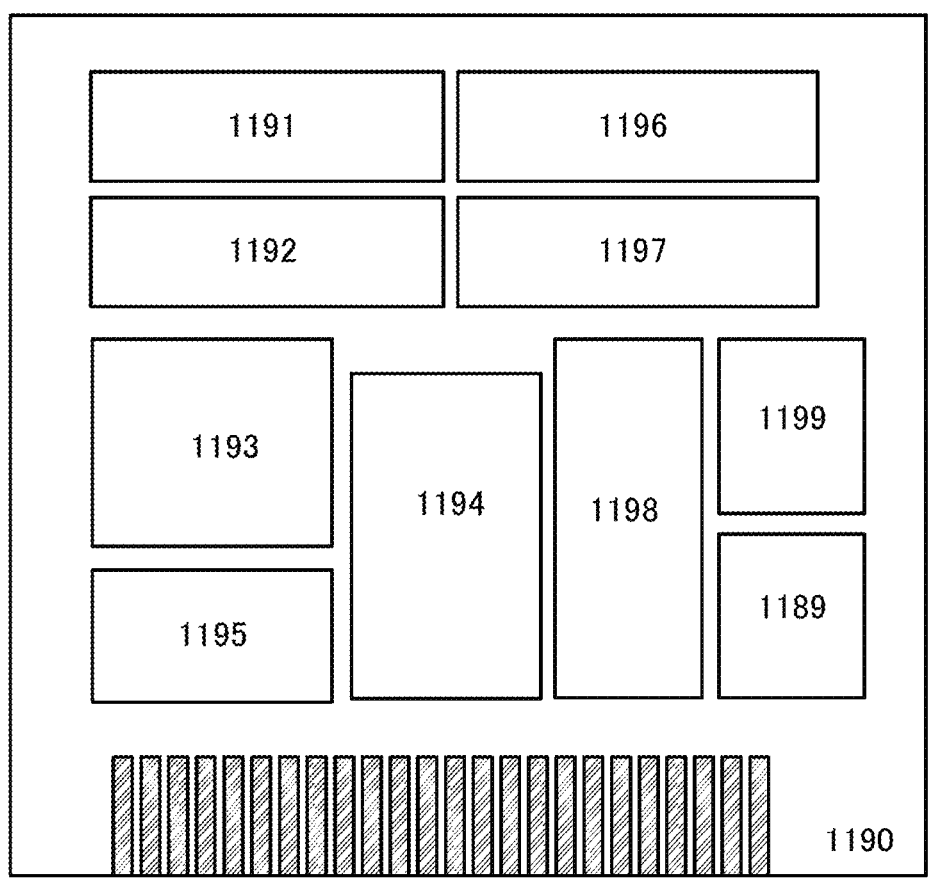
FIG. 49 is a block diagram illustrating a semiconductor device of one embodiment of the present invention.

FIG. 49 is a block diagram illustrating a configuration example of a CPU including any of the above-described transistors as a component.

The CPU illustrated in FIG. 49 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 49 is just an example in which the configuration has been simplified, and an actual CPU may have a variety of configurations depending on the application. For example, the CPU may have the following configuration: a structure including the CPU illustrated in FIG. 49 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 49, a memory cell is provided in the register 1196. For the memory cell of the register 1196, any of the above-described transistors, the above-described memory device, or the like can be used.

In the CPU illustrated in FIG. 49, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 50:
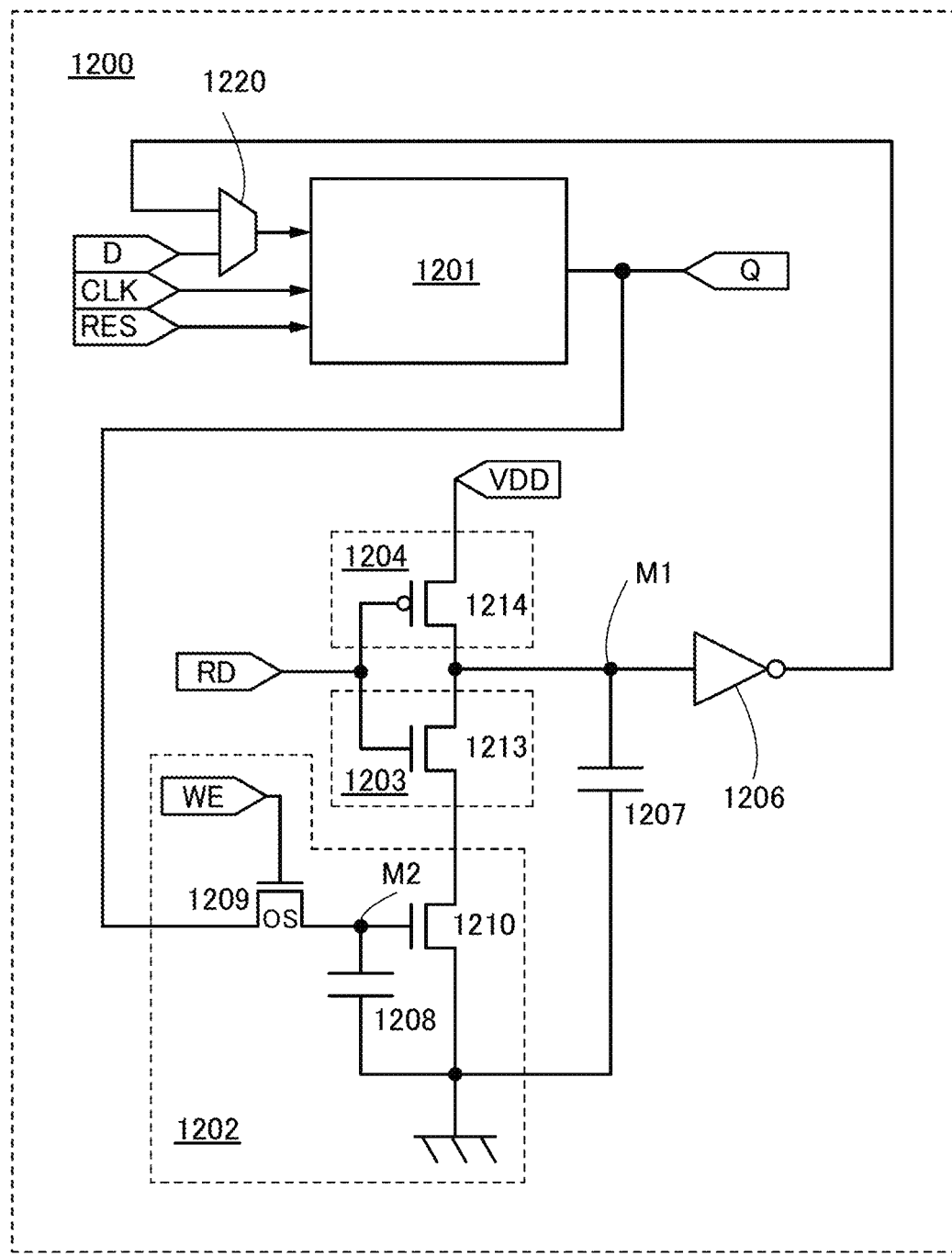
FIG. 50 is a circuit diagram of a semiconductor device according to one embodiment of the present invention.

FIG. 50 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 50 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 50, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 50, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 50, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic circuit including a field programmable gate array (FPGA) or a complex programmable logic device (CPLD).

The structures described in this embodiment can be used in appropriate combination with any of the structures described in the other embodiments.

Embodiment 15

In this embodiment, display devices each including the transistor or the like of one embodiment of the present invention will be described with reference to FIGS. 51A to 51C and FIGS. 52A and 52B.
<Configuration of Display Device>
Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 51A:
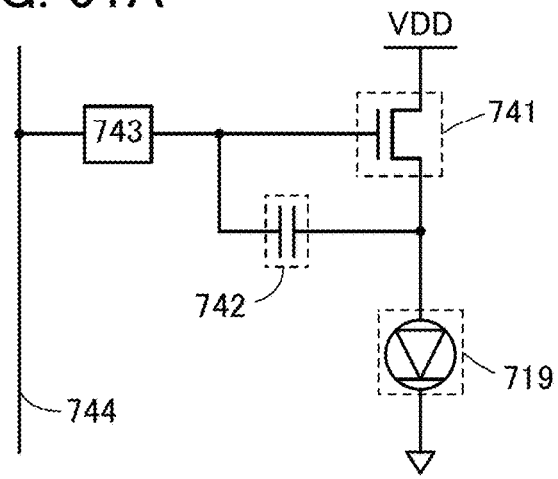
FIGS. 51A to 51C are a circuit diagram, a top view, and a cross-sectional view illustrating a semiconductor device of one embodiment of the present invention.
Figure 51B:
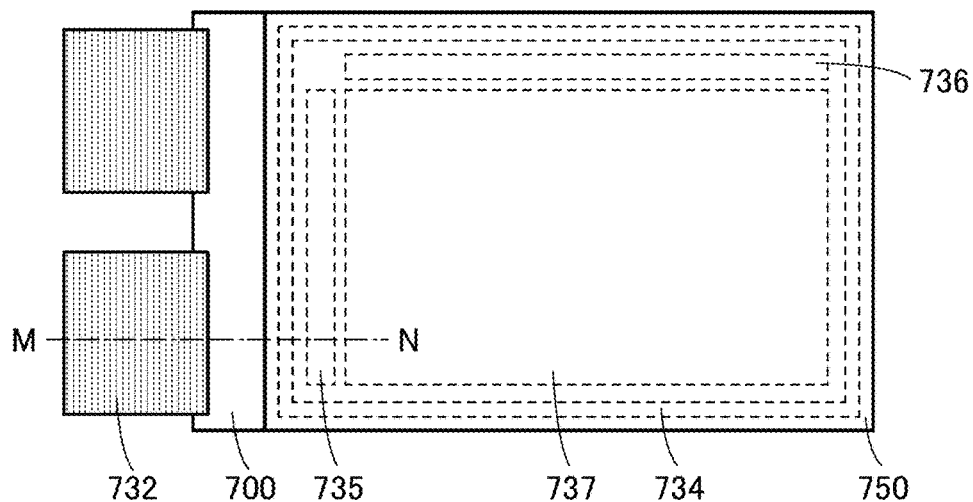
Figure 51C:
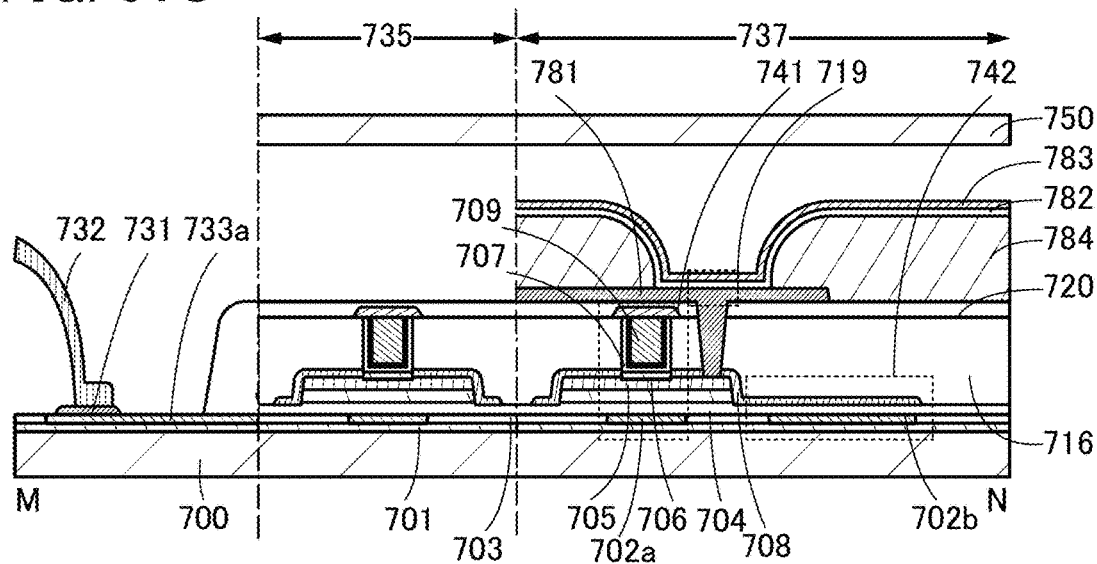

FIGS. 51A to 51C illustrate an example of an EL display device of one embodiment of the present invention. FIG. 51A is a circuit diagram of a pixel in an EL display device. FIG. 51B is a plan view showing the whole of the EL display device. FIG. 51C is a cross-sectional view taken along part of dashed-dotted line M-N in FIG. 51B.

FIG. 51A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 51A includes a switching element 743, a transistor 741, a capacitor 742, and a light-emitting element 719.

Note that FIG. 51A and the like each illustrate an example of a circuit structure; therefore, a transistor can be provided additionally. In contrast, for each node in FIG. 51A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 51B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 51C is a cross-sectional view of the EL display device taken along part of dashed-dotted line M-N in FIG. 51B.

The transistor 741 in FIG. 51C includes an insulator 701 over the substrate 700; a conductor 702a over the insulator 701; an insulator 703 in which the conductor 702a is embedded; an insulator 704 over the insulator 703; a semiconductor 705 over the insulator 704; a conductor 708 and an insulator 706 over the semiconductor 705; an insulator 707 over the insulator 706; and a conductor 709 over the insulator 707. Note that the structure of the transistor 741 is just an example; the transistor 741 may have a structure different from that illustrated in FIG. 51C.

Thus, in the transistor 741 illustrated in FIG. 51C, the conductor 702a functions as a gate electrode, the insulator 703 and the insulator 707 each function as a gate insulator, the conductor 708 functions as a source electrode or a drain electrode, and the conductor 709 functions as a gate electrode. Note that in some cases, electrical characteristics of the semiconductor 705 change if light enters the semiconductor 705. To prevent this, it is preferable that one or more of the conductor 702a and the conductor 709 have a light-blocking property.

FIG. 51C illustrates the capacitor 742 that includes a conductor 702b over the insulator 701, the insulator 703 over the conductor 702b, and the conductor 708 over the insulator 703.

In the capacitor 742, the conductor 702b functions as one electrode, and the conductor 708 functions as the other electrode.

Thus, the capacitor 742 can be formed using a film of the transistor 741. The conductor 702a and the conductor 702b are preferably conductors of the same kind, in which case the conductor 702a and the conductor 702b can be formed through the same step. Furthermore, the conductor 707a and the conductor 707b are preferably conductors of the same kind, in which case the conductor 707a and the conductor 707b can be formed through the same step.

The capacitor 742 illustrated in FIG. 51C has a large capacitance per area occupied by the capacitor. Therefore, the EL display device illustrated in FIG. 51C has high display quality.

An insulator 720 is provided over the transistor 741 and the capacitor 742. Here, the insulator 716 and the insulator 720 may have an opening portion reaching the region 705a that serves as the source of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 52A:
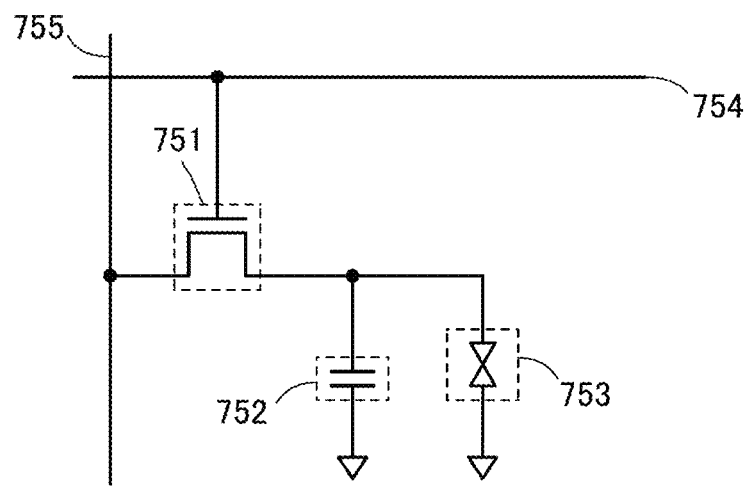
FIGS. 52A and 52B are a circuit diagram and a cross-sectional view illustrating a semiconductor device of one embodiment of the present invention.

FIG. 52A is a circuit diagram illustrating a configuration example of a pixel of a liquid crystal display device. A pixel shown in FIGS. 52A and 52B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 52B:
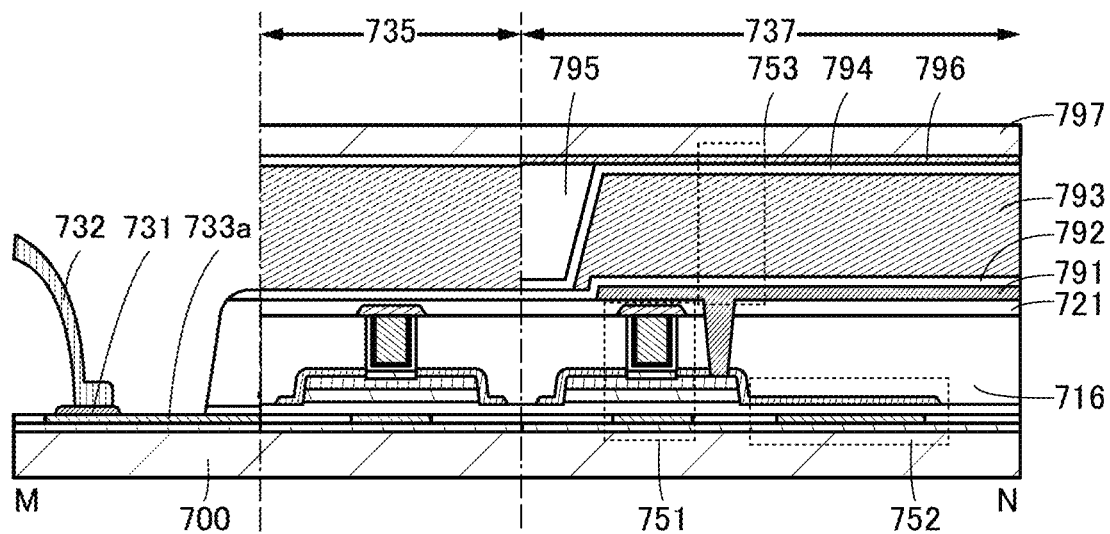

Note that the description of the liquid crystal display device is made on the assumption that the plan view of the liquid crystal display device is similar to that of the EL display device. FIG. 52B is a cross-sectional view of the liquid crystal display device taken along dashed-dotted line M-N in FIG. 51B. In FIG. 52B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 52B corresponds to, but is not limited to, the structure of the capacitor 742 in FIG. 51C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 16

In this embodiment, electronic devices each including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 53A to 53F illustrate specific examples of these electronic devices.

Figure 53A:
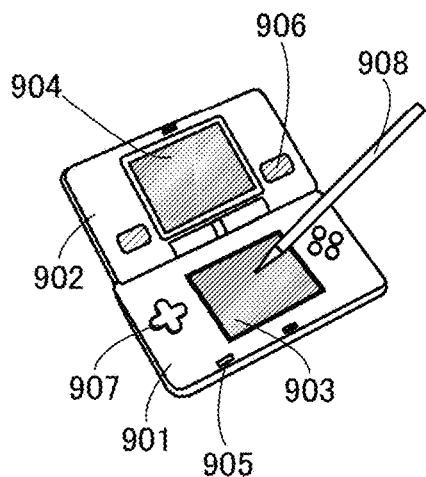
FIGS. 53A to 53F are perspective views each illustrating an electronic device of one embodiment of the present invention.

FIG. 53A illustrates a portable game console including a housing 901, a housing 902, a display portion 903, a display portion 904, a microphone 905, a speaker 906, an operation key 907, a stylus 908, and the like. Although the portable game console in FIG. 53A has the two display portions 903 and 904, the number of display portions included in a portable game console is not limited to this.

Figure 53B:
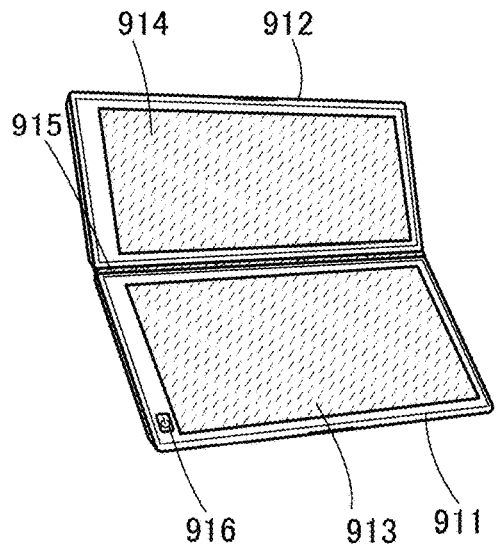

FIG. 53B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 53C:
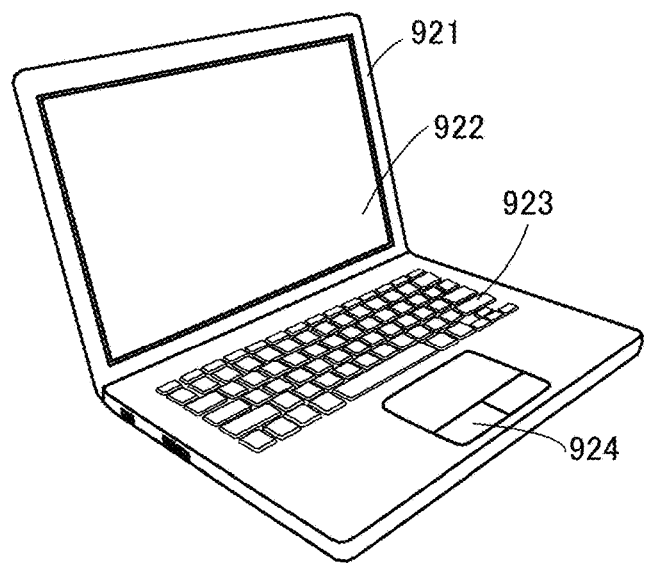

FIG. 53C illustrates a notebook personal computer, which includes a housing 921, a display portion 922, a keyboard 923, a pointing device 924, and the like.

Figure 53D:
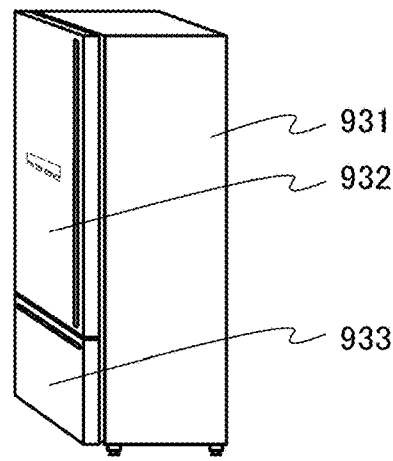

FIG. 53D illustrates an electric refrigerator-freezer, which includes a housing 931, a door for a refrigerator 932, a door for a freezer 933, and the like.

Figure 53E:
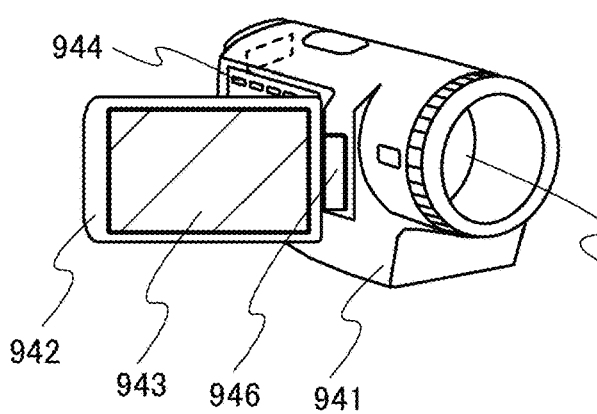

FIG. 53E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 53F:
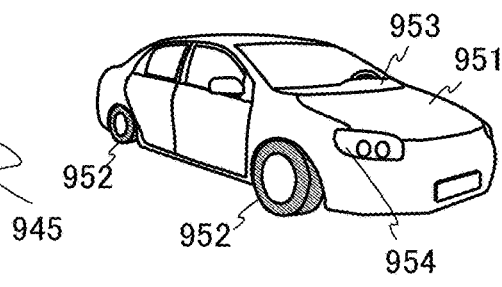

FIG. 53F illustrates a car including a car body 951, wheels 952, a dashboard 953, lights 954, and the like.

The structures described in this embodiment can be used in appropriate combination with any of the structures described in the other embodiments.

Embodiments of the present invention have been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

In Example 1, the planarity of a sample 1A in the case of forming the sample 1A over an oxide was evaluated.

First, a method for forming an example sample 1A and a comparative sample 1B will be described.

First, a thermal oxide was formed over the silicon wafer as a silicon oxide film. The thermal oxide was formed to a thickness of 100 nm at 950° C. in an oxygen atmosphere containing HCl at 3 vol %.

Next, an oxide was formed over the thermal oxide as the sample 1A with use of the sputtering apparatus including the collimator illustrated in FIG. 21. The oxide was formed using the target of In:Ga:Zn=1:1:1 [atomic ratio] in a mixed atmosphere of argon and oxygen (argon at 30 sccm and oxygen at 15 sccm) under the conditions where the pressure was 0.7 Pa, a power supply (DC) of 0.5 kW was applied, the distance between the target and the substrate was 160 mm, and the substrate temperature was 300° C. Note that a collimator with a thickness of 16 mm was provided so that the distance between the target and the collimator was 52 mm and the distance between the collimator and the substrate was 92 mm, whereby the distance between the target and the substrate became 160 mm.

Furthermore, an oxide was formed over the thermal oxide as the comparative sample 1B with use of a sputtering apparatus not including a collimator. The oxide was formed using the target of In:Ga:Zn=1:1:1 [atomic ratio] in a mixed atmosphere of argon and oxygen (argon at 30 sccm and oxygen at 15 sccm) under the conditions where the pressure was 0.7 Pa, a power supply (DC) of 0.5 kW was applied, distance between the target and the substrate became 160 mm, and the substrate temperature was 300° C.

Through the above steps, the sample 1A and the comparative sample 1B were formed.

The planarities of the fabricated sample 1A and the comparative sample 1B were evaluated with a scanning probe microscope SPA-500 manufactured by SII Nano Technology Inc. Conditions of the measurement with the scanning probe microscope were as follows: the scan rate was 1.0 Hz, the measurement area was 1 μm×1 μm, and the number of data was X=512 and Y=512. The number of measurement points was 2. Here, the measurement was conducted by a method for measuring the surface shape of a sample in a state where a cantilever is resonated while the distance between a probe and the sample is controlled so that the vibration amplitude of the cantilever is maintained constant.

The planarities of the sample 1A and comparative sample 1B were evaluated using the average plane roughness (Ra), the maximum peak-to-valley height (P-V), and a root-mean-square roughness (RMS). Here, the average surface roughness ($R_a$) is obtained by three-dimension expansion of arithmetic means surface roughness $R_a$ which is defined by JIS B 0601:2001 (ISO 4287:1997) so that $R_a$ can be applied to a curved surface, and is an average value of the absolute values of deviations from a reference surface to a specific surface. The maximum peak-to-valley height (P-V) is a difference between the height of the highest peak and the height of the lowest valley in the specific surface. The peak and the valley refer to a peak and a valley obtained by three-dimensional expansion of the "peak" and the "valley" defined by JISB0601:2001 (ISO4287:1997). The peak refers to the highest point of the peaks in the specific surface. The valley refers to the lowest point of the valleys in the specific surface.

Results of planarity evaluation of the reprocessed semiconductor substrates with the scanning probe microscope are shown in Table 1.

TABLE 1

|  | Collimator | Ra[nm] | P-V[nm] | RMS[nm] |
| --- | --- | --- | --- | --- |
| Sample 1A | used | 0.2658 | 3.774 | 0.3358 |
| Comparative Sample 1B | not used | 0.6456 | 8.007 | 0.8648 |

Figure 54A:
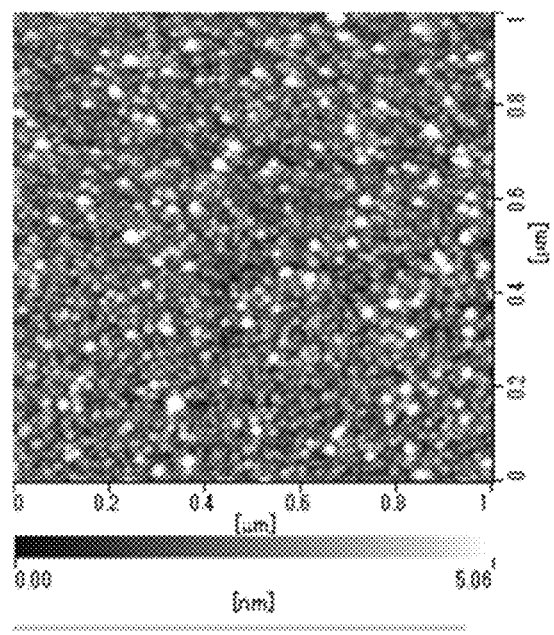
FIGS. 54A and 54B are images of the states of surfaces of samples of one embodiment of Example 1.
Figure 54B:
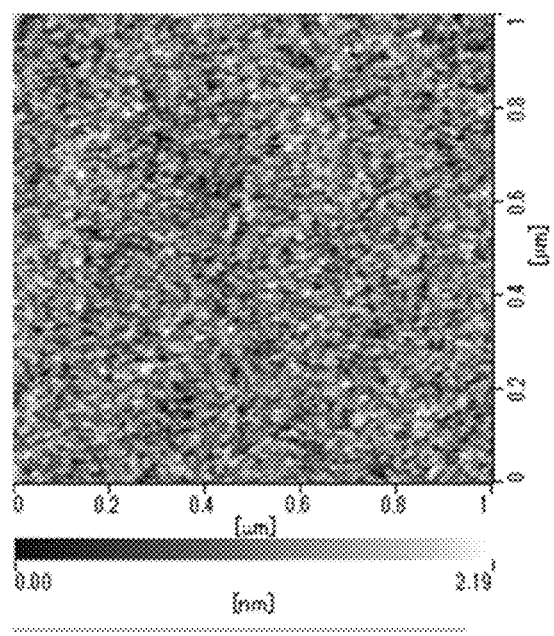
Figure 55C:
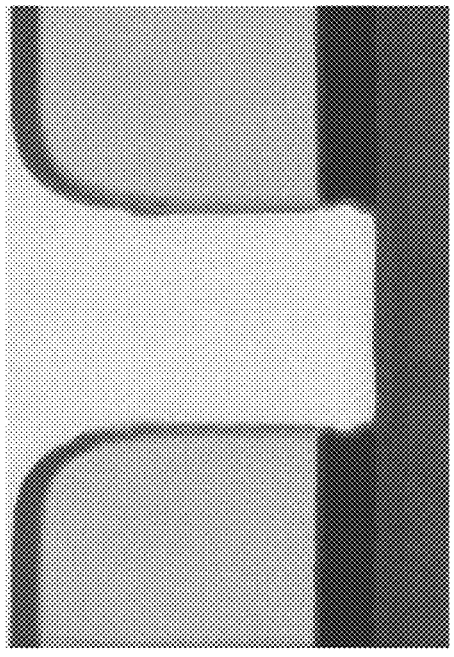
FIGS. 55A to 55D are bright-field images of samples of one embodiment of Example 2, which are taken with a scanning transmission electron microscope.
Figure 55D:
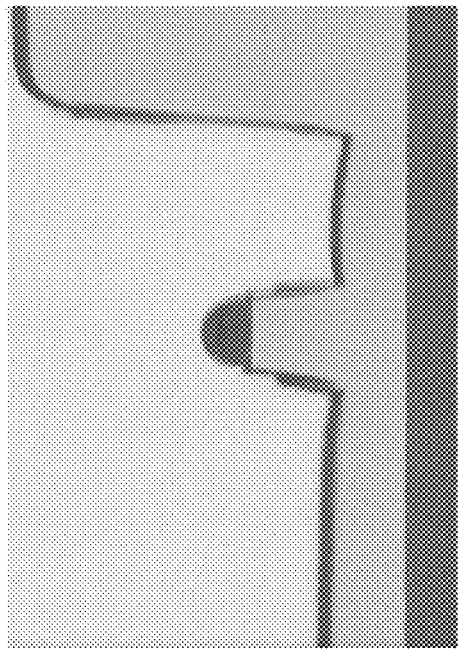
Figure 55A:
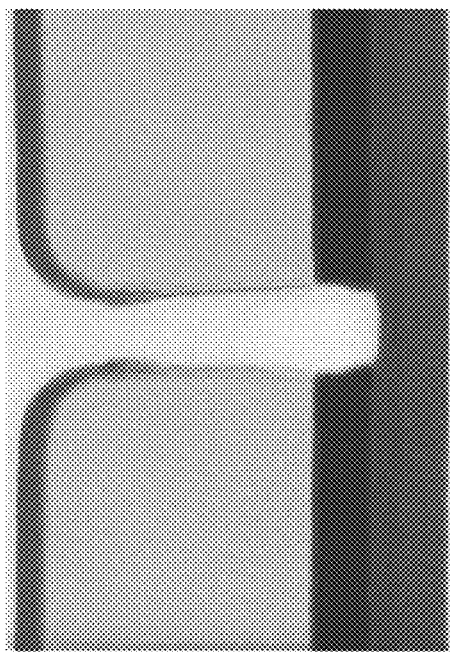
Figure 55B:
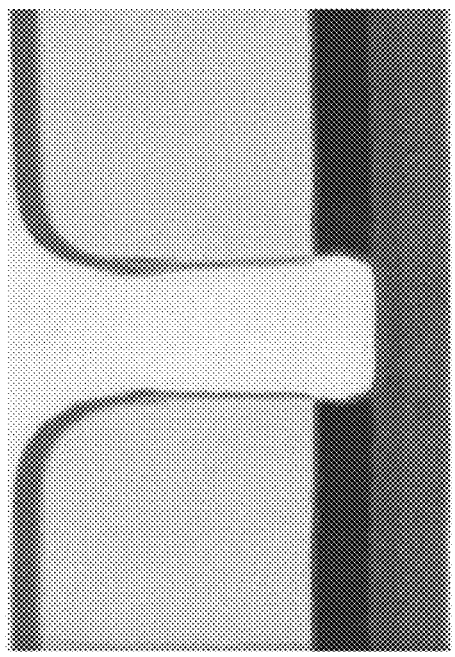

FIG. 54A shows an image of a surface shape of the sample 1A. FIG. 54B shows an image of a surface shape of the comparative sample 1B.

The results show that the sample 1A can be formed with higher planarity than the comparative sample 1B. Accordingly, the use of the sputtering apparatus is found to be effective in manufacturing a transistor. Note that the structure shown in this example can be combined as appropriate with any of the structures shown in the other embodiments and the other examples.

Example 2

In this example, the shape of a peripheral region of a channel formation region was evaluated on the assumption of the transistor structure 1 described in Embodiment 1.

First, a method for fabricating example samples 2A to 2D is described.

First, a 100-nm-thick first silicon oxynitride film was formed by a plasma CVD method. The first silicon oxynitride film was formed using silane at a flow rate of 5 sccm and dinitrogen monoxide at a flow rate of 1000 sccm as deposition gases under the conditions where the pressure in a reaction chamber was 133.30 Pa, the substrate temperature was 325° C., and a high frequency (RF) power of 13.56 W was applied.

Then, a 20-nm-thick first oxide and a 15-nm-thick second oxide were stacked over the first silicon oxynitride film by a sputtering method. The first oxide was formed using a target containing In, Ga, and Zn at an atomic ratio of 1:3:4 in a mixed atmosphere of argon and oxygen (argon at 40 sccm and oxygen at 5 sccm) under the conditions where the pressure was 0.7 Pa, a power supply (DC) of 0.5 kW was applied, the distance between the target and the substrate was 60 mm, and the substrate temperature was 200° C. The second oxide was formed using a target containing In, Ga, and Zn at an atomic ratio of 4:2:4.1 in a mixed atmosphere of argon and oxygen (argon at 30 sccm and oxygen at 15 sccm) under the conditions where the pressure was 0.7 Pa, a power supply (DC) of 0.5 kW was applied, the distance between the target and the substrate was 60 mm, and the substrate temperature was 300° C.

Next, a 20-nm-thick first tungsten film was formed over the second oxide by a sputtering method using a tungsten target in an atmosphere of argon (Ar) at a flow rate of 80 sccm as a deposition gas under the conditions where the pressure was 0.8 Pa, the substrate temperature was 130° C., the distance between the target and the substrate was 60 mm, and a power supply (DC) of 1.0 kW was applied.

Next, a resist mask was formed over the first tungsten film, and the first tungsten film was processed by ICP etching to be divided into a second tungsten film and a third tungsten film. The etching was performed in a mixed atmosphere of carbon tetrafluoride ($CF_4$) at a flow rate of 40 sccm and a chlorine ($Cl_2$) at a flow rate of 60 sccm under the conditions where the power supply was 2000 W, the bias power was 50 W, the pressure was 0.67 Pa, and the substrate temperature was −10° C.

Then, with the use of the second tungsten film and the third tungsten film as masks, the first oxide and the second oxide were processed into island shapes by ICP etching performed three times. The first etching was performed in a mixed atmosphere of carbon tetrafluoride ($CF_4$) at a flow rate of 16 sccm and argon (Ar) at a flow rate of 32 sccm under the conditions where the power supply was 600 W, the bias power was 50 W, the pressure was 3.0 Pa and the substrate temperature was 40° C. The second etching was performed in a mixed atmosphere of carbon tetrafluoride ($CF_4$) at a flow rate of 16 sccm and argon (Ar) at a flow rate of 32 sccm under the conditions where the power supply was 600 W, the bias power was 50 W, the pressure was 1.0 Pa, and the substrate temperature was 40° C. The third etching was performed in an atmosphere of oxygen ($O_2$) at a flow rate of 200 sccm under the conditions where the power supply was 2000 W, the bias power was 50 W, the pressure was 0.67 Pa, and the substrate temperature was 40° C.

Next, a 320-nm-thick second silicon oxynitride film was formed by a plasma CVD method. The second silicon oxynitride film was formed using silane at a flow rate of 5 sccm and dinitrogen monoxide at a flow rate of 1000 sccm as source gases under the conditions where the pressure in a reaction chamber was 133.30 Pa, the substrate temperature was 325° C., and a high frequency (RF) power of 13.56 W was applied.

Then, planarization treatment was performed on a top surface of the second silicon oxynitride film by a CMP method. The planarization treatment was performed so that the thickness of the second silicon oxynitride film was reduced by 220 nm, whereby the thickness of the second silicon oxynitride film becomes 100 nm.

The polishing conditions in the CMP method were as follows. As a polishing cloth, IC1000/SUBA (registered trademark) using polyurethane foam, which was produced by Nitta Haas Incorporated, was used. As slurry, Semi-Sperse (registered trademark) 25 using fumed silica, which was produced by Cabot Microelectronics, was used. The flow rate of the slurry was 150 mL/min and the polishing pressure was 3.6 psi. The numbers of rotations of a polishing head and a table were 93 rpm and 90 rpm, respectively. The polishing treatment was performed while the processed object was attached to the polishing head and the polishing cloth was attached to the table. After the polishing, megasonic cleaning was performed.

Next, a 30-nm-thick fourth tungsten film was formed over the second silicon oxynitride film by a sputtering method using a tungsten target in an atmosphere of argon (Ar) at a flow rate of 80 sccm as a deposition gas under the conditions where the pressure was 0.8 Pa, the substrate temperature was 130° C., the distance between the target and the substrate was 60 mm, and a power supply (DC) of 1.0 kW was applied.

Next, a 50-nm-thick third silicon oxynitride film was formed by a plasma CVD method. The third silicon oxynitride film was formed using silane at a flow rate of 5 sccm and dinitrogen monoxide at a flow rate of 1000 sccm as deposition gases under the conditions where the pressure in a reaction chamber was 133.30 Pa, the substrate temperature was 325° C., and a high frequency (RF) power of 13.56 W was applied.

Next, a resist mask was formed over the third silicon oxynitride film and the fourth tungsten film, and the third silicon oxynitride film and the fourth tungsten film were processed by ICP etching performed four times. The first etching was performed in an atmosphere of carbon tetrafluoride ($CF_4$) at a flow rate of 80 sccm under the conditions where the power supply was 500 W, the bias power was 100 W, the pressure was 3.0 Pa, and the substrate temperature was 40° C. The second etching was performed in a mixed atmosphere of carbon tetrafluoride ($CF_4$) at a flow rate of 67 sccm and oxygen ($O_2$) at a flow rate of 13 sccm under the conditions where the power supply was 550 W, the bias power was 350 W, the pressure was 5.3 Pa, and the substrate temperature was 40° C. The third etching was performed in a mixed atmosphere of carbon tetrafluoride ($CF_4$) at a flow rate of 22 sccm and oxygen ($O_2$) at a flow rate of 22 sccm under the conditions where the power supply was 1000 W, the bias power was 100 W, the pressure was 1.3 Pa, and the substrate temperature was 40° C. The fourth etching was performed in a mixed atmosphere of carbon tetrafluoride ($CF_4$) at a flow rate of 22 sccm and oxygen ($O_2$) at a flow rate of 22 sccm under the conditions where the power supply was 1000 W, the bias power was 100 W, the pressure was 1.3 Pa, and the substrate temperature was 40° C. A hard mask was formed using the fourth tungsten film by the etching process.

Next, with the use of the hard mask, an opening was formed in the second silicon oxynitride film by ICP etching. The etching was performed in a mixed atmosphere of argon (Ar) at a flow rate of 800 sccm, oxygen ($O_2$) at a flow rate of 30 sccm, and carbon tetrafluoride ($CF_4$) at a flow rate of 22 sccm under the conditions where the power supply was 5000 W, the bias power was 1150 W, the pressure was 3.37 Pa, and the substrate temperature was 40° C.

Here, an opening A was formed in an example sample 2A. An opening B was formed in an example sample 2B. An opening C was formed in an example sample 2C. An opening D was formed in an example sample 2D. The sizes of the openings A to D are different from each other.

Next, a hard mask was removed by ICP etching performed three times. The first etching was performed in a mixed atmosphere of carbon tetrafluoride ($CF_4$) at a flow rate of 22 sccm, oxygen ($O_2$) at a flow rate of 22 sccm, and chlorine ($Cl_2$) at a flow rate of 11 sccm under the conditions where the power supply was 1000 W, the bias power was 50 W, the pressure was 1.3 Pa, and the substrate temperature was 40° C. The second etching was performed in a mixed atmosphere of carbon tetrafluoride ($CF_4$) at a flow rate of 22 sccm, oxygen ($O_2$) at a flow rate of 22 sccm, and chlorine ($Cl_2$) at a flow rate of 11 sccm under the conditions where the power supply was 1000 W, the bias power was 50 W, the pressure was 1.3 Pa, and the substrate temperature was 40° C. The third etching was performed in an atmosphere of oxygen ($O_2$) at a flow rate of 100 sccm under the conditions where the power supply was 500 W, the bias power was 100 W, the pressure was 1.3 Pa, and the substrate temperature was 40° C.

Next, a 10-nm-thick third oxide was formed on each of the second silicon oxynitride film having openings A to D with the use of the sputtering apparatus including the collimator illustrated in FIG. 21. The third oxide was formed using the target of In:Ga:Zn=1:3:2 [atomic ratio] in a mixed atmosphere of argon and oxygen (argon at 30 sccm and oxygen at 15 sccm) under the conditions where the pressure was 0.7 Pa, a power supply (DC) of 0.5 kW was applied, the distance between the target and the substrate was 160 mm, and the substrate temperature was 200° C. Note that a collimator with a thickness of 16 mm was provided so that the distance between a target and the collimator was 52 mm and the distance between the collimator and the substrate was 92 mm, whereby the distance between the target and the substrate was 160 mm.

Through the above steps, the example samples 2A to 2D were formed.

Next, cross sections of the example samples 2A to 2D were observed. FIGS. 55A to 55D are bright-filed images of the example samples 2A to 2D, which were obtained with a scanning transmission electron microscope (STEM). The example samples 2A to 2C are each a cross-sectional view of an island-shaped oxide in the longitudinal direction, and the example sample 2D is a cross-sectional view of an island-shaped oxide in the lateral direction.

In the opening A in the example sample 2A, the distance between the second tungsten film and the third tungsten film is 32.1 nm, and the third oxide is formed on a side surface of the second silicon oxynitride film and the second oxide.

In the opening B in the example sample 2B, the distance between the second tungsten film and the third tungsten film is 56.7 nm, and the third oxide is formed on a side surface of the second silicon oxynitride film and the second oxide.

In the opening C in the example sample 2C, the distance between the second tungsten film and the third tungsten film is 88.1 nm, and the third oxide is formed on a side surface of the second silicon oxynitride film and the second oxide.

In the opening D in the example sample 2D, the third oxide is formed on a side surface of the second silicon oxynitride film, the second oxide, and the first silicon oxynitride film.

The results of the STEM images in FIGS. 55A to 55D show that the example samples 2A to 2D fabricated in this example each have a favorable cross-sectional shape. It is found that a film can be formed even on a bottom surface of the minute opening in the example sample 2A. It is also found that the film is formed thinner on the side surface of the opening than on the bottom surface thereof.

The structure described above in this example can be combined with any of the structures described in the other embodiments and examples as appropriate.

EXPLANATION OF REFERENCE

100: target, 101: sputtering apparatus, 110: backing plate, 120: target holder, 130: magnet unit, 130N: magnet, 130S: magnet, 132: magnet holder, 150: collimator, 151: movable portion, 152: movable portion, 160: substrate, 170: substrate stage, 180a: magnetic force line, 180b: magnetic force line, 190: member, 200: imaging device, 201: switch, 202: switch, 203: switch, 210: pixel portion, 211: pixel, 212: subpixel, 212B: subpixel, 212G: subpixel, 212R: subpixel, 220: photoelectric conversion element, 230: pixel circuit, 231: wiring, 247: wiring, 248: wiring, 249: wiring, 250: wiring, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 310: layer, 320: layer, 330: layer, 340: layer, 351: transistor, 352: transistor, 353: transistor, 360: photodiode, 361: anode, 363: low-resistance region, 370: plug, 371: wiring, 372: wiring, 373: wiring, 380: insulator, 400: substrate, 401: insulator, 402: insulator, 404: conductor, 404a: conductor, 404b: conductor, 406a: insulator, 406b: semiconductor, 406c: insulator, 406d: insulator, 408: insulator, 410: insulator, 412: insulator, 413: conductor, 414: mixed region, 416: conductor, 416a: conductor, 416b: conductor, 420: conductor, 430: resist mask, 431: resist mask, 450: semiconductor substrate, 452: insulator, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 489: insulator, 490: insulator, 492: insulator, 493: insulator, 494: insulator, 495: insulator, 496a: conductor, 496b: conductor, 496c: conductor, 496d: conductor, 496e: conductor, 496f: conductor, 498a: conductor, 498b: conductor, 498c: conductor, 504: conductor, 507a: conductor, 507b: conductor, 511: insulator, 514: conductor, 515: conductor, 516: conductor, 521: routing switch element, 522: logic element, 523: configuration memory, 524: lookup table, 525: register, 526: selector, 527: configuration memory, 700: substrate, 701: insulator, 702a: conductor, 702b: conductor, 703: insulator, 704: insulator, 705: semiconductor, 705a: region, 706: insulator, 707: insulator, 707a: conductor, 707b: conductor, 708: conductor, 709: conductor, 716: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation keys, 945: lens, 946: joint, 951: car body, 952: wheels, 953: dashboard, 954: lights, 1000: IC, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1700: deposition apparatus, 1701: atmosphere-side substrate supply chamber, 1702: atmosphere-side substrate transfer chamber, 1703a: load lock chamber, 1703b: unload lock chamber, 1704: transfer chamber, 1705: substrate-heating chamber, 1706a: deposition chamber, 1706b: deposition chamber, 1706c: deposition chamber, 1751: cryotrap, 1752: substrate delivery stage, 1761: cassette port, 1762: alignment port, 1763a: transfer robot, 1763b: transfer robot, 1764: gate valve, 1765: heating stage, 1770: vacuum pump, 1771: cryopump, 1772: turbo molecular pump, 1780: mass flow controller, 1781: refiner, 1782: gas heating system, 2100: transistor, 2200: transistor, 2700: manufacturing apparatus, 2701: atmosphere-side substrate supply chamber, 2702: atmosphere-side substrate transfer chamber, 2703a: load lock chamber, 2703b: unload lock chamber, 2704: transfer chamber, 2706a: chamber, 2706b: chamber, 2706c: chamber, 2706d: chamber, 2761: cassette port, 2762: alignment port, 2763a: transfer robot, 2763b: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2812: substrate stage, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate stage, 2826: heating mechanism, 2828: vacuum pump, 2829: valve, 2830: exhaust port, 3001: wiring, 3002: wiring, 3003: wiring, 3004: wiring, 3005: wiring, 3200: transistor, 3300: transistor, 3400: capacitor, 4001: wiring, 4003: wiring, 4005: wiring, 4006: wiring, 4007: wiring, 4008: wiring, 4009: wiring, 4021: layer, 4022: layer, 4023: layer, 4100: transistor, 4200: transistor, 4300: transistor, 4400: transistor, 4500: capacitor, 4600: capacitor, 5100: pellet, 5120: substrate, 5161: region This application is based on Japanese Patent Application serial no. 2015-081993 filed with Japan Patent Office on Apr. 13, 2015, and Japanese Patent Application serial no. 2015-082008 filed with Japan Patent Office on Apr. 13, 2015, the entire contents of which are hereby incorporated by reference.

The invention claimed is:

1. A semiconductor device comprising:
an oxide semiconductor comprise indium and zinc over a substrate;
a source and a drain over the oxide semiconductor;
a first insulating layer over the source and the drain, the first insulating layer having a trench between the source and the drain;
an oxide film over the oxide semiconductor;
a second insulating layer over the oxide film; and
a gate over the second insulating layer,
wherein:
a top surface of the first insulating layer and a top surface of the gate are polished surfaces, in which the top surface of the first insulating layer is approximately at the same level as the top surface of the gate,
the oxide film, the second insulating layer, and the gate are in the trench,
the oxide film includes a metal element contained in the oxide semiconductor,
the second insulating layer is in direct contact with a side surface of the first insulating layer,
the oxide semiconductor includes a first region overlapping with the source, a second region overlapping with the drain, and a third region overlapping the lowest surface of the gate, and
a first distance between a top surface of the third region and a bottom surface of the gate is longer than a second distance between the first region and the third region.

2. The semiconductor device according to claim 1, further comprising:
a bottom gate under the oxide semiconductor; and
a third insulating layer between the bottom gate and the oxide semiconductor,
wherein the third insulating layer includes the metal element.

3. The semiconductor device according to claim 1, wherein the oxide semiconductor further contains gallium.

4. The semiconductor device according to claim 1, wherein the third region has a smaller thickness than the first region and the second region.

5. The semiconductor device according to claim 1, wherein the second insulating layer includes at least one of gallium, hafnium and aluminum.

6. The semiconductor device according to claim 1, further comprising:
a conductor over and in contact with the gate,
wherein a third distance between the conductor and the source or the drain is longer than a fourth distance between the first region and the second region.

7. The semiconductor device according to claim 6, wherein the third distance is larger than or equal to 1.5 times as large as the fourth distance and less than or equal to 2 times as large as the fourth distance.

8. The semiconductor device according to claim 1, wherein the second distance is greater than 0 nm.

9. The semiconductor device according to claim 1, wherein the gate does not overlap with the source and the drain.

10. A semiconductor device comprising:
an oxide semiconductor containing at least indium and zinc over a substrate;
a source and a drain over the oxide semiconductor;
a first insulating layer over the source and the drain, the first insulating layer having a trench between the source and the drain;
a first oxide film over the oxide semiconductor;
a second oxide film over the first oxide film;
a second insulating layer over the second oxide film; and
a gate over the second insulating layer,
wherein:
the first oxide film, the second oxide film, the second insulating layer, and the gate are in the trench,
each of the first oxide film and the second oxide film includes a metal element contained in the oxide semiconductor,
the first oxide film is in direct contact with a side surface of the first insulating layer,
the second insulating layer is in contact with a side surface of the gate,
the oxide semiconductor includes a first region overlapping with the source, a second region overlapping with the drain, and third region overlapping the lowest surface of the gate, and
a first distance between a top surface of the third region and a bottom surface of the gate is longer than a second distance between the first region and the third region.

11. The semiconductor device according to claim 10, further comprising:
a bottom gate under the oxide semiconductor; and
a third insulating layer between the bottom gate and the oxide semiconductor,
wherein the third insulating layer includes the metal element.

12. The semiconductor device according to claim 10, wherein the oxide semiconductor further contains gallium.

13. The semiconductor device according to claim 10, wherein the third region has a smaller thickness than the first region and the second region.

14. The semiconductor device according to claim 10, wherein the second insulating layer includes at least one of gallium, hafnium and aluminum.

15. The semiconductor device according to claim 10, further comprising:
a conductor over and in contact with the gate,
wherein a third distance between the conductor and the source or the drain is longer than a fourth distance between the first region and the second region.

16. The semiconductor device according to claim 15, wherein the third distance is larger than or equal to 1.5 times as large as the fourth distance and less than or equal to 2 times as large as the fourth distance.

17. The semiconductor device according to claim 10, wherein the second distance is greater than 0 nm.

18. The semiconductor device according to claim 10, wherein the gate does not include a region overlapping with the source and the drain.

19. A semiconductor device comprising:
an oxide semiconductor containing at least indium and zinc over a substrate;
a source and a drain over the oxide semiconductor;
a first insulating layer over the source and the drain, the first insulating layer having a trench between the source and the drain;
an oxide film over the oxide semiconductor;
a second insulating layer over the oxide film; and
a gate over the second insulating layer,
wherein:
a top surface of the first insulating layer and a top surface of the gate are polished surfaces, in which the top surface of the first insulating layer is approximately at the same level as the top surface of the gate,
the oxide film, the second insulating layer, and the gate are in the trench,
the oxide film includes a metal element contained in the oxide semiconductor,
the oxide film is in contact with a side surface of the first insulating layer,
the second insulating layer is in direct contact with a side surface of the gate,
the oxide semiconductor includes a first region overlapping with the source, a second region overlapping with the drain, and a third region overlapping the lowest surface of the gate,
a first distance between a top surface of the third region and a bottom surface of the gate is longer than a second distance between the first region and the third region,
a third distance is defined by a distance between the top surface of the first insulating layer on the source or the drain and the top surface of the source or the drain,
a fourth distance is defined by a distance between the first region and the second region, and
the third distance is larger than or equal to 1.5 times as large as the fourth distance and less than or equal to 2 times as large as the fourth distance.

* * * * *